US007816702B2

(12) United States Patent
 Saito et al.

(10) Patent No.: US 7,816,702 B2
(45) Date of Patent: Oct. 19, 2010

(54) SEMICONDUCTOR DEVICE

(75) Inventors: Shinichi Saito, Kawasaki (JP);
 Masahiro Aoki, Kokubunji (JP);
 Hiroyuki Uchiyama, Musashimurayama (JP); Hideo Arimoto, Kodaira (JP);
 Noriyuki Sakuma, Kodaira (JP); Jiro Yamamoto, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/245,077

(22) Filed: Oct. 3, 2008

(65) Prior Publication Data

US 2009/0090925 A1 Apr. 9, 2009

(30) Foreign Application Priority Data

Oct. 5, 2007 (JP) .............................. 2007-262194

(51) Int. Cl.
 *H01L 33/00* (2010.01)
(52) U.S. Cl. ............ 257/98; 257/E33.002; 257/E33.013
(58) Field of Classification Search .................. 257/98, 257/E33.002, E33.013, E33.015
 See application file for complete search history.

(56) References Cited

U.S. PATENT DOCUMENTS

| 6,570,187 | B1 | 5/2003 | Pautrat et al. | |
|---|---|---|---|---|
| 6,683,898 | B2 * | 1/2004 | Østergaard et al. | 372/43.01 |
| 2007/0145394 | A1 * | 6/2007 | Shimizu et al. | 257/98 |
| 2008/0128713 | A1 | 6/2008 | Saito et al. | |

(Continued)

FOREIGN PATENT DOCUMENTS

JP 2002-536850 10/2002

(Continued)

OTHER PUBLICATIONS

Chan et al., "Collector current map of gain and stimulated recombination on the base quantum well transitions of a transistor laser", Applied Physics Letters, vol. 88, pp. 143508-1-143508-3 (Apr. 5, 2006).

(Continued)

*Primary Examiner*—Zandra Smith
*Assistant Examiner*—Paul E Patton
(74) *Attorney, Agent, or Firm*—Antonelli, Terry, Stout & Kraus, LLP.

(57) ABSTRACT

There are a silicon laser device having a IV-group semiconductor such as silicon or germanium equivalent to the silicon as a basic constituent element on a substrate made of the silicon, and the like by a method capable of easily forming the silicon laser device by using a general silicon process, and a manufacturing method thereof. The silicon laser device is an ultrathin silicon laser that includes a first electrode unit injecting electrons, a second electrode unit injecting holes, a light emitting unit electrically connected to the first electrode unit and the second electrode unit, wherein the light emitting unit is made of single-crystal silicon and has a first surface (top surface) and a second surface (bottom surface) opposed to the first surface, a waveguide made of a first dielectric, which is disposed in the vicinity of the light emitting unit, by setting surface directions of the first and second surfaces as a surface (100) and thinning a thickness of the light emitting unit in a direction perpendicular to the first and second surfaces, and a mirror formed by alternately adjoining the first dielectric and a second dielectric.

11 Claims, 61 Drawing Sheets

U.S. PATENT DOCUMENTS

| | | | |
|---|---|---|---|
| 2008/0179605 A1* | 7/2008 | Takase et al. | 257/94 |
| 2008/0197362 A1 | 8/2008 | Hisamoto et al. | |
| 2009/0059406 A1* | 3/2009 | Powers et al. | 359/889 |

FOREIGN PATENT DOCUMENTS

| | | |
|---|---|---|
| JP | 2004-319668 | 11/2004 |
| JP | 2007-294628 | 11/2007 |

OTHER PUBLICATIONS

Canham "Silicon quantum wire array fabrication by electrochemical and chemical dissolution of wafers", Applied Physics Letters, vol. 57, 199, pp. 1046-1048 (Jul. 1990).

Coffa "High efficiency and fast modulation of Er-droped light emitting Si diodes", Applied Physics Letters, vol. 69, pp. 2077-2079, (Jul. 1996).

Iacona, et al., "Silicon nanocrystals and $Er^{3+}$ions in an optical microavity", Applied Physics Letters, pp. 8354-8356 of vol. 89 in (Mar. 2001).

Coffa, "Light from Silicon", IEEE Spectrum, pp. 44-49 of vol. 89 in (Oct. 2005).

Fang et al., "A Continuous-Wave Hybrid AlGInAs-Silicaon Evanescent Laser", IEEE Photonics Technology Letters, pp. 1143-1145 of vol. 18, (May 2006).

\* cited by examiner

FIG.2G
(1)
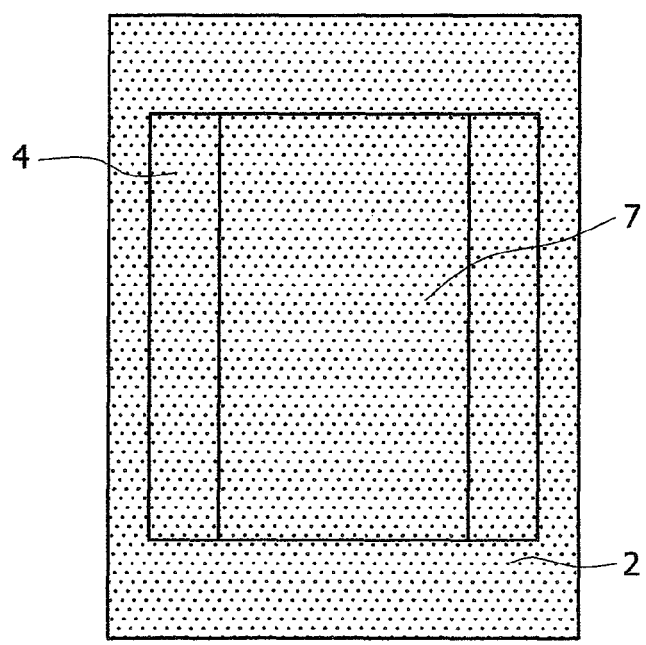
(2)
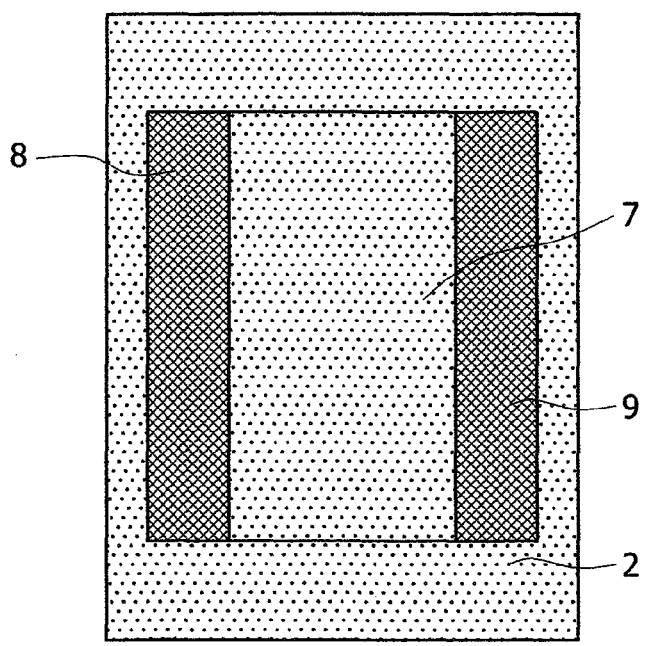

SEMICONDUCTOR DEVICE

CLAIM OF PRIORITY

The present application claims priority from Japanese patent application JP2007-262194 filed on Oct. 5, 2007, the content of which is hereby incorporated by reference into this application.

BACKGROUND OF THE INVENTION

1. Field of the Invention

The present invention relates to a light emitting device using silicon, and more particularly, a laser using ultrathin silicon.

2. Description of the Related Art

An optical communication is adopted in a broadband network supporting an Internet industry. A laser using a compound semiconductor of the III-V group or II-VI group is used for transmission and reception using light in such an optical communication.

Various structures are proposed for the compound semiconductor laser, but a double hetero structure is generally used. In the double hetero structure, a compound semiconductor having a small band gap is fitted in a compound semiconductor having a large band gap by using two different kinds of compound semiconductors. In order to fabricate the double hetero structure, an n conductive type compound semiconductor, an undoped i conductive type compound semiconductor, and a p conductive type compound semiconductor are laminated on a substrate in a vertical direction by continuous epitaxial growing. Meanwhile, it is important to consider a band structure of the undoped i type compound semiconductor interposed between the n-type and p-type compound semiconductors. It is important that the band gap of the i-type compound semiconductor is smaller than that of the n-type or p-type compound semiconductors, a conduction band level of the i-type compound semiconductor is lower than that of the n-type compound semiconductor, and a valence band level of the i-type compound semiconductor is higher than that of the p-type compound semiconductor. That is, electrons and holes are trapped in one area of the i-type compound semiconductor. Accordingly, since the electrons and the holes are easy to exist on the same area, there is high probability that the electrons and the holes will be annihilated by collision increases, thereby improving luminous efficiency. Since a refractive index tends to increase as the band gap decreases, the light is also trapped in the i-type compound semiconductor by selecting a material having the refractive index of the i-type compound semiconductor smaller than that of the n-type or p-type compound semiconductor. Since the trapped light efficiently induces rebinding of the electrons and the holes which form inverted distribution, a laser beam is oscillated.

A long-range data communication is instantly made in a mass by the optical communication using the compound semiconductor having such excellent luminescence efficiency. That is, processing or storing of data is performed on an LSI using the silicon, while transmission of the data is performed by the laser using the compound semiconductor.

If the silicon may be emitted at high efficiency, it is possible to integrate both an electronic device and a light emitting device on a silicon chip, resulting in a valuable industrial technology. Therefore, a lot of researches for making the silicon emit the light have been conducted.

However, it is difficult to make the silicon emit the light at high efficiency since the silicon has an indirect transition type band structure. The indirect transition type band structure is a band structure in which any one of the momentum of which the energy of the conduction band is at a lowest level and the momentum of which the energy of the valence band is at the lowest level is not 0. In case of the silicon, the minimum energy point of the valence band is a point $\Gamma$ where the momentum is 0, while the minimum energy point of the conduction band is not the point $\Gamma$ but exists between the point $\Gamma$ and a point X. More specifically, when a grating constant is represented by 'a' and $k0=0.85*\pi/a$ is defined, the minimum energy point degenerates and exists at six points of $(0, 0, \pm k0)$, $(0, \pm k0, 0)$, and $(\pm k0, 0, 0)$.

Since the minimum energy points of both the conduction band and the valence band exist at the point $\Gamma$ in most compound semiconductors, the compound semiconductors are called a direct transition type semiconductor.

Next, the reason why the luminescence efficiency is low in an indirect transition type semiconductor and the reason why the luminescence efficiency is high in a direct transition type semiconductor will be described.

As described above, in order to allow a semiconductor element to emit the light, the electrons and the holes are annihilated due to the collision causing the difference in energy between both sides to produce the light. At this time, both an energy conservation law and a momentum conservation law should be satisfied. The electrons have an energy level in the conduction band and the holes have an energy level in the valence band without the electrons. The difference between both sides is the energy level of the light. Since a wavelength is different for each energy level, the difference in the energy level between the conduction band and the valence band, that is, the size of the band gap determines the wavelength of the light, that is, a color. Therefore, there is no particular difficulty in satisfying the energy conservation law.

Meanwhile, the collision of the electrons and the holes causes the light to be emitted, thus the momentum should be conserved. By quantum mechanics which is a law controlling a microscopic world, the electrons, the holes, and photons (quantum of light) are represented as waves, but since they are dispersed as particles, the momentum conservation law is satisfied. The momentum is a scale that quantifies the degree of power the particles are qualitatively flickered in collision of the particles. In consideration of the dispersion relationship of the light $\omega=ck$ (where, $\omega$ represents an angular frequency of the light, c represents high speed, and k represents the momentum of the photon) and the energy of the light, the momentum of the photon in crystal is approximately 0. Even though the particles are flickered as the light collides with the particles, a material is little dispersed by flickering of the particles with our intuitions.

Meanwhile, since the hole also has the minimum energy point at a point $\Gamma$, the hole has almost little momentum. However, since the electron almost never exists at the point $\Gamma$ in the silicon which is the indirect transition type semiconductor and exists at a minimum energy point in the vicinity of a point X, the electron has a large momentum of $k0=0.85*\pi/a$.

Accordingly, if the silicon is used, both the momentum conservation law and the energy conservation law cannot be satisfied when the electrons and the holes just collide with each other. Herein, phonon which is the quantum of photon oscillation in the crystal is absorbed or discharged, and only an electron-hole pair capable of satisfying both the momentum conservation law and the energy conservation law anyhow is transformed to the light. Even though such a process may be physically present, an environment in which the electron, hole, photon, and phonon collide with each other at the same time is a sophisticated dispersion process, there is very low probability that such an environment will occur. Therefore, it is known that the silicon which is the indirection transition type semiconductor is very low in luminescent efficiency.

Since most of the direct transition type compound semiconductors have the minimum energy point at a point Γ in both the conduction band and the valence band, both the momentum conservation law and the energy conservation law can be satisfied. Accordingly, the compound semiconductors have high luminescent efficiency.

Non-patent Document 1 (pp. 143508-1-143508-3 of Vol. 88 in 2006, "Applied Physics Letters" written by R. Chan, M. Feng, N. Holonyak, Jr., A, James, and G. Walter) discloses a transistor laser device which drives a laser using a compound semiconductor having the high luminescent efficiency in a bipolar transistor made of the compound semiconductor.

As described above, even though the silicon is very low in luminescent efficiency in a bulk state, the luminescent efficiency of the silicon increases by changing the bulk state into a porous state or a nanoparticle state.

For example, Non-patent Document 2 (pp. 1046-1048 of Vol. 57 in 1990, "Applied Physics Letters" written by L. T. Canham) discloses a report that when silicon anodized in a fluorinated acid solution is in the porous state, the silicon emits light in a visible light wavelength band at room temperature. Even though such a mechanism is not completely defined, it is believed that a quantum size effect occurring to allow the silicon trapped in a narrow area due to formation of a porosity to exist may be important. In case of the silicon having a small size, since the electron is trapped in the narrow area, the momentum cannot be adversely determined according to an indeterminacy principle of the quantum mechanics. Therefore, it is thought that the electron and the hole can be easily be recoupled.

As another method using the silicon, Non-patent Document 3 (pp. 2077-2079 of Vol. 69 in 1996, "Applied Physics Letters" written by S. Coffa, G. Franzo, and F. Priolo) discloses a report that a light emitting diode is fabricated which becomes a light emitting element by injecting an Er ion into a p-n junction formed on an Si substrate. When the Er ion is injected into the Si substrate, the Er ion forms an impurity level. Since the impurity level is a spatially localized level, the momentum of the electron is substantially 0 when the electron existing in an Si conduction band is trapped at the impurity level formed by the Er ion. Therefore, the electron is recoupled with the hole in the valence band, thereby emitting the light. Since the light emitted via the Er ion has a wavelength of 1.54 μm, the light may be propagated without being absorbed in adjacent silicon. Further, light that is emitted by using the existing optical fiber has a wavelength with decreased loss, the existing optical fiber network may be used even in a case that a Si based LED using the Er ion is practically used by a future technological innovation. Therefore, it is expected that a large-scale equipment investment is not required.

As another method using the silicon, Non-patent Document 4 (pp. 8354-8356 of Vol. 89 in 2001, "Applied Physics Letters" written by F. Iacona, G. Franzo, E. C. Moreira, and F. Priol) or Non-patent Document 5 (pp. 44-49 of Vol. 89 in October 2005, "IEEE Spectrum" written by S. Coffa) disclose a report that it is possible to more efficiently emit the light by injecting the Er ions into silicon nanoparticles by combining the quantum size effect with the Er ions.

A high speed data communication is implemented by connecting the inside of the silicon chip or the silicon chips to each other through a waveguide, etc., and using the light, emitting the light only with the LED is insufficient and thus it is necessary to fabricate a laser diode (LD) having excellent monochromaticity, straight advancement property, and coherency, and having intensity or a phase which may be modulated at high speed.

In order to fabricate the LD, it is necessary to combine a light source composed of a p-n diode, etc., the waveguide, and a mirror with each other.

For example, JP-A-2004-319668 discloses a device for oscillating a laser by combining a waveguide type diffraction grating with a p-n junction added with a rare-earth element. In this device, emission of the light from the rare-earth element is used.

Further, JP-T-2002-536850 discloses a device for oscillating the laser by combining a layer of mirrors vertically deposited on a substrate with a light emitting diode using the silicon. In this device, a p-n junction of a light emitting unit is formed perpendicular to the substrate.

However, as described above, in a case when the silicon is used as the main material for the light source, the luminescent efficiency is insufficient, whereby it is difficult to oscillate the laser.

Therefore, as a method of forming the LD on the silicon chip, for example, Non-patent Document 6 (pp. 1143-1145 of Vol. 18 in 2006, "IEEE Photonics Technology Letters" written by A. W. Fang, H. Park, R. Jones, O. Cohen, M. J. Paniccia, J. E. Bowers) discloses a method of fabricating a resonator constituted by the compound semiconductor as the light source, the waveguide, and the mirror including the silicon. This device uses the compound semiconductor as the light source and has a hybrid structure using the silicon as the resonator, thereby oscillating the laser by overlapping evanescent permeation of the light trapped in the silicon with the compound semiconductor serving as a gain medium.

Here listed U.S. patent application Ser. No. 11/935904 filed by the present applicant as Prior Application related to the present application.

SUMMARY OF THE INVENTION

As described above, a long-range data communication is implemented by an optical communication, but a compound semiconductor is used as an optical device for the optical communication. A laser made of the compound semiconductor has very high efficiency, but it is expensive and is constituted of a plurality of elements, whereby it is difficult to control the laser. Therefore, the laser is not integrated. For example, if a yield (the percentage of a product manufacturing amount actually obtained for a manufacturing amount expected according to an input amount of a raw material) is 70% if one laser or light receiving device is made from the compound semiconductor, the yield is 50% even by combining two lasers or light receiving devices. An OptoElectronic IC (hereinafter, referred to as 'OEIC') exists, but it is practically difficult to implement the OEIC by an optical device using the compound semiconductor.

Meanwhile, in case of an LSI using silicon, products manufactured by advanced micromachining, that is, 0.1 billion or more of metal-insulator-semiconductor field-effect transistor have already been integrated and mass produced. That is, since a device using the silicon may be easily installed on a high-quality single-crystal silicon substrate, a plurality of devices may be manufactured at a yield of approximately 100%. Therefore, even though a large amount of devices are integrated on the same chip, it is possible to economically increase the yield of the chip to a realistic level. Accordingly, an object of the present invention is to implement a light emitting device with high efficiency by using a IV-group semiconductor such as the silicon or germanium equivalent to the silicon.

In the related art, since the silicon emits light, it was considered that the silicon is put into a porous state, a nanoparticle state, or the like due to a quantum size effect in order to distance a momentum from a point k0 according to an indeterminacy principle by changing a band structure of a silicon conduction band into a band structure of a bulk. However, for example, when the silicon having a structure similar to the nanoparticle, is formed, the surface of the silicon nanoparticle is oxidized and thus silicon dioxide is formed on the surface of the silicon nanoparticle because a surface of the silicon is very easily oxidized. Since the silicon dioxide is an insulator having a very large band gap, it is impossible to efficiently inject electrons or holes when the silicon dioxide is formed on the surface of the silicon nanoparticle.

Therefore, although a silicon light emitting device in the related art has high strength in photo luminescence, the silicon light emitting device in the related art has very low strength in electroluminescence. In consideration of emitting the light, a crystalline property of a material serving as a light emitting layer becomes important. However, the crystalline property worsens in the structure similar to the nanoparticle formed by a CVD (Chemical Vapor Deposition) method or a structure of which a surface has a plurality of irregular perforated holes by anode oxidation in comparison with a single crystal. When the crystalline property worsens, the light is emitted at a defect level, but since it is inefficient in the light emission using a defect, it is impossible to manufacture a device capable of enduring a practical use such as the data communication, etc.

As described above, although an effort to make the silicon emit the light is performed by using various technologies such as porous silicon, the nanoparticles, Er dope, or the like, luminous efficiency is not high at a practical level.

Further, in the silicon light emitting device in the related art, since a porous state is used or the nanoparticle is used, it is difficult to make the silicon light emitting device be integrated with high density compatible with a general COMS (Complementary Metal-Oxide-Semiconductor) technology. An object of the present invention is to manufacture the light emitting device by using a process that is compatible with a silicon process in the related art in order to integrate the light emitting device on the same chip as the LSI which is a electronic device in the related art.

In order to perform data communication between the chips or in the chip by using the light emitting device on a silicon substrate, not a simple LED but the light emitting device having strong directivity and monochromaticity is used, whereby an object of the present invention is to achieve a laser diode by oscillating the laser.

The present invention is made in view of the above-described objects. An object of the present invention is to provide a silicon laser device mainly constituted of silicon or a IV-group semiconductor such as germanium on a silicon substrate based on the silicon by a method capable of easily forming the silicon laser device with a general silicon process, and a method thereof.

Among inventions disclosed in the present invention, the outline of a representative invention is briefly described as follows.

A light emitting device according to an aspect of the present invention is an ultrathin silicon laser that includes a first electrode unit injecting electrons, a second electrode unit injecting holes, a light emitting unit electrically connected to the first electrode unit and the second electrode unit, wherein the light emitting unit is made of single-crystal silicon and has a first surface (top surface) and a second surface (bottom surface) opposed to the first surface, a waveguide made of a first dielectric, which is disposed in the vicinity of the light emitting unit, by setting surface directions of the first and second surfaces as a surface (100) and thinning a thickness of the light emitting unit in a direction perpendicular to the first and second surfaces, and a mirror formed by alternately adjoining the first dielectric and a second dielectric.

An effect which can be acquired by a representative invention among inventions disclosed in this application is briefly described as follows.

According to the present invention, it is possible to provide a silicon laser which can be easily formed on a substrate made of silicon, etc. by using a general silicon process at low price.

BRIEF DESCRIPTION OF THE DRAWINGS

FIGS. 2G(1) and 2G(2) are top views illustrating a manufacturing process sequence of a silicon laser according to a first embodiment of the present invention;

FIG. 2O is a top view illustrating a manufacturing process sequence of a silicon laser according to a first embodiment of the present invention;

DETAILED DESCRIPTION OF THE PREFERRED EMBODIMENTS

Figure 1A:
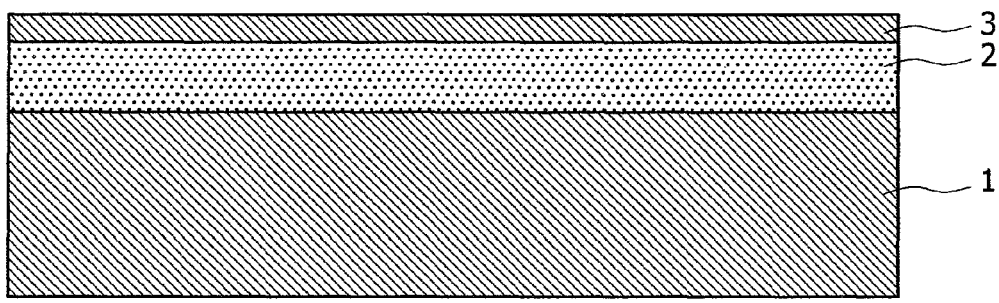
FIG. 1A is a cross-sectional view illustrating a manufacturing process sequence of a silicon laser according to a first embodiment of the present invention.

Hereinafter, embodiments of the present invention will be described in detail with reference to the accompanying drawings. Further, in the accompanying drawings for illustrating the embodiments, like reference numerals refer to like elements and the description thereof is omitted. In addition to a method disclosed in the embodiments, various changes such as a change of combination of materials or manufacturing processes, etc. may be made.

First, a principle for allowing a IV-group semiconductor such as silicon or a germanium equivalent to the silicon to efficiently emit light, which is the origin of the present invention will be described.

In an indirect transition type semiconductor such as the silicon, etc., there is a high probability that most electrons will be present at a position distanced from a point $\Gamma$ where a momentum is 0 in a momentum space, thus the electrons moves with a very large momentum. For this reason, since a momentum conservation law is not satisfied when the electrons and holes collide with each other, a process of recoupling the electros and the holes by emitting the light is prohibited.

The present invention has a basic principle that the indirect transition type semiconductor is effectively transformed into a direct transition type semiconductor in a bulk state due to a quantum confinement effect in case of an ultrathin film having a very small z-direction thickness t.

When the electrons are confined in a very narrow region such as an ultrathin single-crystal silicon film, etc., the electrons do not effectively move in a vertical direction of the thin film, even in silicon in which electrons in a conduction band are not preset at a point $\Gamma$ in the bulk state. Since the vertical direction qualitatively disappears on the thin film, the electrons cannot move in the vertical direction of the thin film. That is, the electrons may rapidly move between crystals in the bulk state, but since a direction to which the electrons will move disappears in the thin film, the electrons cannot help being stopped.

That is, since the electrons cannot freely move by confining the electrons, the electrons are effectively present at the point $\Gamma$. Similarly, since the electrons are present at the point $\Gamma$, when the electrons collide with the holes having a small momentum, light having the small momentum may be discharged while still maintaining the momentum conservation law and an energy conservation law. The momentum is a scale that measures the degree of impact that scatters particles when a particle collides with another particle. The momentum of the electron is lost when the electron cannot move by being confined in the narrow region. When the momentum of the electron decreases, the momentum conservation law in scattering which was difficult by the related art may be satisfied, thereby allowing the IV-group semiconductor such as the silicon to efficiently emit the light.

Further, in the present invention, a method of injecting the electrons and the holes is devised. In emitting the light from porous silicon or silicon nanoparticles in the related art, since a silicon dioxide insulating film is present between adjacent silicon nanoparticles serving as the center of the light emission or silicon thin lines, it was impossible to efficiently inject the electrons. In the present invention, one single-crystal silicon film is used and since the single-crystal silicon film is connected directly to an electrode, it is possible to efficiently and electrically emit the light without suppressing carriers from being injected by the silicon dioxide insulating film.

As a representative fabrication method of the present invention, a method of fabricating an ultrathin silicon film, it was possible to form a controllable and uniform film on a substrate by using an oxidation process. In a silicon process, since the oxidation process is a manufacturing process having the highest controllability, it was possible to form the uniform ultrathin film by using the oxidation process. This process is quite contrary to a method of forming a silicon light emitting device in the related art. In the related art, the nanoparticles were controlled to several nms by gradually increasing the sizes of the nanoparticles of the silicon from an atom level in a CVD method in the related art, while in the present invention, a manufacturing process of the device starts from a substrate on which the single-crystal silicon such as an SOI (Silicon On Insulator), etc. having excellent crystallinity is formed and a formation process of making thin the silicon film by controlling it to the utmost limit is used. During the formation of the nanoparticles by the CVD method in the related art, a surface direction of the crystal was not even. This means that since the nanoparticles are naturally self-aligned, this process was very difficult to control.

Contrary to this, in the light emitting device using the ultrathin silicon film according to the present invention, since a single-crystal silicon substrate having an original surface direction is used, it is possible to have very high controllability and completely determine a direction of a surface. The description of that the direction of the surface should be designed so that minimum energy points in the conduction band and the valence band has a momentum of 0 when the carriers are trapped is the same as the above-described description.

In order to make the silicon emit the light with high efficiency, a valley of energy may effectively be the point Γ by thinning a film thickness of the silicon with a surface (100) serving as a surface. This may be understood from the fact that a conduction band bottom exists in the vicinity of a point X in a band structure in the bulk of the silicon. Similarly, the high-efficiency light emitting device according to the present invention may be applied to other semiconductors such as germanium, etc. as well as the silicon. In the case of the germanium, since the valley of the energy of a conduction band exists at a point Γ in the bulk, the minimum point of the energy in the thin film may be the point Γ by forming a thin film with a surface 111 serving as the surface, as a result, it is possible to make the germanium to emit the light with high efficiency. For this, for example, after a substrate such as an SOI (Silicon On Insulator) where a silicon surface 111 is formed on a surface of the germanium is prepared and the germanium is epitaxially grown thereon, it is preferable that the film thickness is thinned by oxidation and an ultrathin germanium film with the surface 111 serving as the surface is formed. Since the germanium has a band gap smaller than that of the silicon, an emission wavelength may be shifted to a long wavelength suitable for application of a long-range optical communication. When silicon germanium, which is a mixed crystal of the silicon and the germanium, is used, the silicon germanium has a band gap between the silicon and the germanium, whereby it is possible to adjust the emission wavelength. In addition, it is possible to further control the wavelength by doping carbon on the silicon germanium.

A method of efficiently confining the carriers in the narrow region includes various methods in addition to the method of processing the ultrathin IV-group semiconductor on the ultrathin film described above. First, the processing method may include a method of patterning the ultrathin IV-group semiconductor by a wet etching process or a dry etching process besides the above-mentioned oxidation process. Further, the processing method may further include a method of forming a layer of a desired film thickness by the epitaxial growth or a method of forming a pseudo single-crystal film by a SELAX (Selectively Enlarging Laser X'tallization) technology, etc. The ultrathin single-crystal film may be formed by using any manufacturing method. The carriers may be confined by applying a gate voltage to form an inversion layer or an accumulation layer instead of reducing the film thickness like the ultrathin silicon film.

Hereinafter, embodiments according to the above-mentioned principle of the present invention will be described. Figures shown in the accompanying drawings are typically drawn by not accurately adjust a reduced scale but emphasizing an important part so that logic becomes clear.

First Embodiment

In the embodiment, a silicon laser prepared by a method of easily forming the silicon laser by using a general silicon process and a manufacturing method thereof will be disclosed.

Figure 1B:
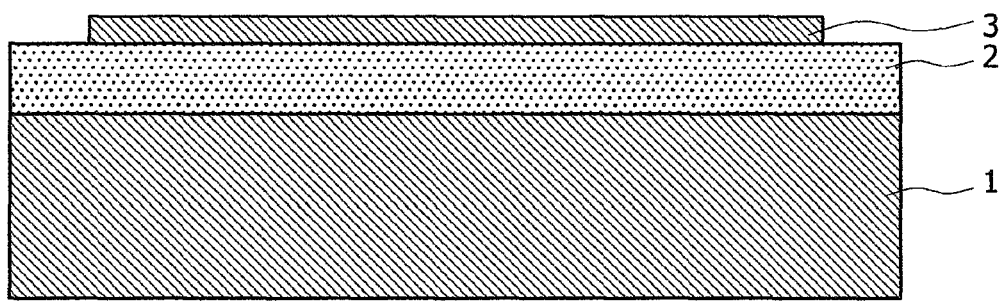
FIG. 1B is a cross-sectional view illustrating a manufacturing process sequence of a silicon laser according to a first embodiment of the present invention.
Figure 1C:
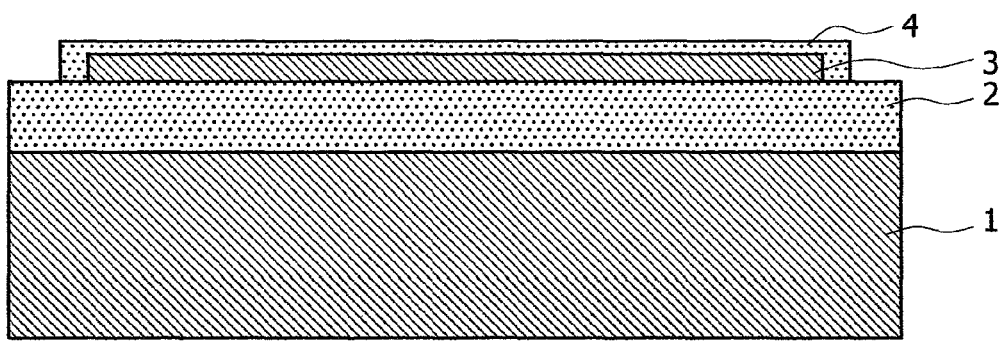
FIG. 1C is a cross-sectional view illustrating a manufacturing process sequence of a silicon laser according to a first embodiment of the present invention.
Figure 1D:
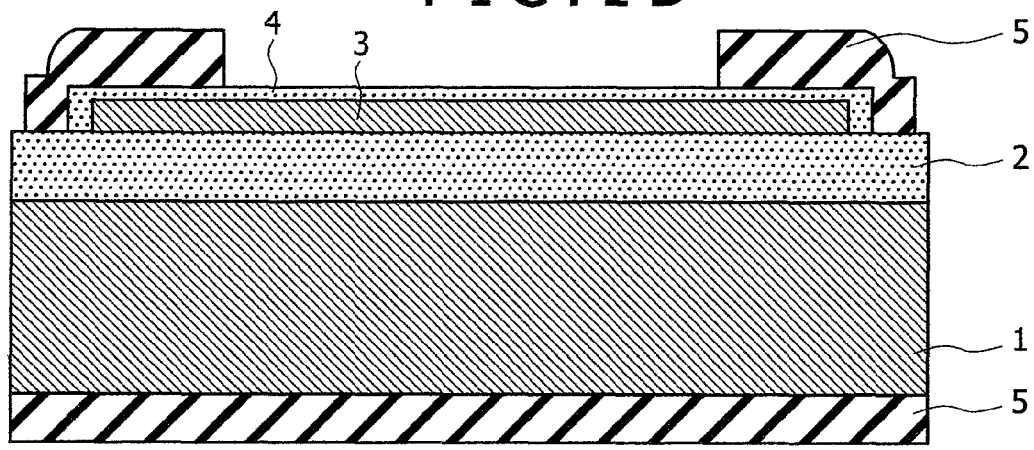
FIG. 1D is a cross-sectional view illustrating a manufacturing process sequence of a silicon laser according to a first embodiment of the present invention.
Figure 1E:
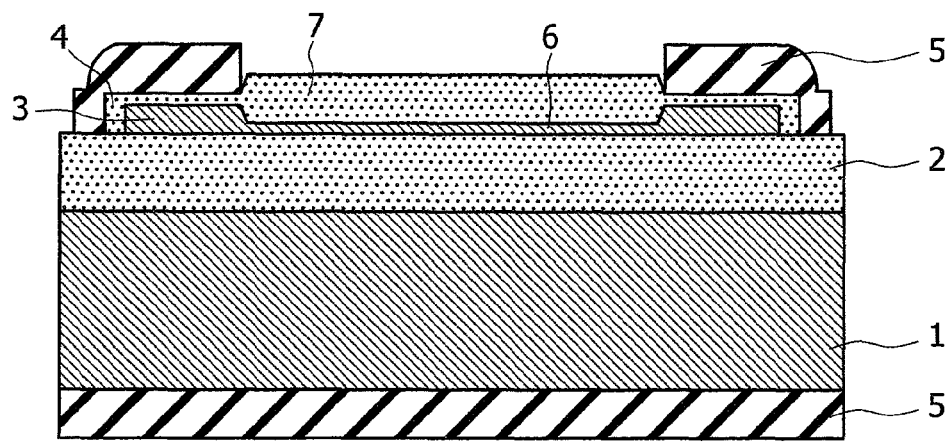
FIG. 1E is a cross-sectional view illustrating a manufacturing process sequence of a silicon laser according to a first embodiment of the present invention.
Figure 1F:
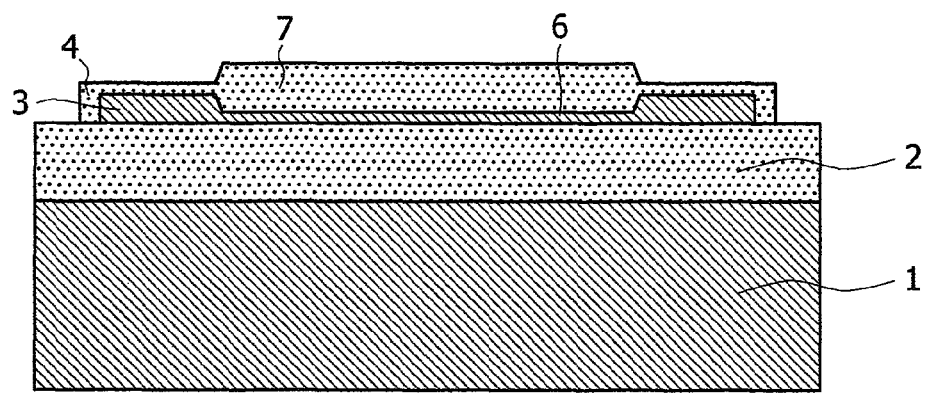
FIG. 1F is a cross-sectional view illustrating a manufacturing process sequence of a silicon laser according to a first embodiment of the present invention.
Figure 1G:
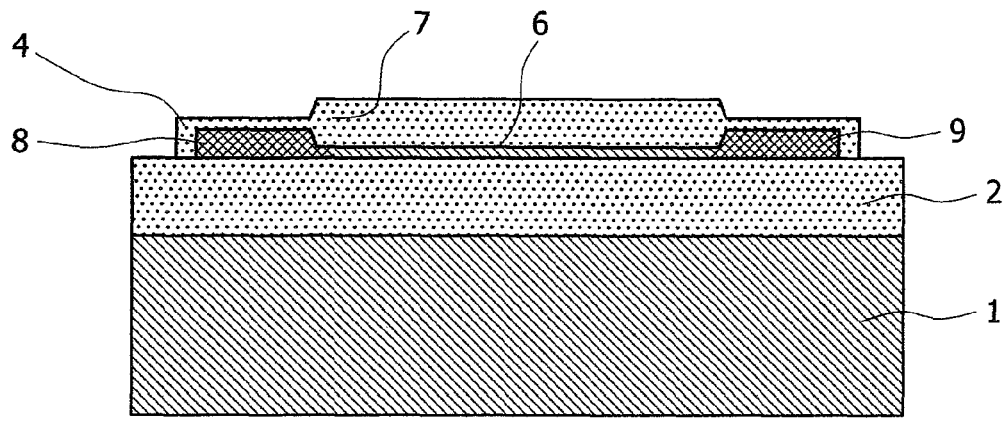
FIG. 1G is a cross-sectional view illustrating a manufacturing process sequence of a silicon laser according to a first embodiment of the present invention.
Figure 1H:
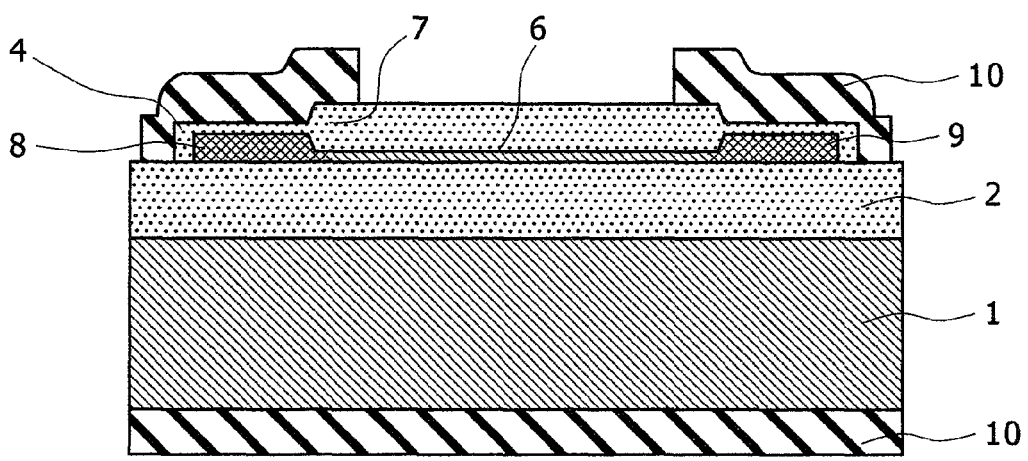
FIG. 1H is a cross-sectional view illustrating a manufacturing process sequence of a silicon laser according to a first embodiment of the present invention.
Figure 1I:
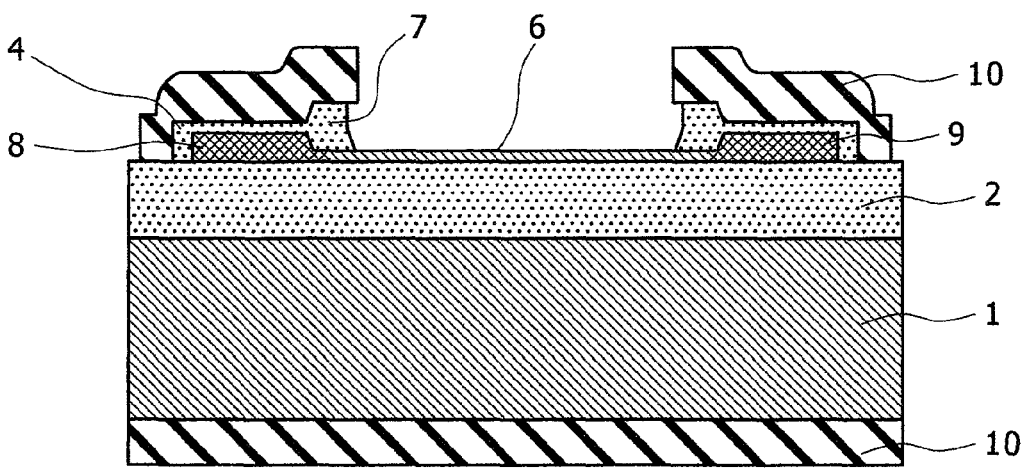
FIG. 1I is a cross-sectional view illustrating a manufacturing process sequence of a silicon laser according to a first embodiment of the present invention.
Figure 1J:
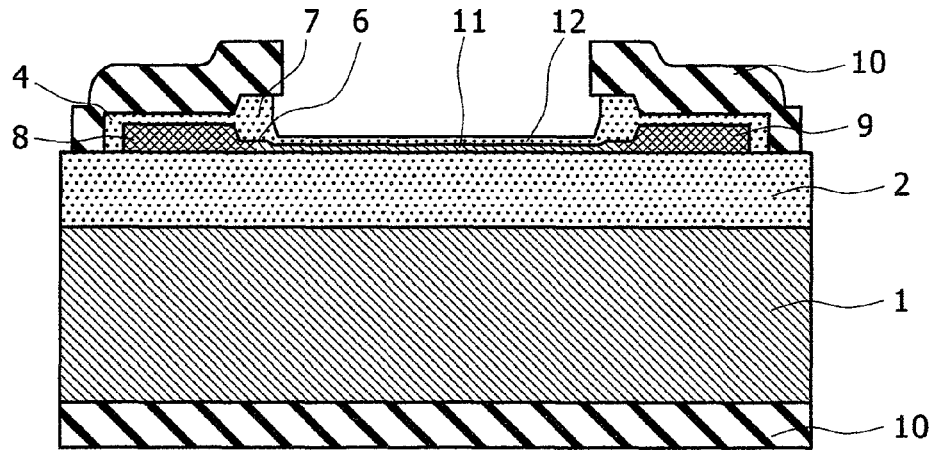
FIG. 1J is a cross-sectional view illustrating a manufacturing process sequence of a silicon laser according to a first embodiment of the present invention.
Figure 1K:
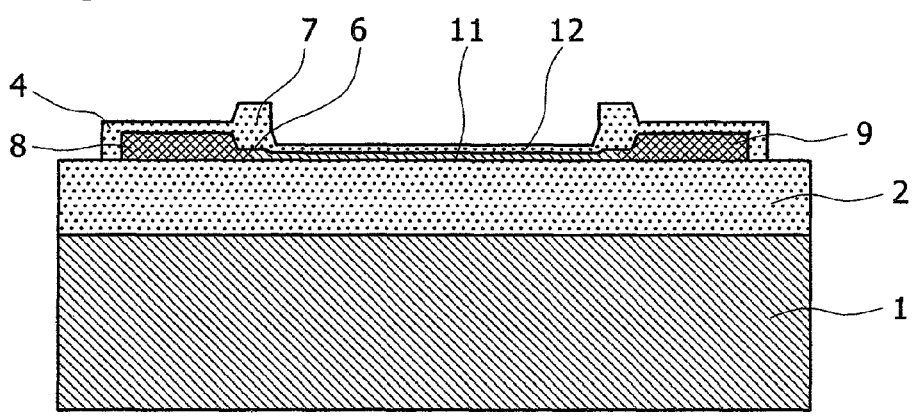
FIG. 1K is a cross-sectional view illustrating a manufacturing process sequence of a silicon laser according to a first embodiment of the present invention.
Figure 1L:
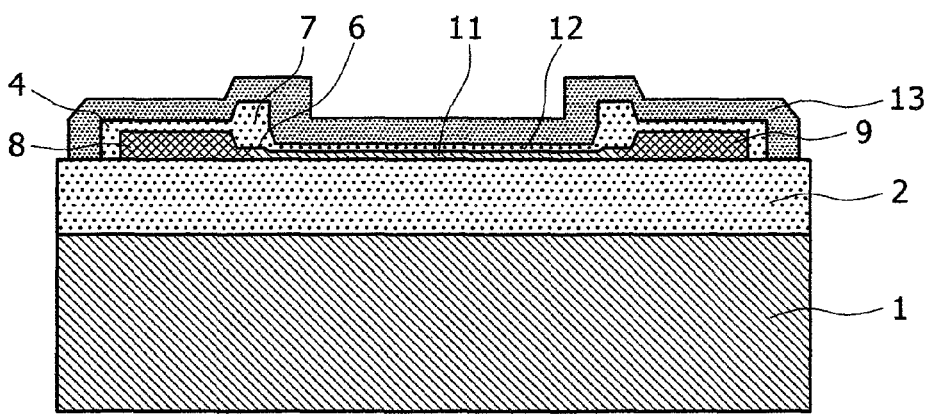
FIG. 1L is a cross-sectional view illustrating a manufacturing process sequence of a silicon laser according to a first embodiment of the present invention.
Figure 1M:
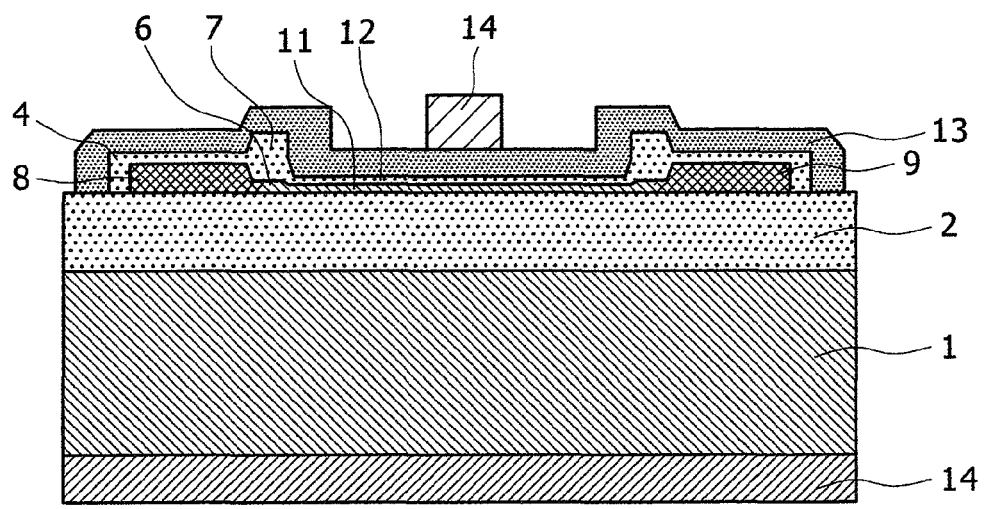
FIG. 1M is a cross-sectional view illustrating a manufacturing process sequence of a silicon laser according to a first embodiment of the present invention.
Figure 1N:
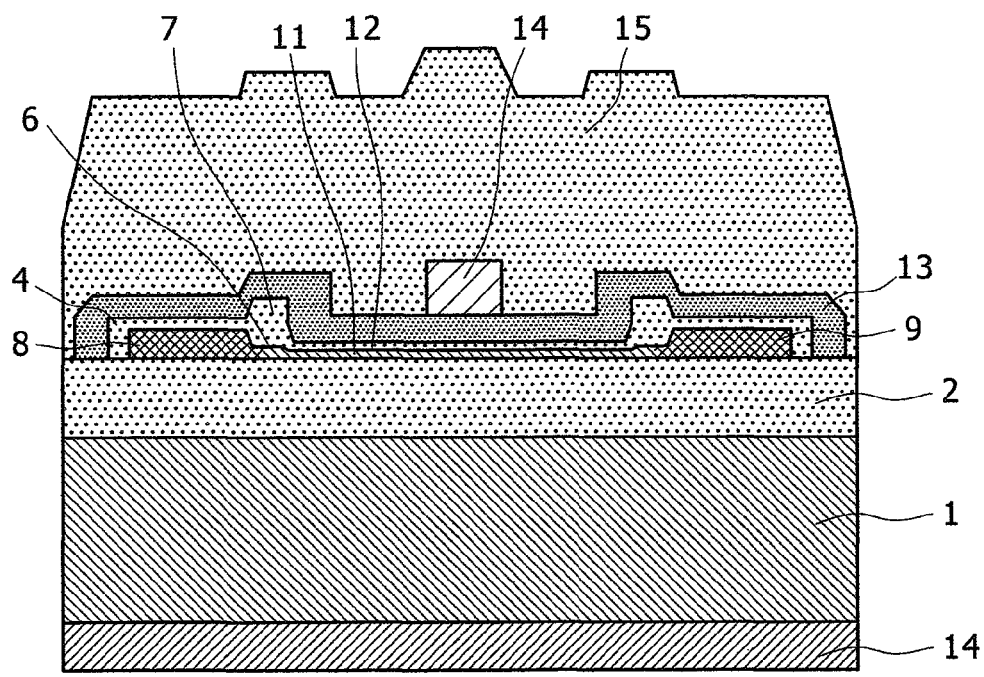
FIG. 1N is a cross-sectional view illustrating a manufacturing process sequence of a silicon laser according to a first embodiment of the present invention.
Figure 1O:
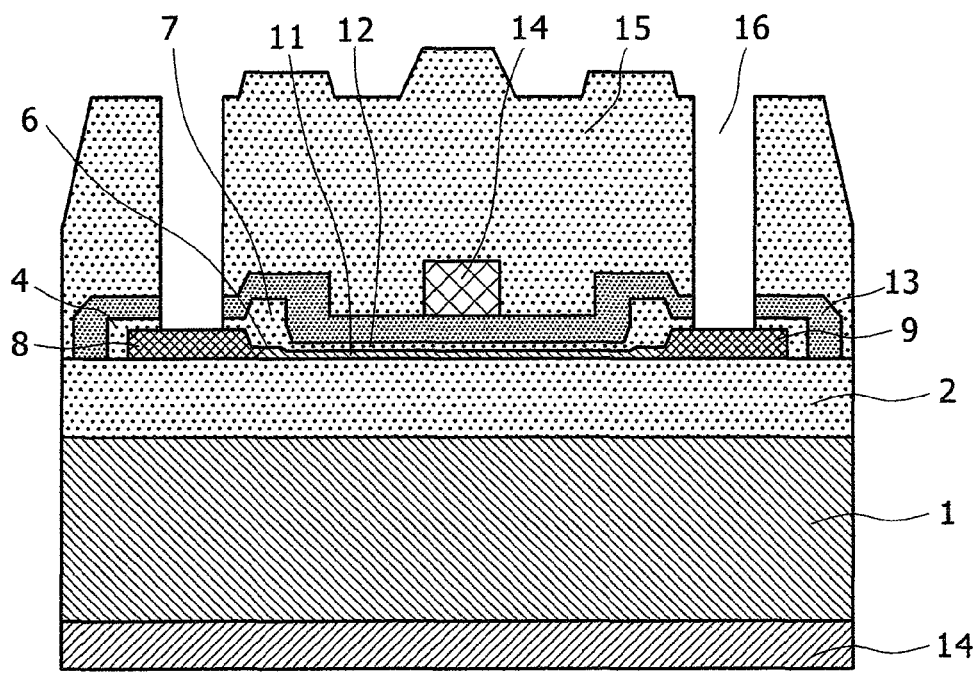
FIG. 1O is a cross-sectional view illustrating a manufacturing process sequence of a silicon laser according to a first embodiment of the present invention.
Figure 1P:
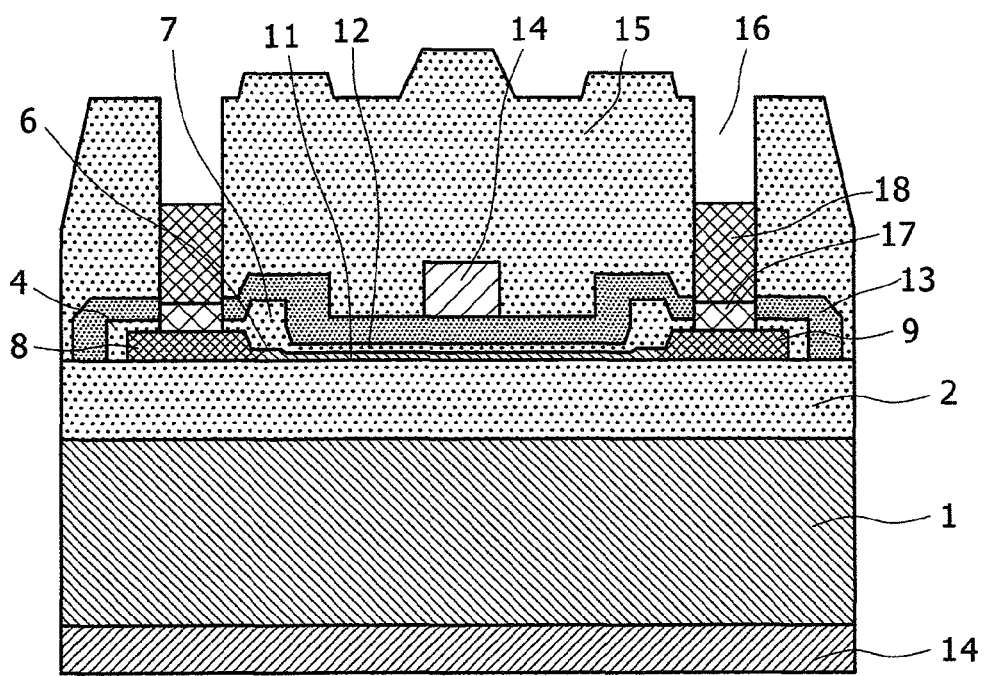
FIG. 1P is a cross-sectional view illustrating a manufacturing process sequence of a silicon laser according to a first embodiment of the present invention.
Figure 1Q:
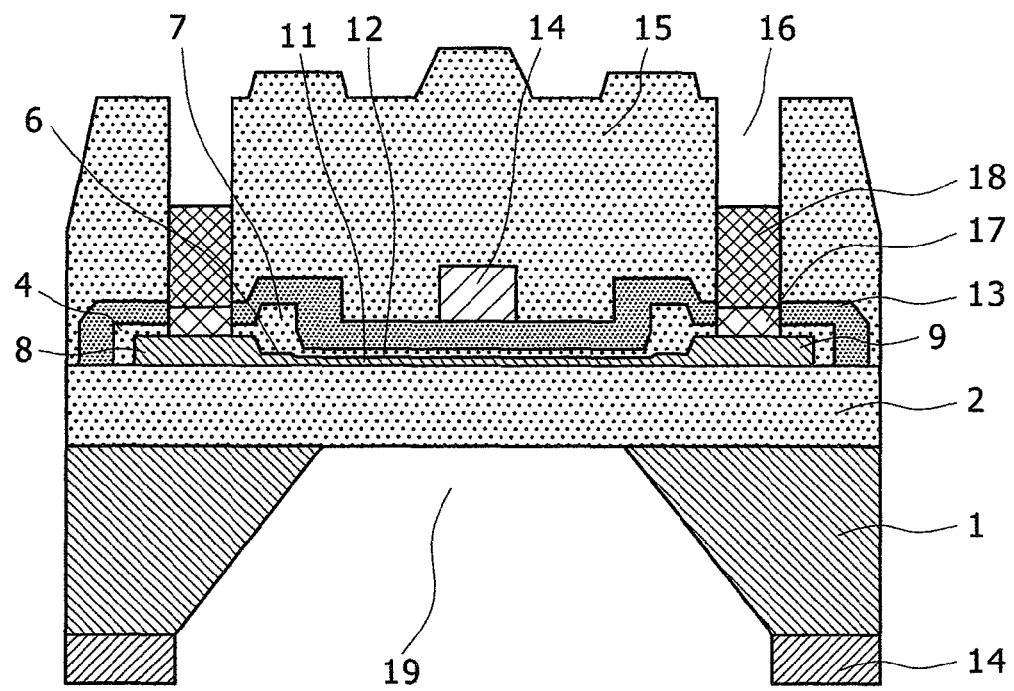
FIG. 1Q is a cross-sectional view illustrating a manufacturing process sequence of a silicon laser according to a first embodiment of the present invention.
Figure 1R:
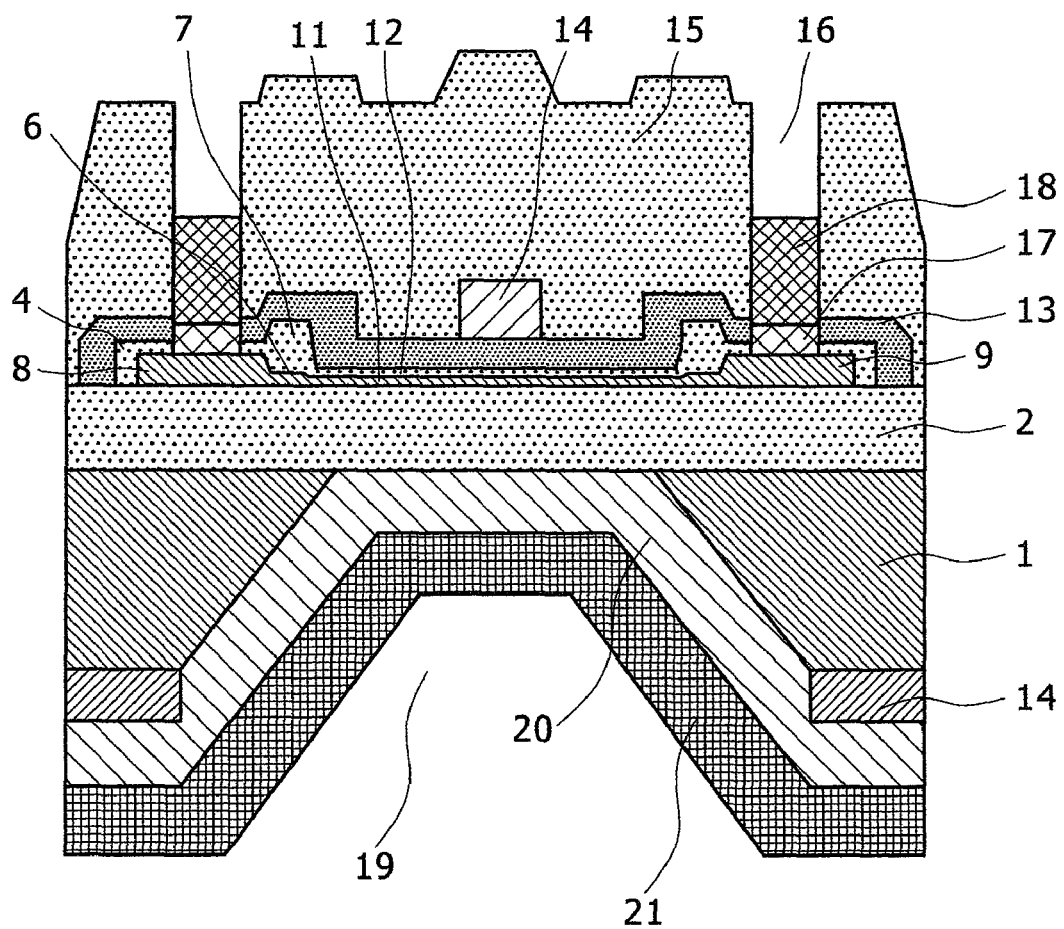
FIG. 1R is a completed cross-sectional view of a silicon laser according to a first embodiment of the present invention.
Figure 2A:
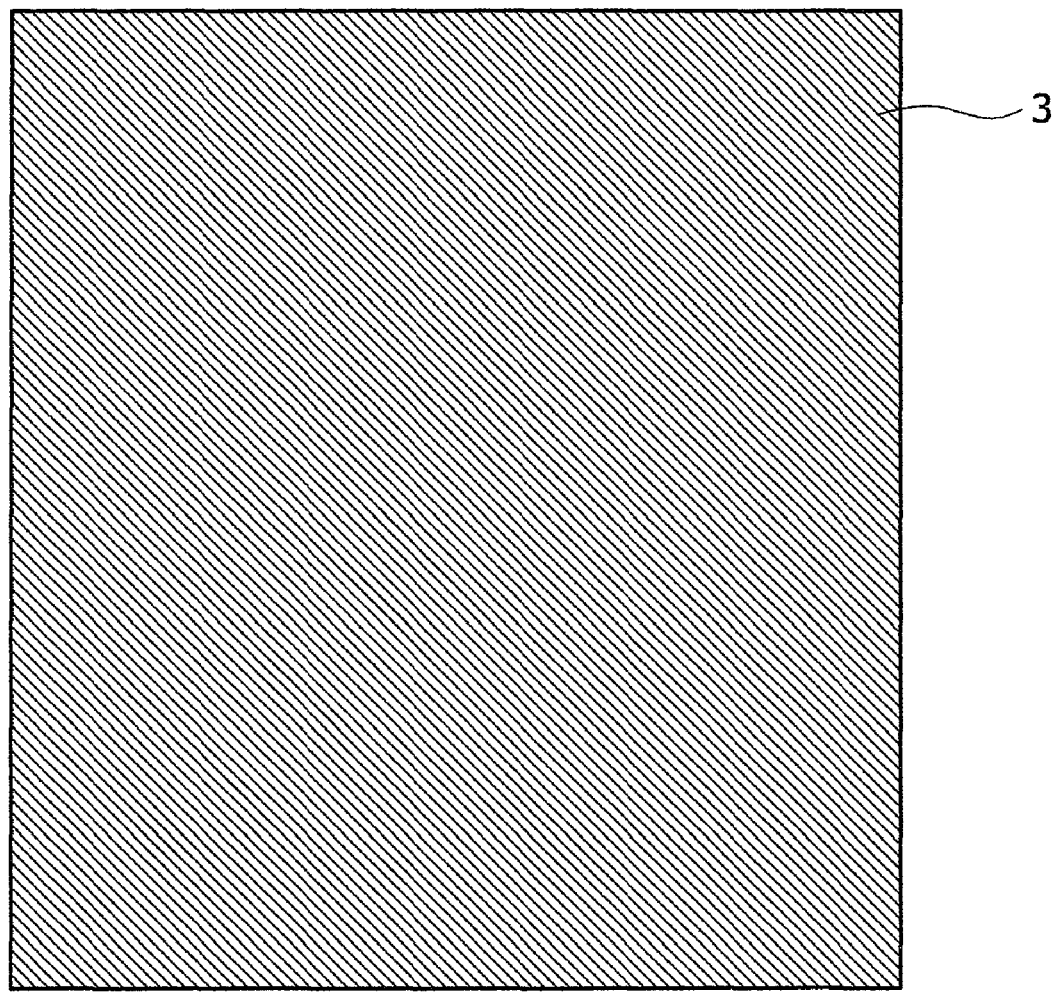
FIG. 2A is a top view illustrating a manufacturing process sequence of a silicon laser according to a first embodiment of the present invention.

FIGS. 1A to 1R show cross-sectional structures of a manufacturing process sequence. FIGS. 2A to 2R are schematic views of a manufacturing process sequence viewed from an upper part of a substrate. Herein, FIGS. 1A to 1R are horizontal cross-sectional views of FIGS. 2A to 2R, respectively. For example, FIG. 1R shows a structure taken along a cross section 23 in FIG. 2R. In the embodiment, a completed drawing of a device is shown in FIGS. 1R and 2R.

Hereinafter, a manufacturing process will be sequentially described.

First, as shown in FIG. 1A, an SOI substrate as a support substrate is prepared on which a silicon substrate 1, a buried oxide (hereinafter, referred to as 'BOX') 2, and a silicon on insulator (hereinafter, referred to as 'SOI') 3 are laminated from the bottom thereof. Even though the SOI 3 is disposed on a surface of the substrate from an upper part of the substrate as shown in FIG. 2A, the substrate below the SOI 3 may be shown transparent in actual experimental manufacture in a case when a substrate thickness of the SOI 3 is thin. Herein, a substrate having a surface (100) on the surface thereof is used as a single-crystal silicon constituting the SOI 3. In the embodiment, an initial film thickness of the SOI 3 experimentally manufactured is 55 nm before a process. The film thickness of the BOX 2 is approximately 150 nm. In order to facilitate laser oscillation by efficiently confining light emitted from the SOI 3, it is preferable that a film thickness of the BOX 2 is larger. However, when the BOX 2 is thicker, a difference in film thickness of the SOI 3 relatively increases. In the silicon laser of the present invention, since controlling a film thickness at an atomic layer level becomes very important, a manufacturing method capable of preparing the SOI substrate even in a case when the difference in film thickness is small and the BOX 2 is not sufficiently thin is disclosed in the embodiment. In a case when the SOI substrate having the small difference of 1 μm or more in film thickness of the BOX 2 may be obtained, a process of partially removing the support silicon substrate 1 described below may be omitted. Therefore, it is possible to further simplify the manufacturing method and operate the device with more stability since heat radiation to the silicon substrate 1 may be used.

Unlike the embodiment, silicon having a surface 111 formed in a surface crystal structure in a surface direction of the SOI 3 may be prepared and a substrate in which silicon germanium is epitaxially grown may be prepared. In this case, since germanium is concentrated due to oxidation described below, an ultrathin germanium film having a surface 111 formed in the surface crystal structure is formed and emits light with high efficiency.

Or, instead of the SOI 3, a germanium on insulator (GOI) substrate having the surface 111 formed in the surface crystal structure may be used.

Figure 2B:
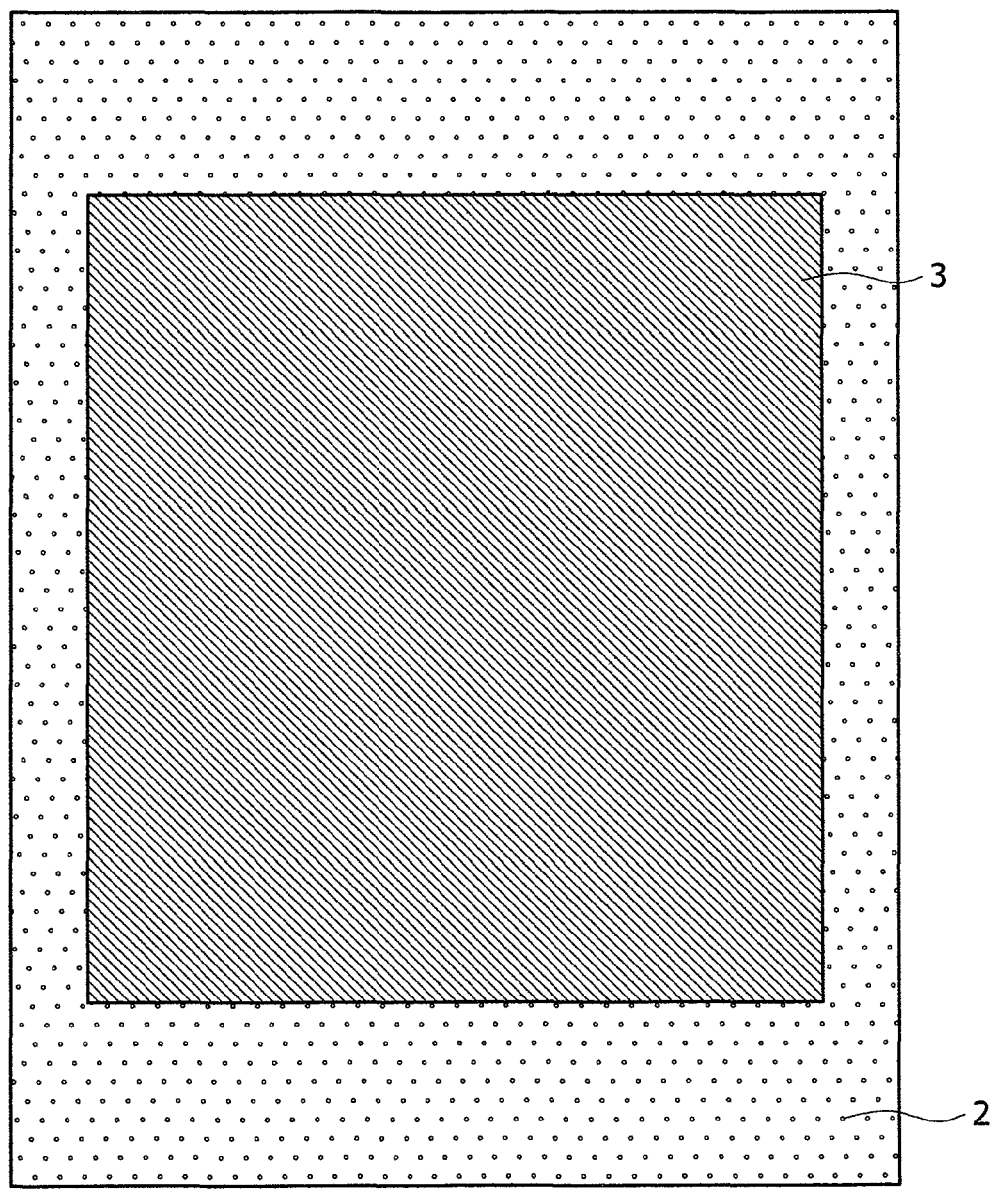
FIG. 2B is a top view illustrating a manufacturing process sequence of a silicon laser according to a first embodiment of the present invention.

Next, after a resist is applied, the SOI 3 is processed in a mesa shape by remaining the resist only in a predetermined region using a mask exposure by photolithography and performing anisotropic dry etching as shown in FIGS. 1B and 2B. In the figures, only one element is shown for brevity, but a plurality of elements are actually formed on the substrate at the same time. Since a silicon process is used, it is possible to integrate the plurality of elements with a high yield.

Although not shown in the figures, the corner of the SOI 3 processed in the mesa shape is rounded by performing isotropic dry etching. By rounding such an angle, in a case when an oxidation processing is performed in the following process, a stress is concentrated at only an edge, thereby preventing oxidation from occurring. That is, if the corner is not rounded, portions of the SOI 3 in the vicinity of the corner become thicker than portions in the vicinity of the SOI 3. Therefore, when a current flows, the current flows concentratively on the portions in the vicinity of the angle, thereby decreasing luminous efficiency. In the embodiment, a measure is given to such a problem beforehand. In order to round the corner of the SOI 3, high-temperature hydrogen annealing or wet etching performed in other manufacturing methods may be used in addition to the isotropic dry etching performed in the embodiment.

Instead of processing the SOI 3 in the mesa shape as performed in the embodiment, the element may be separated by a shallow trench isolation (STI) or local oxidation of Si (LOCOS).

Figure 2C:
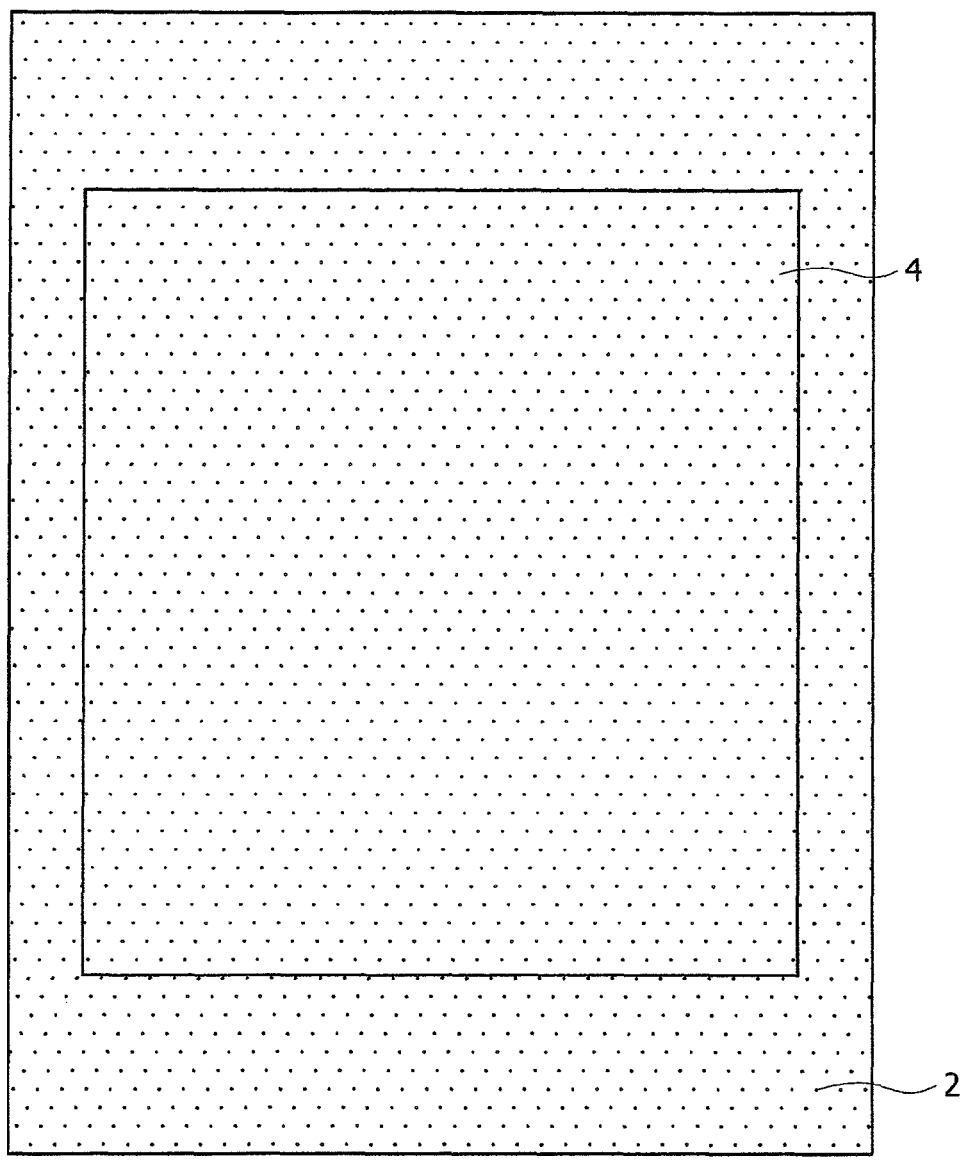
FIG. 2C is a top view illustrating a manufacturing process sequence of a silicon laser according to a first embodiment of the present invention.

In order to protect a surface of the SOI 3, the surface of the SOI 3 is oxidized in approximately 15 nm, silicon dioxide 4 having a thickness of approximately 30 nm is formed as shown in FIGS. 1C and 2C, and silicon dioxide 4 formed on a rear surface of the silicon substrate is removed by cleansing the rear surface. The silicon dioxide 4 serves to alleviate damages on the substrate by injection of ions introduced in the following process and suppresses impurities from being discharged to the atmosphere by activation heat treatment. The silicon dioxide 4 formed on the rear surface of the silicon substrate 1 may not necessarily be removed, but in a case when the silicon dioxide 4 is not removed, a process of patterning the silicon dioxide 4 formed on the rear surface of the silicon substrate by dry etching needs to be added in a process of partially removing a support silicon substrate 1 to be described below.

For this reason, in the embodiment, the silicon dioxide 4 formed on the rear surface of the silicon substrate 1 is removed by a simple cleansing process. The silicon dioxide 4 may be formed by using not a thermal oxidation process but a process of depositing the silicon oxide 4 only on the surface of the substrate with a chemical vapor deposition (CVD) apparatus.

Figure 2D:
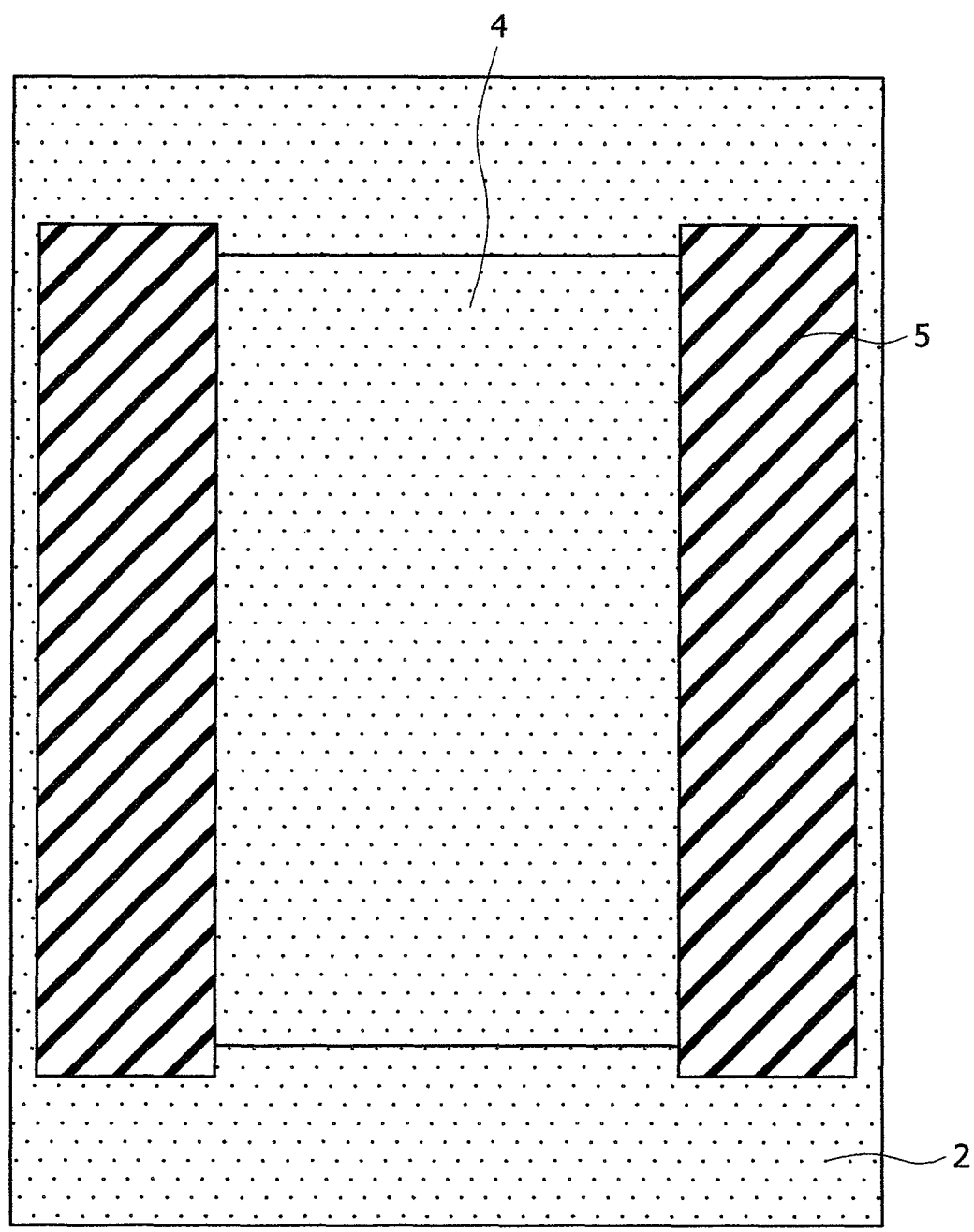
FIG. 2D is a top view illustrating a manufacturing process sequence of a silicon laser according to a first embodiment of the present invention.

Next, after nitride silicon 5 is deposited on a front surface of the silicon substrate 1 in a thickness of 100 nm, the silicon substrate is processed into a state shown in FIGS. 1D and 2D by remaining a resist only in a predetermined region by resist patterning using photolithography and processing the nitride silicon 5 by using anisotropic dry etching. As shown in FIG. 1D, the nitride silicon 5 is also formed on the rear surface of the silicon substrate 1.

Figure 2E:
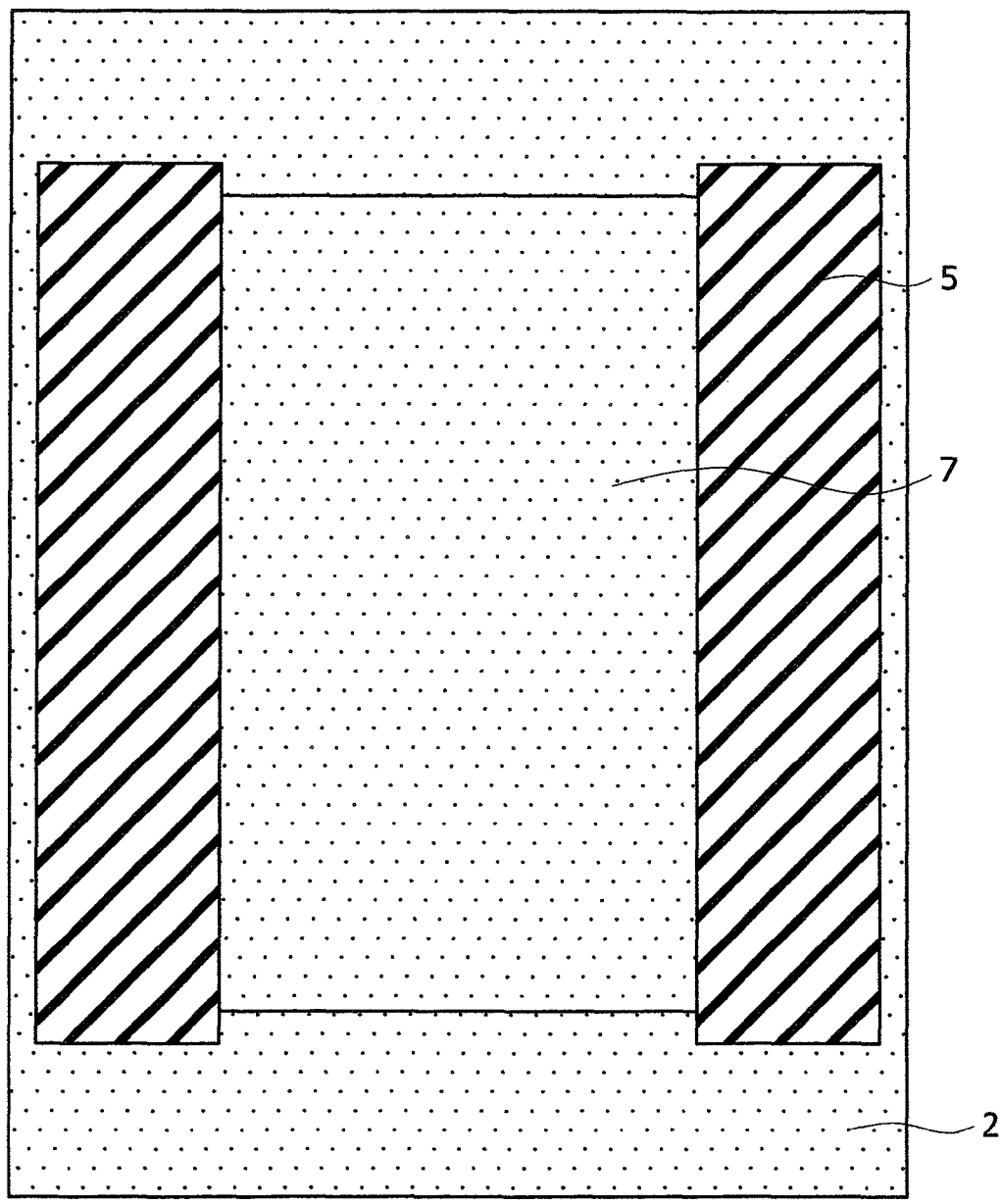
FIG. 2E is a top view illustrating a manufacturing process sequence of a silicon laser according to a first embodiment of the present invention.

After silicon dioxide 4 on the surface, which exists on an opening portion is removed by a cleaning process and wet etching using a fluorinated acid, a thin silicon 6 formed by thinning the SOI 3 by performing the oxidation process is formed and a thermally oxidized film 7 is formed on the surface as shown in FIGS. 1E and 2E. In this process, the SOI 3 is locally oxidized by using the nitride silicon 5 as a mask material in oxidation. Herein, the reason for partially removing the silicon dioxide 4 on the surface before the oxidation is to consider damages on the silicon oxide 4 by the cleansing process, etc. If the oxidation process is performed with a damaged film left, this causes the silicon to be nonuniformly oxidized, whereby a variation in film thickness occurs. In order to form an ultrathin silicon film such as an atomic layer and several layers, a reason why such a variation occurs should be excluded. The thermally oxidized film 7 is approximately 60 nm which is formed by adjusting oxidation temperature and an oxidation time so that the thickness of the thin silicon 6 is 10 nm. Since unoxidized thick SOI 3 is 40 nm in a state shown in FIG. 1E, a film thickness ratio between the thick SOI 3 and the thin silicon 6 is approximately 4:1. However, at this film thickness ratio, distortion generated due to stress applied to a locally oxidized edge which rapidly varies the film thickness counts for noting. When the film thickness ratio increases more than the film thickness ratio, the stress increases, thereby causing the SOI substrate to be broken at the edge.

In this embodiment, in order to prevent such an element from being broken, a manufacturing process for gradually changing the film thickness of the SOI 3 is devised by dividing the oxidation process in two steps.

Figure 2F:
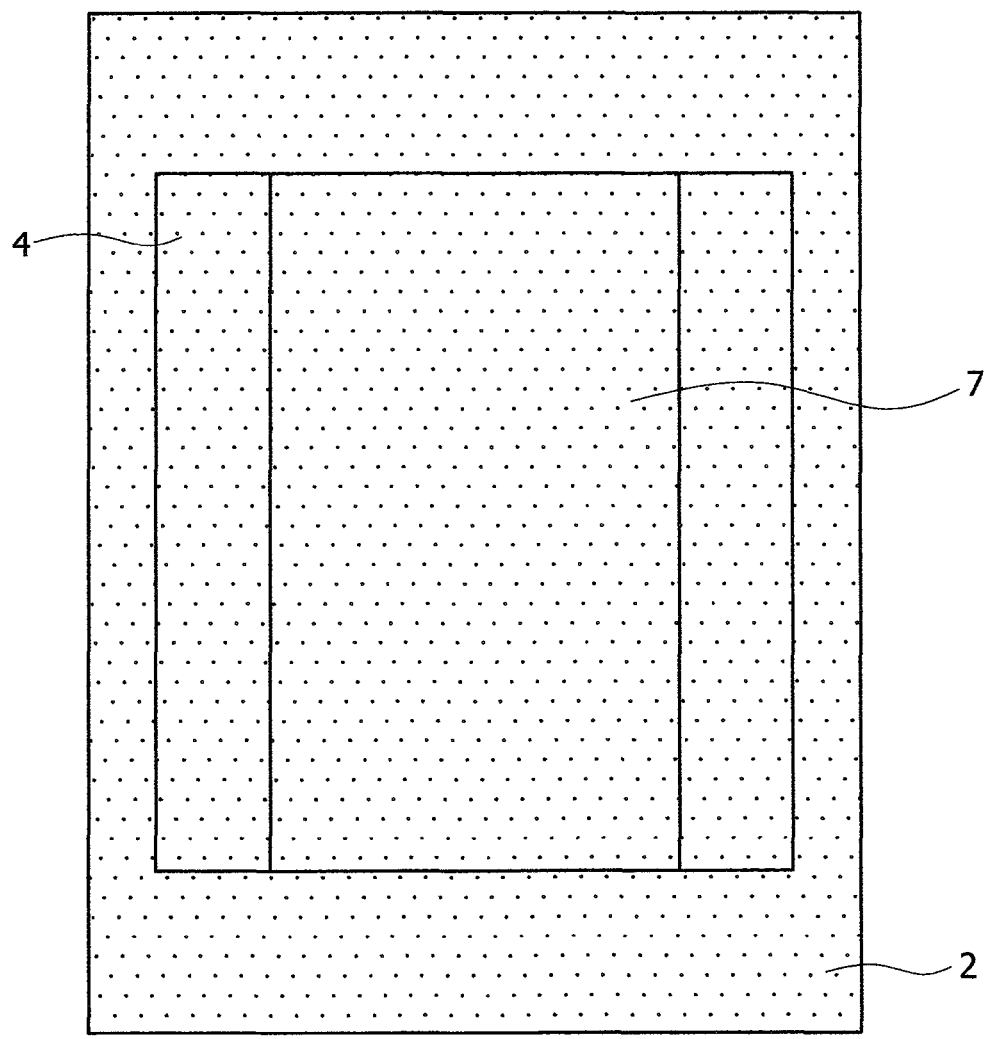
FIG. 2F is a top view illustrating a manufacturing process sequence of a silicon laser according to a first embodiment of the present invention.

The nitride silicon 5 is removed by the cleaning process and the wet etching using a heat phosphoric acid as shown in FIGS. 1F and 2F.

The impurities are injected into a predetermined region on the SOI 3 by injecting the ions. At this time, the impurities are prevented from being injected into the thin silicon 6 by using a difference in film thickness between the silicon dioxide 4 and the thermally oxidized film 7. This is why it is that it is preferable that an impurity concentration in a light emitting part is low since high-density impurities become the non-emitting recombination center, thereby decreasing the luminous efficiency when the high-density impurities remain in a light emitting unit. Consequently, the impurity concentration of the thin silicon 6 is approximately $1\times10^{15}/cm^3$.

In case of the injected impurities, first, after a resist remains only in a predetermined region by resist patterning using photolithography, a p-type Si electrode 8 is formed in the SOI 3 by injecting $BF_2$ ion with a dosage of $1\times10^{15}/cm^2$. Further, after the resist is removed, an n-type Si electrode 9 is formed in the SOI 3 by injecting P ions with a dosage of $1\times10^{15}/cm^2$ by remaining the resist only in the predetermined region by the resist patterning using the photolithography. This is exemplified in FIGS. 1G and 2G(1). FIG. 2G(1) shows a surface film viewed from an upper part. Since an ion injection status cannot be known from this state, FIG. 2G(2) shows a lower part of the silicon dioxide 4. Actually, when an inspection is performed with an optical microscope in the manufacturing process, it is confirmed that the silicon dioxide 4 is glass and thus is shown transparent, and a region into which other impurities are injected is shown in a different color as shown in FIG. 2G(2).

In the ion injection process, since a portion of the SOI 3 where the ions are injected is made amorphous, crystallinity becomes inferior. Therefore, although not shown in the figures, it is important that only the surface of the SOI 3 is made amorphous and thus crystal silicon remains in a region of the SOI 3 adjacent to the BOX 2. When an acceleration voltage of the ion injection is set to a too high value, the entire SOI 3 in the region injected with the ions is made amorphous. As a result, the SOI 3 in the region injected with the ions does not recover to a single crystalline state but is in a poly crystalline state in spite of performing the annealing. According to an ion injection condition determined in the embodiment, since the crystal silicon remains in the region of the SOI 3 adjacent to the BOX 2, the crystallinity may be recovered by activation heat treatment, etc. after the ions are injected. It is very important that the single crystallinity is achieved in order to allow the SOI 3 to efficiently emit the light. Subsequently, the impurities are activated and the crystallinity of the SOI 3 is recovered by performing the annealing for 20 minutes in a nitrogen atmosphere of 900° C.

Figure 2H:
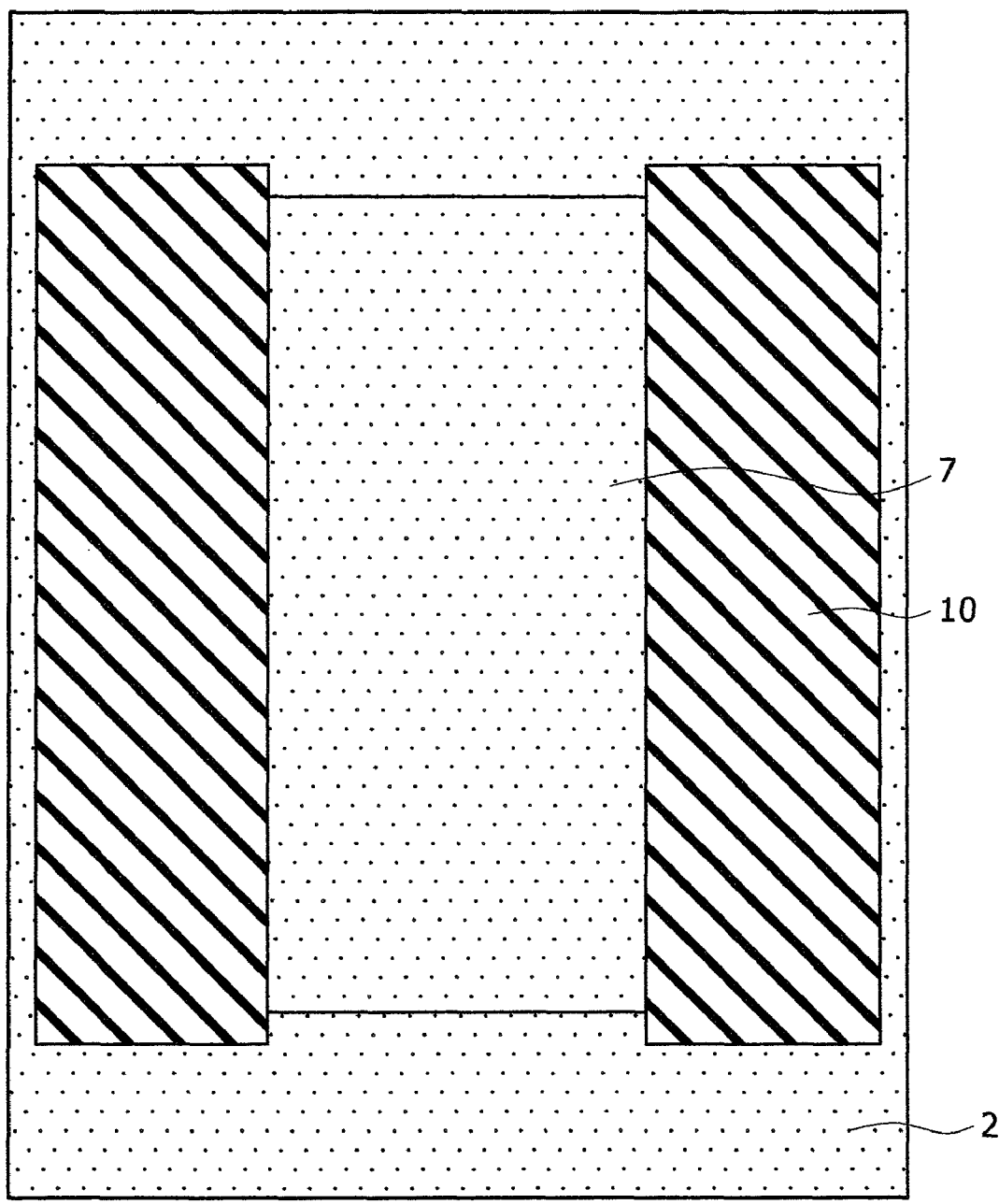
FIG. 2H is a top view illustrating a manufacturing process sequence of a silicon laser according to a first embodiment of the present invention.

Next, after nitride silicon 10 is deposited on the front surface in a thickness of 100 nm, the silicon substrate 1 is processed into a state shown in FIGS. 1H and 2H by remaining the resist only in a predetermined region by the resist patterning using the photolithography and processing the nitride silicon 10 by using the anisotropic dry etching. As shown in FIG. 1H, the nitride silicon 10 is also formed on the rear surface of the silicon substrate 1. Herein, it is important that a part of an edge of the nitride silicon 10 after the resist patterning exists on the thermally oxidized film 7. Since this reduces the distortion caused by stress generated during the oxidation process as described above, this is performed in order to implement the spatially gradual variation in film thickness of the SOI 3 generated during the oxidation process. In the embodiment, a distance from the edge of the nitride silicon 10 to the edge of the nitride silicon 10 after the resist patterning is removed by 1 µm.

Figure 2I:
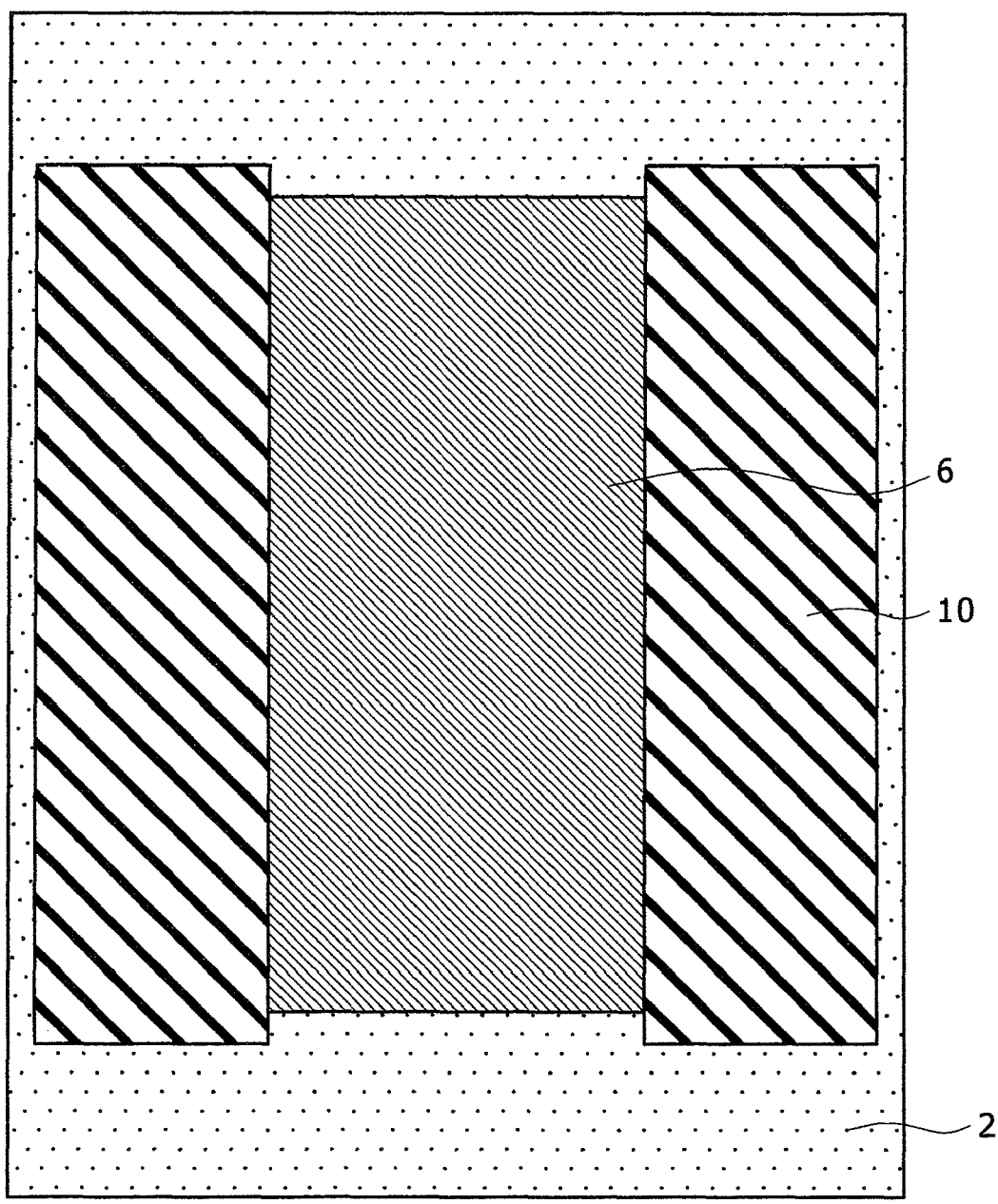
FIG. 2I is a top view illustrating a manufacturing process sequence of a silicon laser according to a first embodiment of the present invention.

Silicon dioxide 7 on the surface of the thin silicon 6, which exists in the opening portion is separated by the cleansing process and the wet etching using the fluorinated acid as shown in FIGS. 1I and 2I. The reason for removing the silicon dioxide 7 existing on the thin silicon 6 prior to the oxidation process is to prevent the oxidation process from being performed with the damaged film left as described above.

Figure 2J:
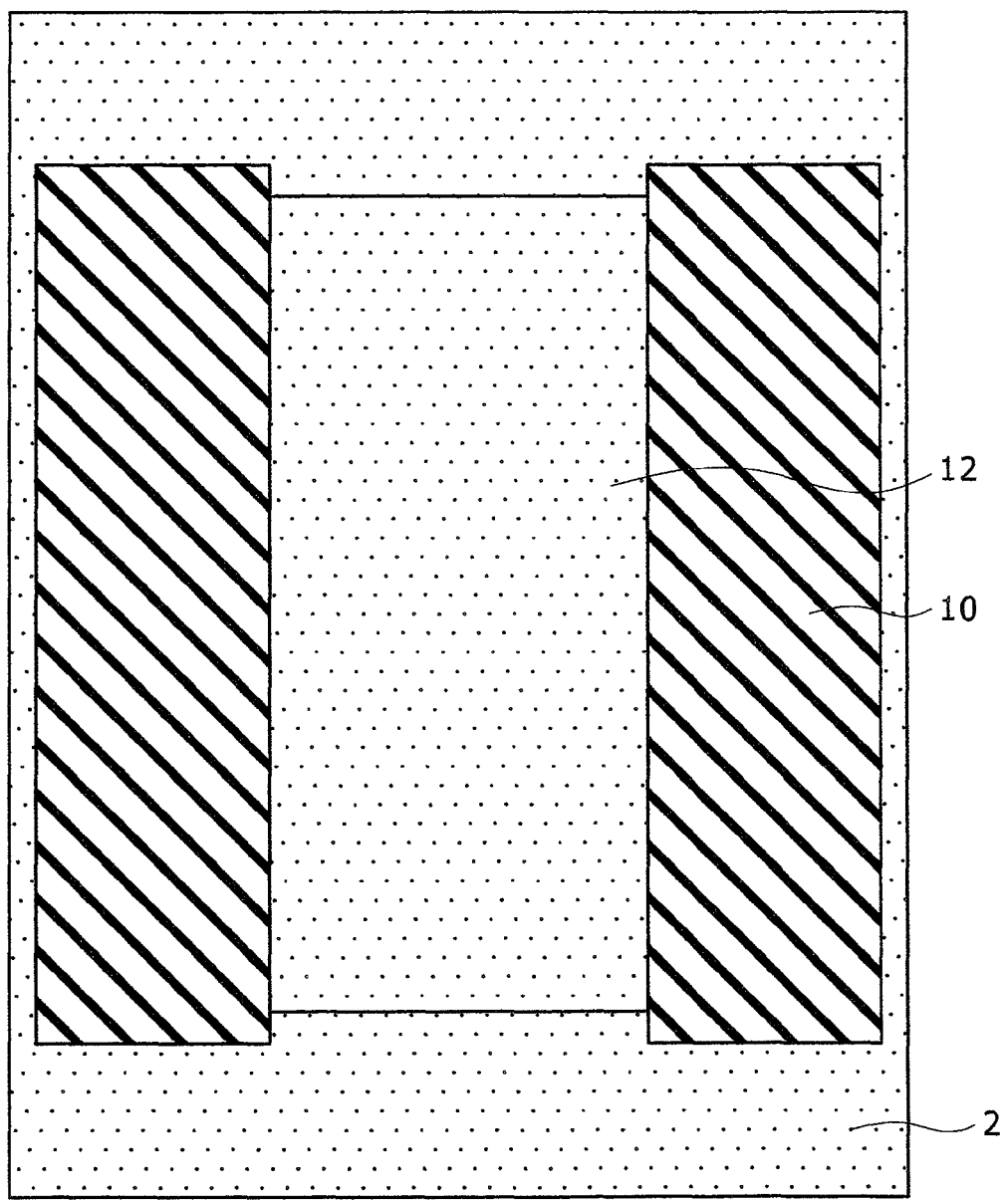
FIG. 2J is a top view illustrating a manufacturing process sequence of a silicon laser according to a first embodiment of the present invention.

By performing the oxidation process, an ultrathin silicon 11 acquired by further thinning the thin silicon 6 and a thermally oxidized film 12 is formed on the surface of the thin silicon 11 as shown in FIGS. 1J and 2J. In this process, the thinner silicon 11 is further formed by locally oxidizing the thin silicon 6 using the nitride silicon 10 as the mask material during the oxidation. An oxidation time and an oxidation temperature are adjusted so that a film thickness of the ultrathin silicon 11 is 2.0 nm. At this time, a film thickness ratio between the thin silicon 6 and the ultrathin silicon 11 is approximately 10:2=5:1. This ratio is substantially equal to approximately 4:1 which is a film thickness ratio between the above-mentioned thick SOI 3 and the thin silicon 6. The ultrathin silicon 11 may be formed with a high yield without breaking the element due to an increment of the distortion. Thus, it is possible to spatially and gradually changing the variation in film thickness of the SOI 3 by dividing the local oxidation process of the SOI 3 in two steps. By the same process, a element in which the film thickness of the ultrathin silicon 11 is 1.5 nm or 1.0 nm may be fabricated.

Figure 2K:
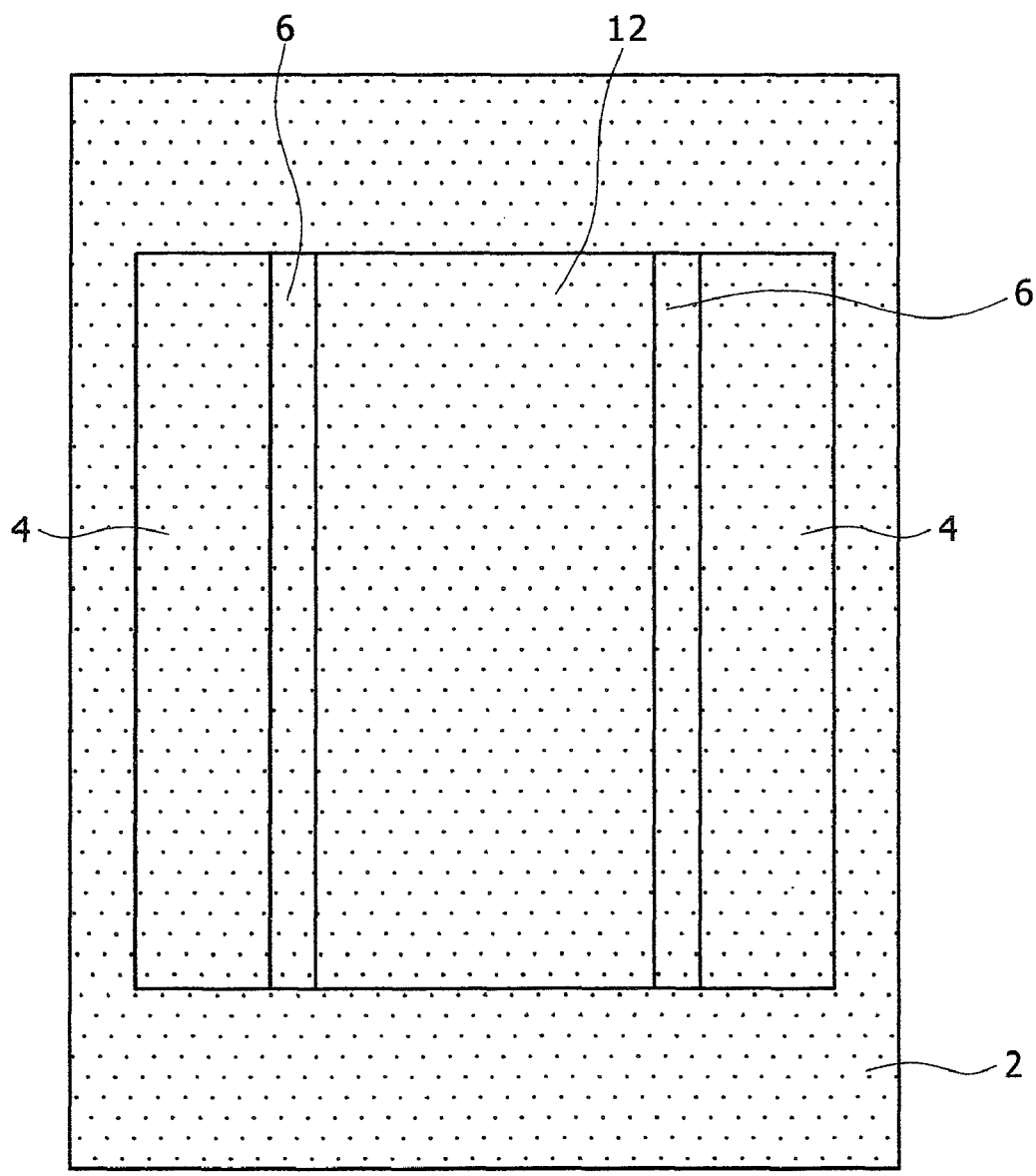
FIG. 2K is a top view illustrating a manufacturing process sequence of a silicon laser according to a first embodiment of the present invention.

The nitride silicon 10 is removed by the cleaning process and the wet etching using a heat phosphoric acid as shown in FIGS. 1K and 2K.

Figure 2L:
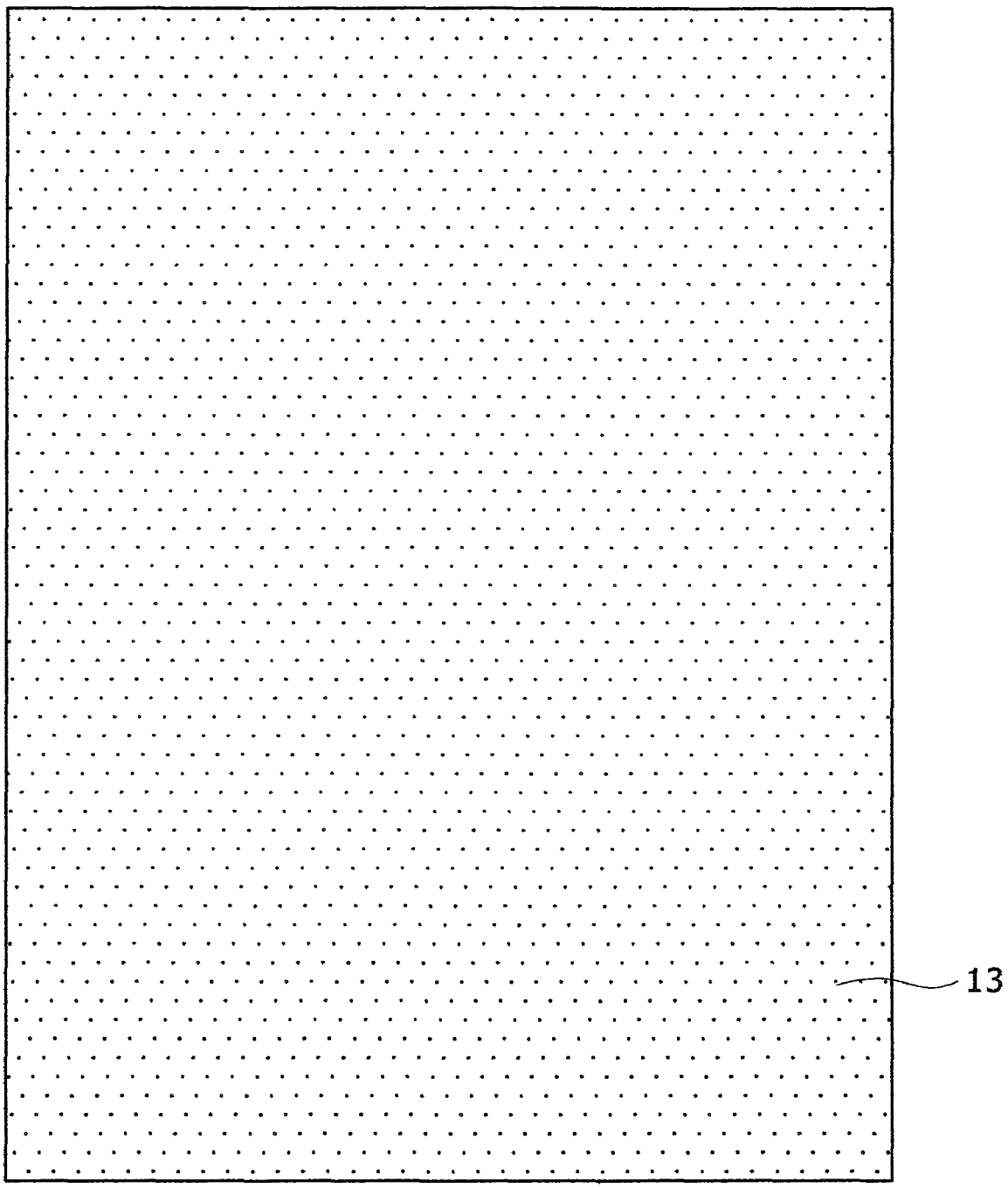
FIG. 2L is a top view illustrating a manufacturing process sequence of a silicon laser according to a first embodiment of the present invention.

Silicon dioxide 13 for protecting the surface of the silicon substrate 1 is deposited to have a thickness of 50 nm as shown in FIGS. 1L and 2L. However, the silicon dioxide 13 may not be deposited if the silicon dioxide satisfies a process condition of the dry etching for patterning nitride silicon 14 to be performed later in this process. A merit of forming the silicon dioxide 13 is not to damage the ultrathin silicon 11 even though the silicon oxide 13 is overetched at the time of the patterning the nitride silicon 14. Contrary to this, a demerit of forming the silicon dioxide 13 is to slightly decrease combination of light confined in the waveguide and the ultrathin silicon 11 serving as a quantum well.

Figure 2M:
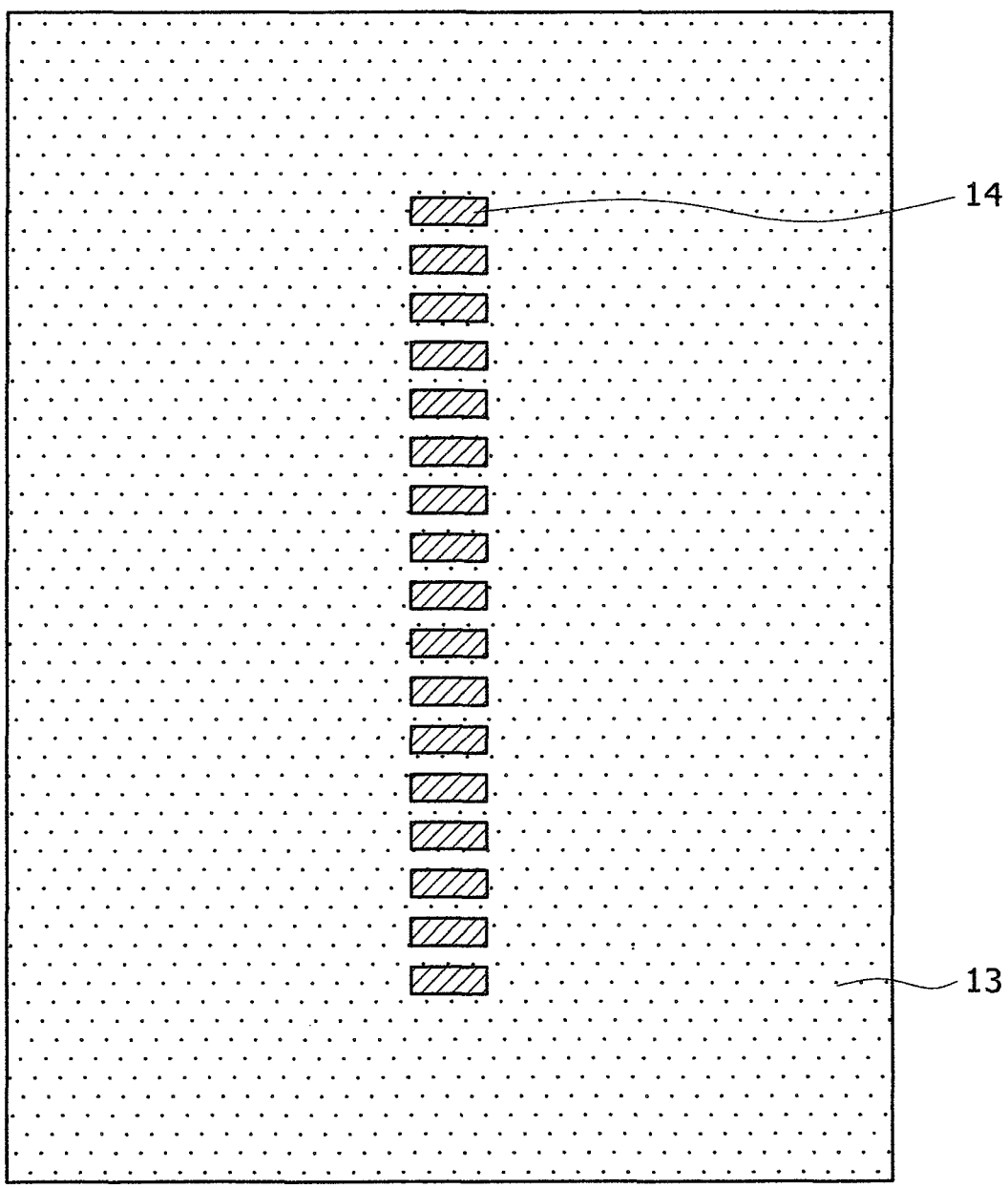
FIG. 2M is a top view illustrating a manufacturing process sequence of a silicon laser according to a first embodiment of the present invention.

After the nitride silicon 14 is deposited on the entire surface, the resist remains only in the predetermined region by the resist patterning using the photolithography and the nitride silicon 14 is processed by the anisotropic dry etching as shown in FIGS. 1M and 2M. Herein, as shown in FIG. 2M, the nitride silicon 14 is pattered in an island shape when viewed from the upper part. The nitride silicon 14 functions as an optical resonant serving as the waveguide and a mirror. Since the light advances while being reflected between the nitride silicons 14 having an island shape, a waveguiding direction of the light has a straight shape connecting islands to each other. The nitride silicon 14 is designed to have a width approximately ¼ of the wavelength of the nitride silicon in order to efficiently function as the mirror.

A spacing gap between the islands is designed to be ¼ of a wavelength of light in silicon dioxide 15 to be deposited later. More specifically, since an emission wavelength is assumed to be 850 nm and an effective refractive index in the waveguide of the nitride silicon 14 is estimated to be approximately 1.78, the width of the island is 119 nm. Since the effective refractive index of the waveguide in a part buried under the silicon dioxide 15 is estimated to be approximately 1.41, the spacing gap between the islands of the nitride silicon 14 is 151 nm when the emission wavelength 850 nm. The horizontal width in a waveguiding direction and a vertical direction on the island from the nitride silicon 14 is 1 µm. In FIG. 2M, only several islands composed of the nitride silicon 14 are shown for brevity, but actually, more islands are formed. More specifically, when a distance from a lower end to an upper end of the island, which is a resonant length is 100 µm, an equation of 100÷(0.119+0.151)≈370.37 can be obtained, whereby the number of islands is 370. Further, the number of islands is 3,703 for a device having a resonant length of 1 mm.

Figure 2N:
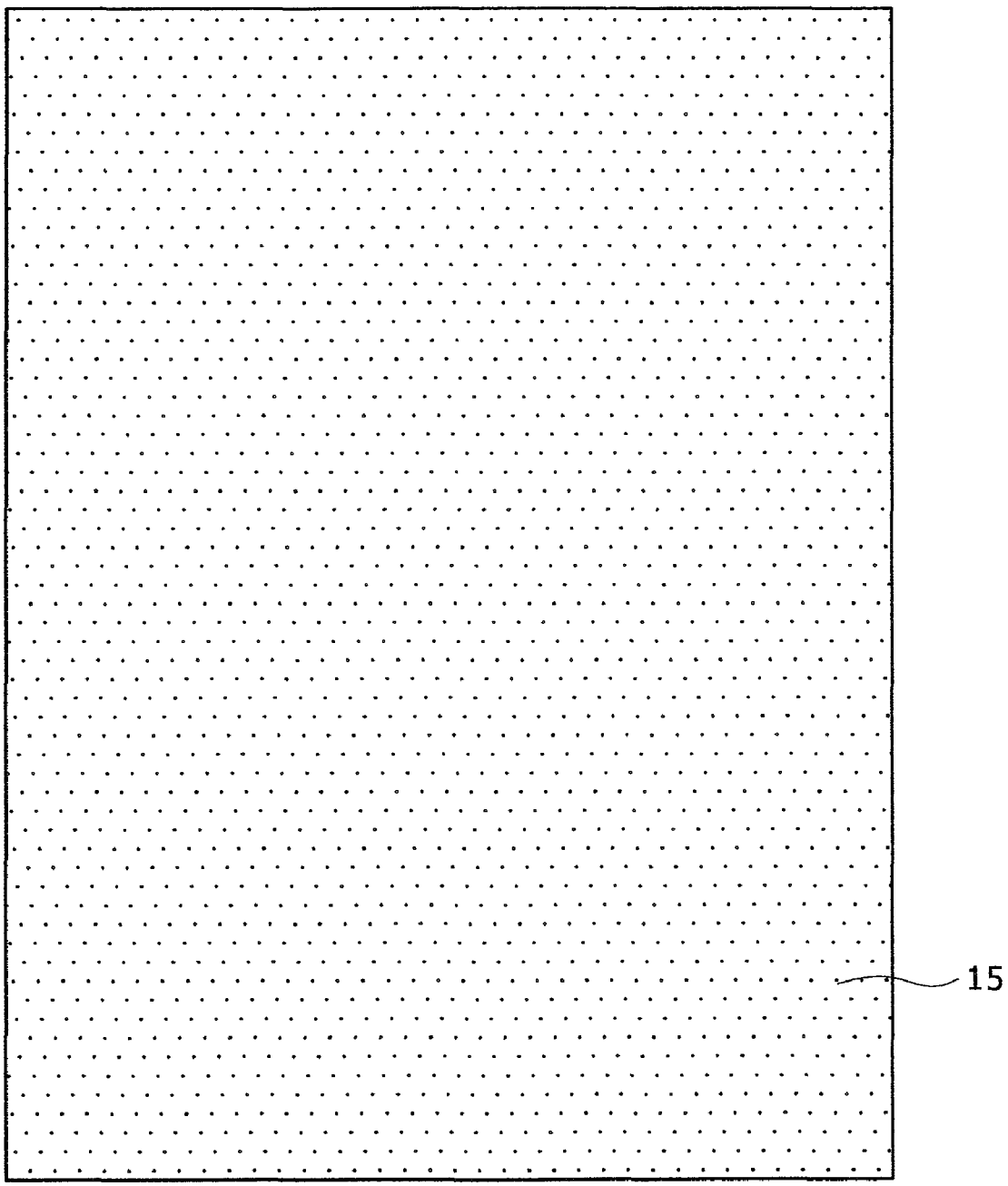
FIG. 2N is a top view illustrating a manufacturing process sequence of a silicon laser according to a first embodiment of the present invention.
Figure 20:
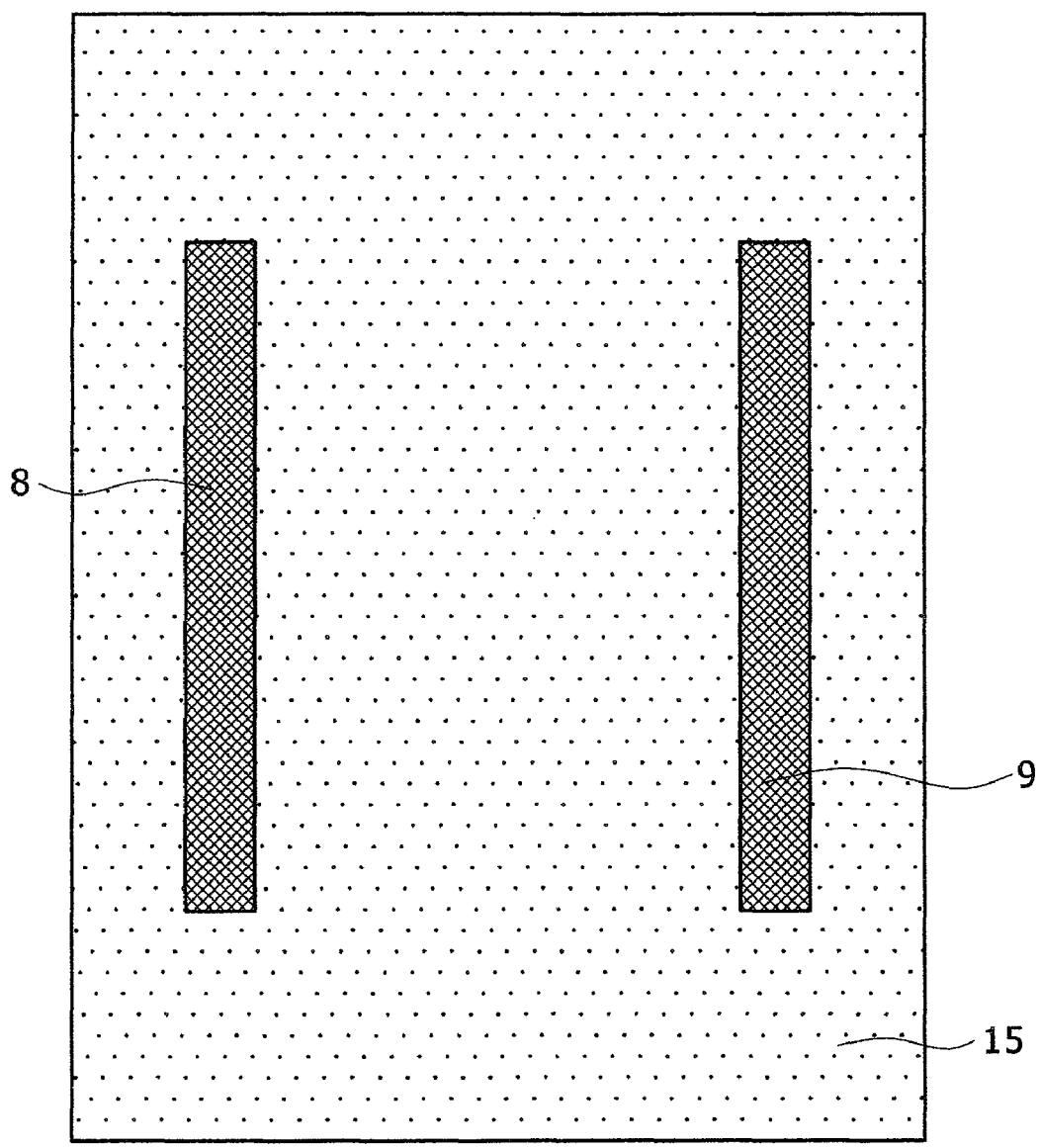

The silicon dioxide 15 is deposited on the entire surface of the substrate in 1 µm by using a CVD apparatus as shown in FIGS. 1N and 2N. As described above, the space between the islands of the nitride silicon 14 is filled with the silicon dioxide 15. In a CVD process, the silicon dioxide 15 is deposited on an upper surface and a side surface of a structure having irregularities, the silicon dioxide 15 is more deposited on a straight line connecting the islands of the nitride silicon 14 to each other. As a result, a structure serving as the waveguide and the mirror, in which the nitride silicon 14 and the silicon dioxide 15 are alternately disposed by a ¼ wavelength interval is formed. The film thickness of the silicon dioxide 15 is set to maintain mechanical strength by local etching of the silicon substrate 1 to be performed in a later process. In a case when the film thickness of the BOX 2 is set to 1 µm or more, the film thickness of the silicon dioxide 15 may be thinned to hundreds of nms.

After the resist remains only in the predetermined region by the resist patterning using the photolithography, an opening portion 16 is formed in a part of the silicon dioxide 15 by wet etching using the fluorinated acid as shown in FIGS. 1O and 2O.

Figure 2P:
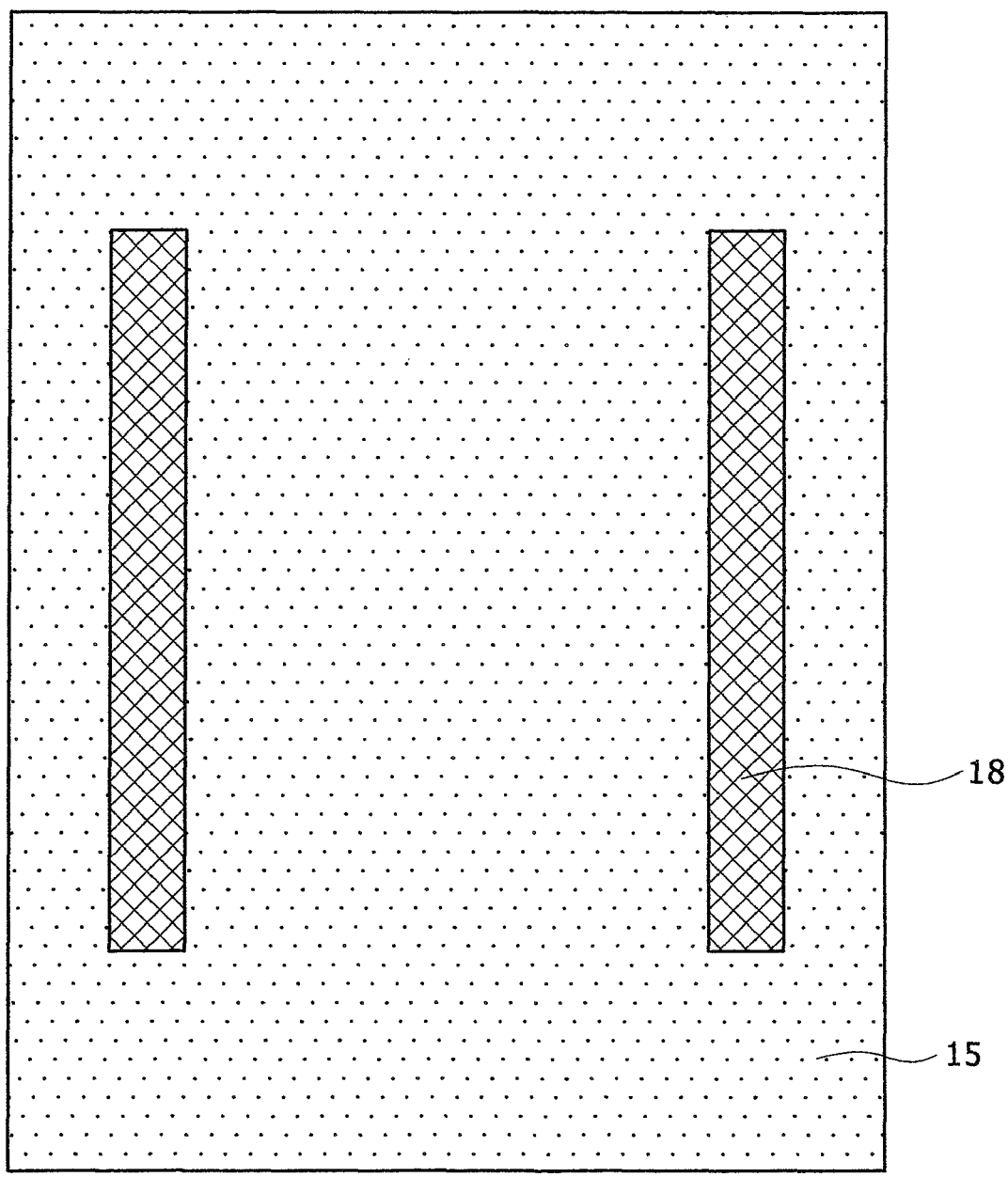
FIG. 2P is a top view illustrating a manufacturing process sequence of a silicon laser according to a first embodiment of the present invention.

After TiN and Al are deposited on an entire surface, the resist remains only in the predetermined region by the resist patterning using the photolithography. Thereafter, Al is wet-etched by using an etching solution containing a phosphoric acid, acetate acid, and a nitric acid, and Tin is wet-etched by using an etching solution containing ammonia and hydrogen peroxide. As a result, a Tin electrode 17 and the Al electrode 18 are patterned and are processed as shown in FIGS. 1P and 2P. Then, the hydrogen annealing is performed at a temperature of 400° C. and defects generated in the process are hydrogen-terminated.

As described above, when the film thickness of the BOX 2 is 1 µm or more, a device forming process is completed. As described in the embodiment, in a case when the film thickness of the BOX 2 is equal to or less than 1 µm, a process of locally removing the support silicon substrate 1 is performed.

Figure 2Q:
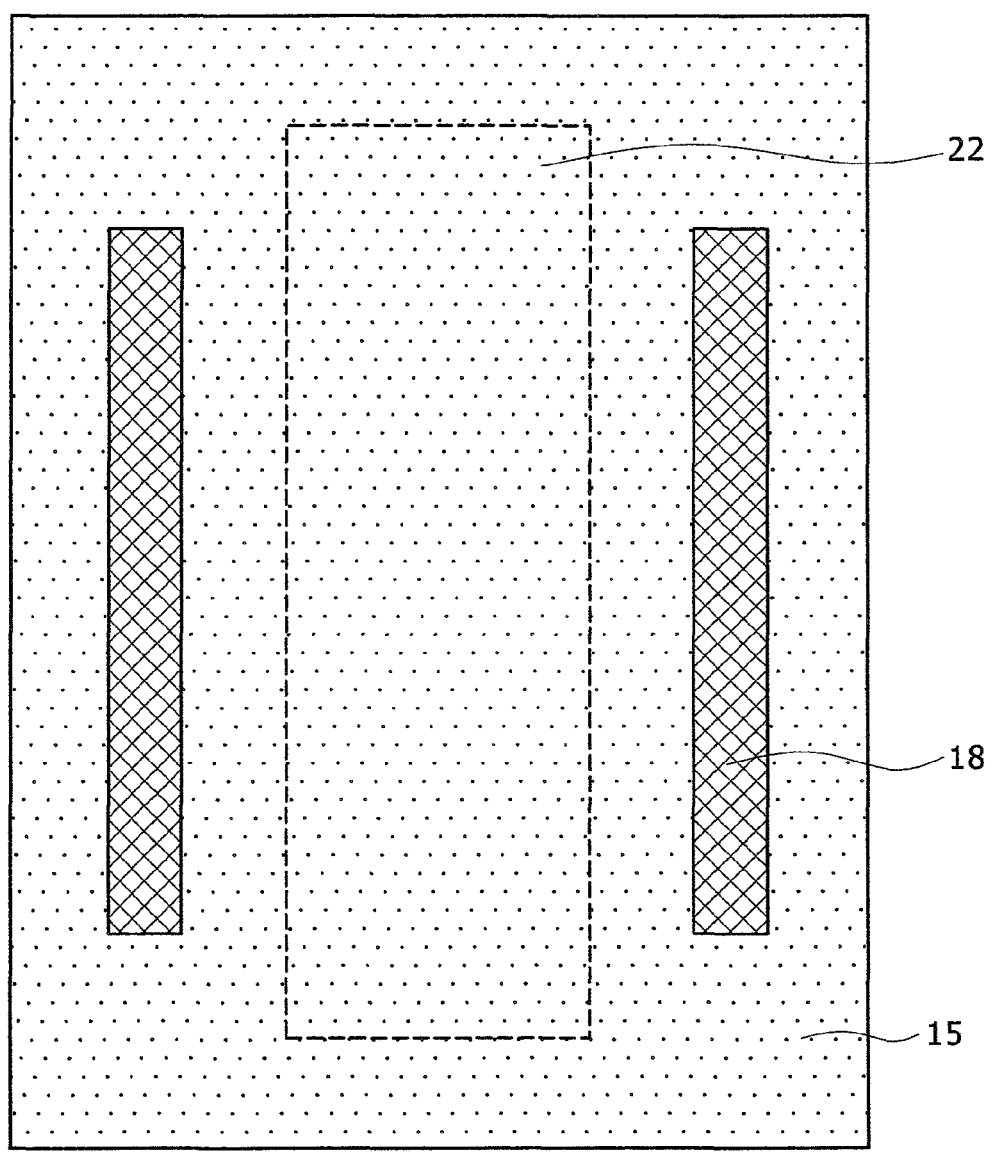
FIG. 2Q is a top view illustrating a manufacturing process sequence of a silicon laser according to a first embodiment of the present invention.
Figure 2R:
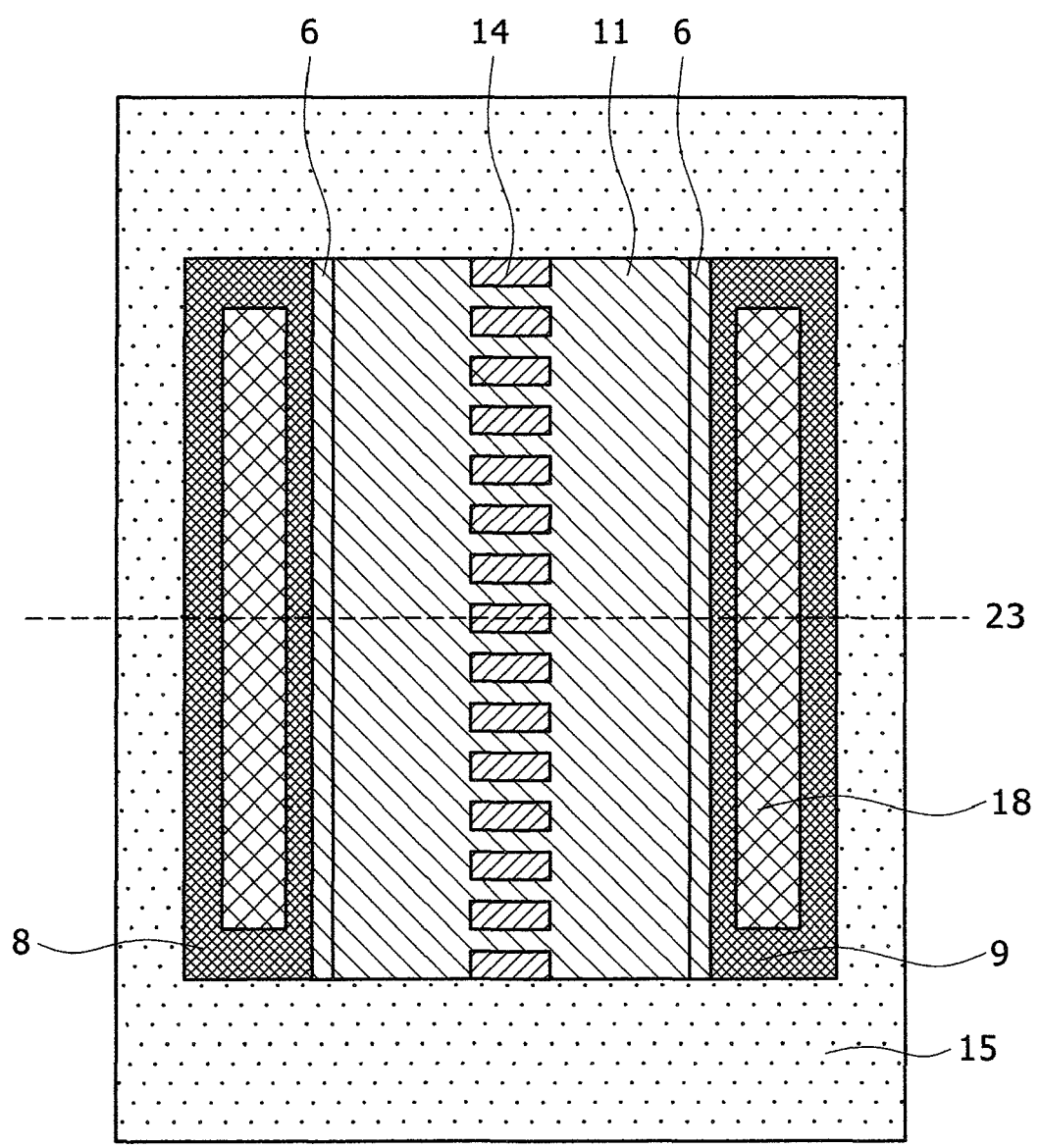
FIG. 2R is a completed top view of a silicon laser according to a first embodiment of the present invention.

Herein, first, after a protective film (not shown) made of an organic material is applied onto the surface of the support silicon substrate 1, the resist remains only in the predetermined region by the resist patterning using the photolithography with respect of the rear surface of the silicon substrate 1 and the nitride silicon 14 is patterned by the anisotropic etching using the dry etching. At this time, in order to locally remove the silicon substrate 1 existing just beneath the nitride silicon 14, alignment with the pattern of the surface of the silicon substrate 1 is performed and the rear surface of the silicon substrate 1 is processed by the photolithography. Such a processing is a general method used to fabricate micro electro mechanical systems (MEMS). Thereafter, after an opening portion 19 is formed in a desired part of the silicon substrate 1 by anisotropic etching using an alkaline etching solution, the above-mentioned organic protective film (not shown) is removed by organically cleansing the surface of the silicon substrate 1 using acetone and methanol as shown in FIGS. 1Q and 2Q. The position of a rear opening portion 22 is also shown in FIG. 2Q.

Instead of removing a part of the support substrate by using the anisotropic wet etching as described in the embodiment, an annealing in a hydrogen atmosphere which is the related art for forming a silicon-on-nothing substrate or an ion injection process may be used and a support silicon substrate may be partially removed.

A silicon laser device is completed by depositing a dielectric 20 and a cooling electrode 21 on an entire surface of the rear surface as shown in FIGS. 1R and 2R. In the embodiment, silicon oxide having a thickness of 1 μm is used as a material of the dielectric 20, but other dielectric materials such as nitride silicon, aluminium nitride, alumina, hafnium, and the like may be used as the material of the dielectric 20. In particular, when the aluminium nitride is used, it is possible to reduce loss of the light from the dielectric 20 and emit heat radiated from the emitting light. Further, in the embodiment, aluminium is used as the cooling electrode 21. Herein, in FIG. 2Q, the thin silicon 6, the heat oxidization film 7, the p-type Si electrode 8, the n-type Si electrode 9, the ultrathin silicon 11, and the nitride silicon 14 are originally disposed below the silicon dioxide 15, and do not exist on the surface, but are shown so as to comprehend the completed drawing. Further, a rear opening portion 32 is also shown in FIG. 2Q.

In fabricating an optical integrated circuit, a desired wiring process is performed and a process of connecting a silicon laser device fabricated with a CMOS integrated circuit formed on the same substrate may be performed. In fabricating the CMOS integrated circuit, the CMOS integrated circuit may be fabricated in advance before fabricating the silicon laser device disclosed in the embodiment. Contrary to this, the COMS integrated circuit may be fabricated after fabricating the silicon laser device. The wiring process disclosed in the embodiment may be performed at the same time as the wiring process of the CMOS integrated circuit. In fabricating the integrated circuit, a fabrication process sequence may be variously changed.

The fabricated silicon laser device oscillates at approximately 850 nm which is the designed wavelength and is a single mode according to spectrum analysis. This purpose is to allow the Si laser device according to the present invention to have a distributed feed-back structure and to selectively enhance a wavelength determined from a periodic structure of the mirror. In order to further secure a single-mode characteristic, a waveguide structure of the nitride silicon 14 is optimized to allow the phase of light to be shifted only by ¼ wavelength in the vicinity of the center. Since a laser beam is irradiated in a horizontal direction to the silicon substrate 1, the silicon laser device is proven to be suitable for a usage of optical wiring, etc. on an on-chip. When a local stress measurement mapping operation is performed for the fabricated device, it is clarified that the stress is spatially and evenly distributed without being concentrated on any one end portion by changing the film thickness of the silicon in a stepwise shape in the horizontal direction to the silicon substrate 1. It is possible to reduce an external resistance of the device by forming a thin silicon having a bit large film thickness in the vicinity of the ultrathin silicon 11 serving as the light emitting unit.

Second Embodiment

In this embodiment, a silicon laser having a mirror structure and using a distributed Bragg reflector (hereinafter, referred to as 'DBR') and a manufacturing method thereof will be disclosed.

FIGS. 1A to 1G and FIGS. 3H to 3M show cross-sectional structures for each manufacturing process sequence. FIGS. 2A to 2G(2) and FIGS. 4H to 4M are schematic views of a manufacturing process from an upper part of a substrate. Herein, FIGS. 1A to 1G and FIGS. 3H to 3M are horizontal cross-sectional views of FIGS. 2A to 2G(2) and FIGS. 4H to 4M. For example, FIG. 3M shows a structure taken along a cross sectional 33 in FIG. 4M. In the embodiment, a completed drawing of a device is shown in FIGS. 3M and 4M.

First, after thin silicon 6 is formed by fabricating the device according to a manufacturing process sequence shown in FIGS. 1A and 1G and FIGS. 2A and 2G(2) by the same manufacturing process as the first embodiment, a p-type Si electrode 8 and an n-type Si electrode 9 are formed by injecting impurities and performing activation heat treatment as shown in FIGS. 1G and 2G(2).

Figure 3H:
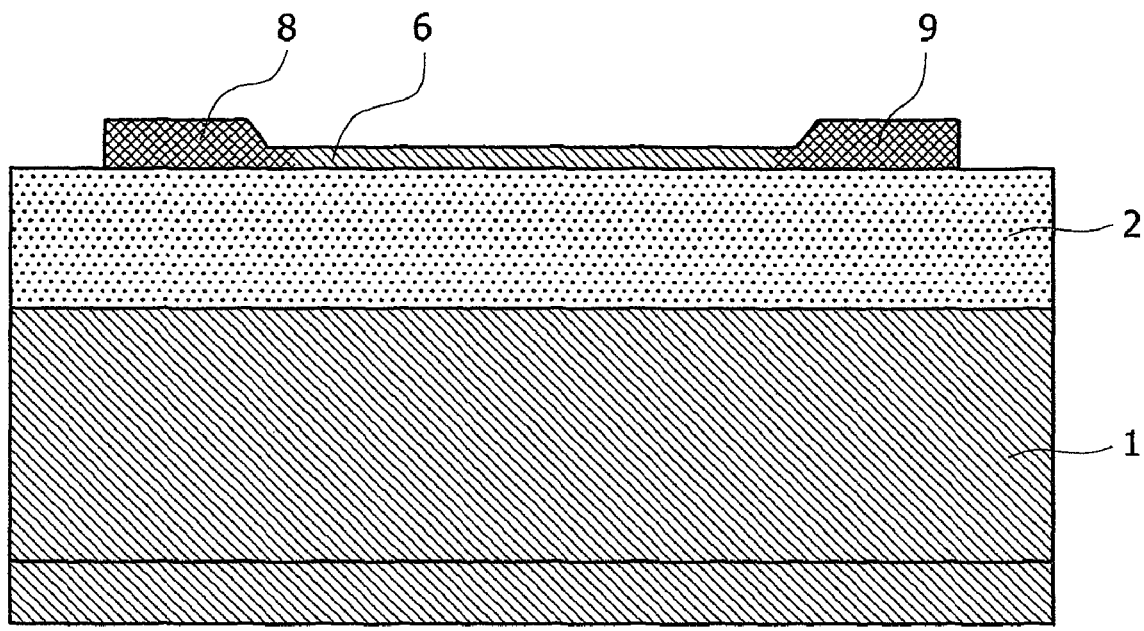
FIG. 3H is a cross-sectional view illustrating a manufacturing process sequence of a silicon laser according to a second embodiment of the present invention.
Figure 4H:
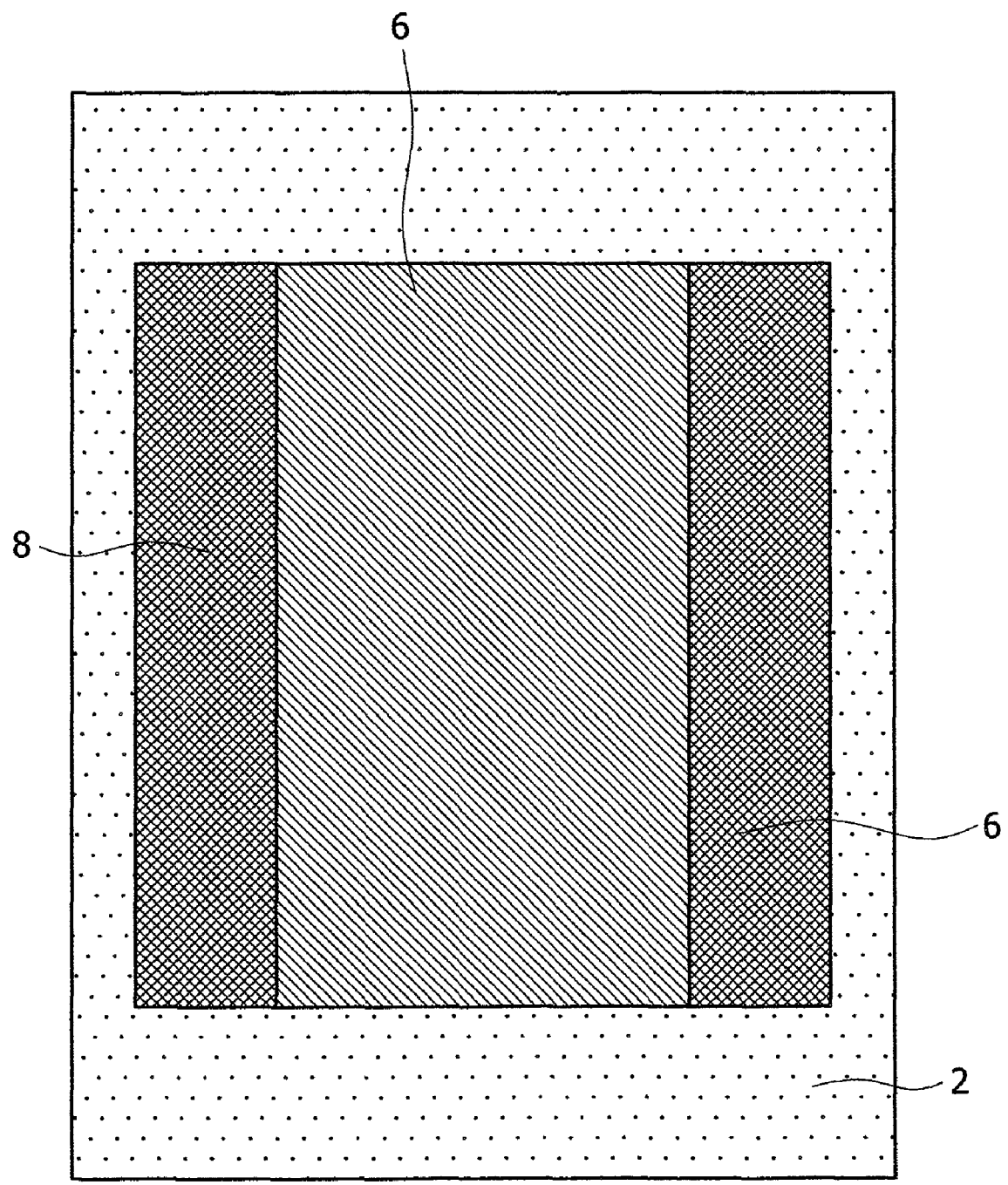
FIG. 4H is a top view illustrating a manufacturing process sequence of a silicon laser according to a second embodiment of the present invention.

Next, a thermally oxidized film 7 and a silicon dioxide 4 on a surface is removed by a cleansing process and wet etching using a fluorinated acid as shown in FIGS. 3H and 4H. Since a stress applied to the thin silicon 6 may be released by removing the thermally oxidized film 7 on the surface, it is possible to prevent the device from being broken due to distortion.

Figure 3I:
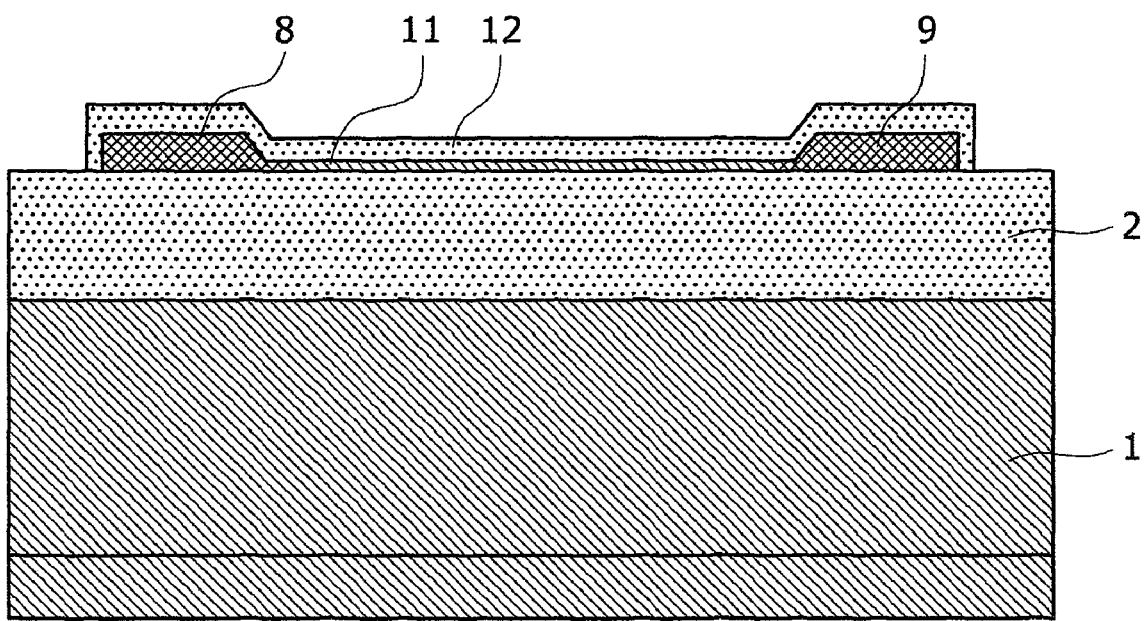
FIG. 3I is a cross-sectional view illustrating a manufacturing process sequence of a silicon laser according to a second embodiment of the present invention.
Figure 4I:
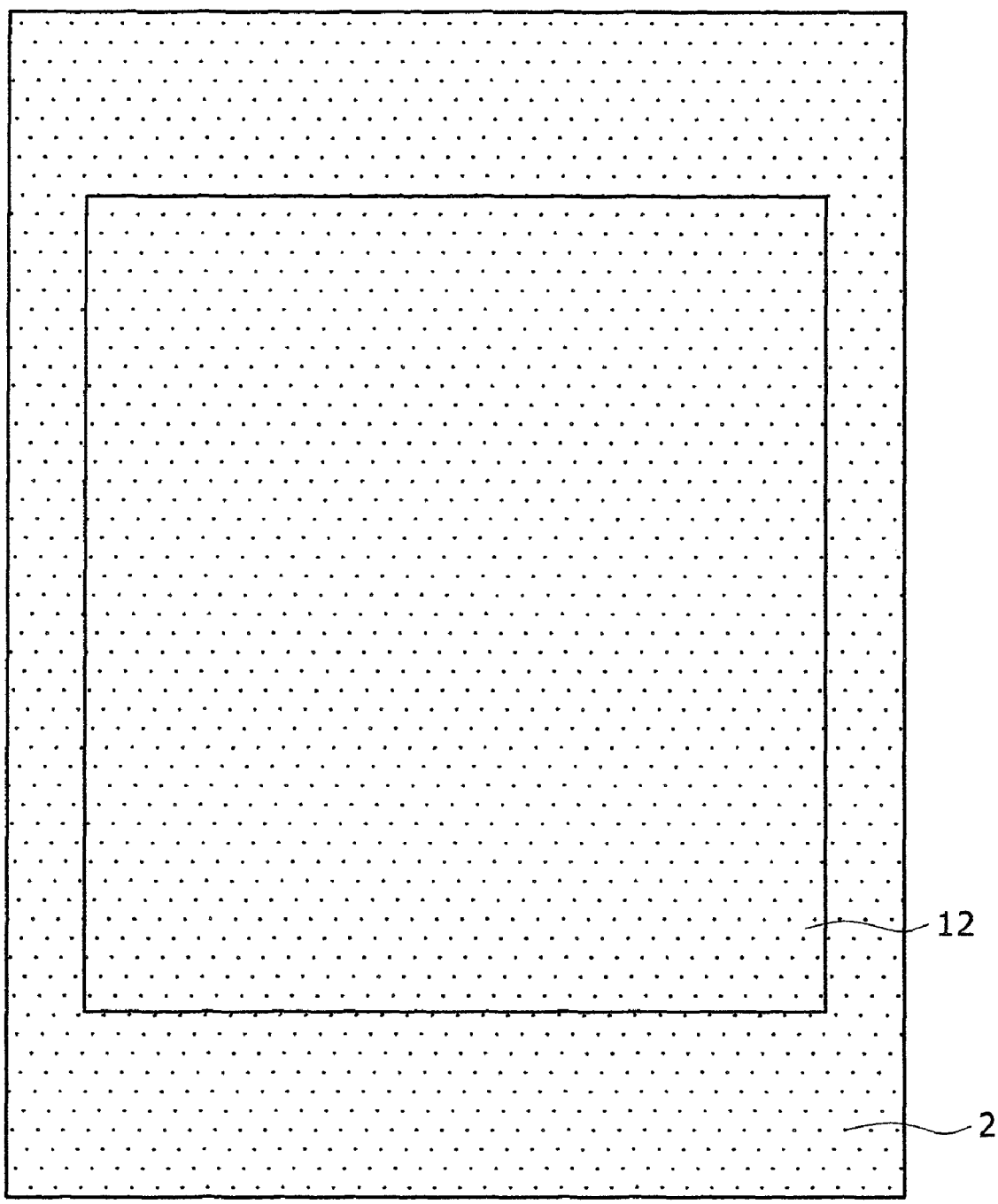
FIG. 4I is a top view illustrating a manufacturing process sequence of a silicon laser according to a second embodiment of the present invention.

Subsequently, an ultrathin silicon 11 acquired by thinning the thin silicon 6 is formed by performing an oxidation process and the thermally oxidized film 12 is formed on the surface as shown in FIGS. 3I and 4I. An oxidation time and an oxidation temperature are adjusted so that a film thickness of the ultrathin silicon 11 is 2.0 nm. The film thickness of the thermally oxidized film 12 is 16.0 nm.

Figure 3J:
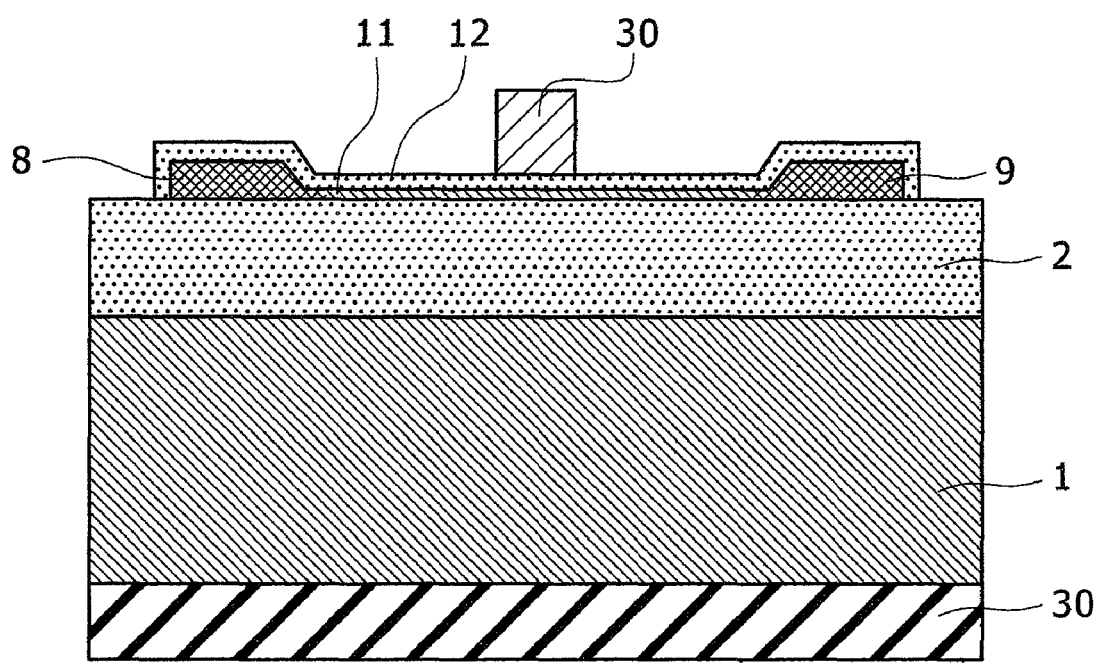
FIG. 3J is a cross-sectional view illustrating a manufacturing process sequence of a silicon laser according to a second embodiment of the present invention.
Figure 4J:
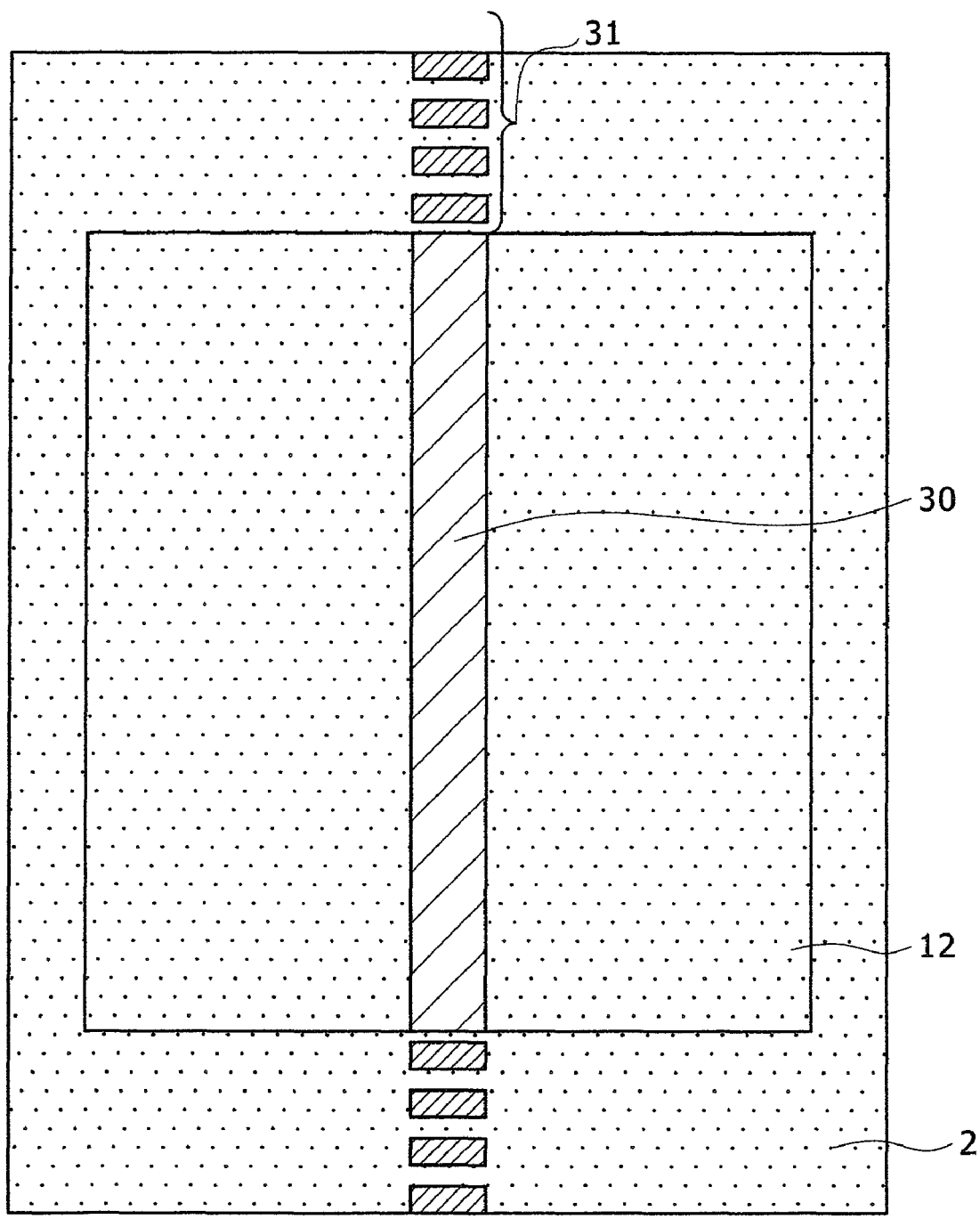
FIG. 4J is a top view illustrating a manufacturing process sequence of a silicon laser according to a second embodiment of the present invention.

After nitride silicon is deposited on the entire surface, a waveguide 30 and a distributed Bragg reflector (DBR) mirror 31 are formed by remaining a resist only in a predetermined region by resist patterning using photolithography and patterning the nitride silicon by using anisotropic dry etching as shown in FIGS. 3J and 4J. Herein, as shown in FIG. 4J, the DBR mirror 31 is patterned in an island shape as viewed from an upper part. Light is emitted on the waveguide 30, but since the light is reflected on the DBR mirror 31 disposed on a cross section, the waveguide 30 and the DBR mirror 31 function as an optical resonator. The width of the nitride silicon in the DBR mirror 31 is designed to be approximately ¼ of a wavelength of the light in the nitride silicon.

A spacing gap between the islands of the nitride silicon is designed to be ¼ of a wavelength of the light in the silicon dioxide 14 to be deposited later. More specifically, since an emission wavelength is assumed to be 850 nm and an effective refractive index in the waveguide of the nitride silicon is estimated to be approximately 1.78, the width of the island is 119 nm. Since the effective refractive index of the waveguide in a part buried under the silicon dioxide 15 is estimated to be approximately 1.41, the spacing gap between the islands of the nitride silicon is 151 nm when the emission wavelength 850 nm. The width in a waveguiding direction and a vertical direction on the island from the nitride silicon is 1 µm. In FIG. 2M, only several islands composed of the nitride silicon are shown for brevity, but 100 islands are practically formed. The length of the waveguide 30 which is a resonant length is 500 µm and a width is 1 µm.

Figure 3K:
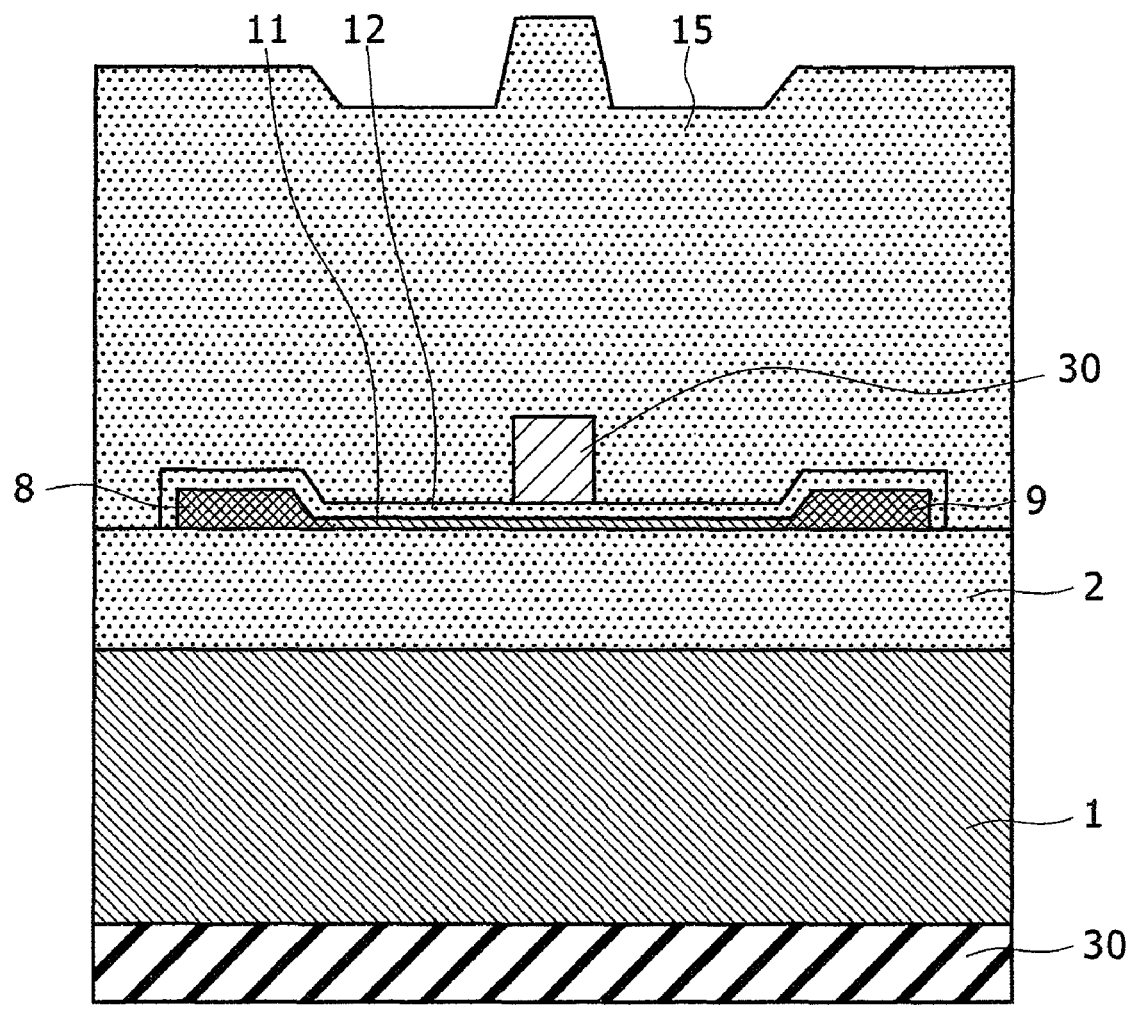
FIG. 3K is a cross-sectional view illustrating a manufacturing process sequence of a silicon laser according to a second embodiment of the present invention.
Figure 4K:
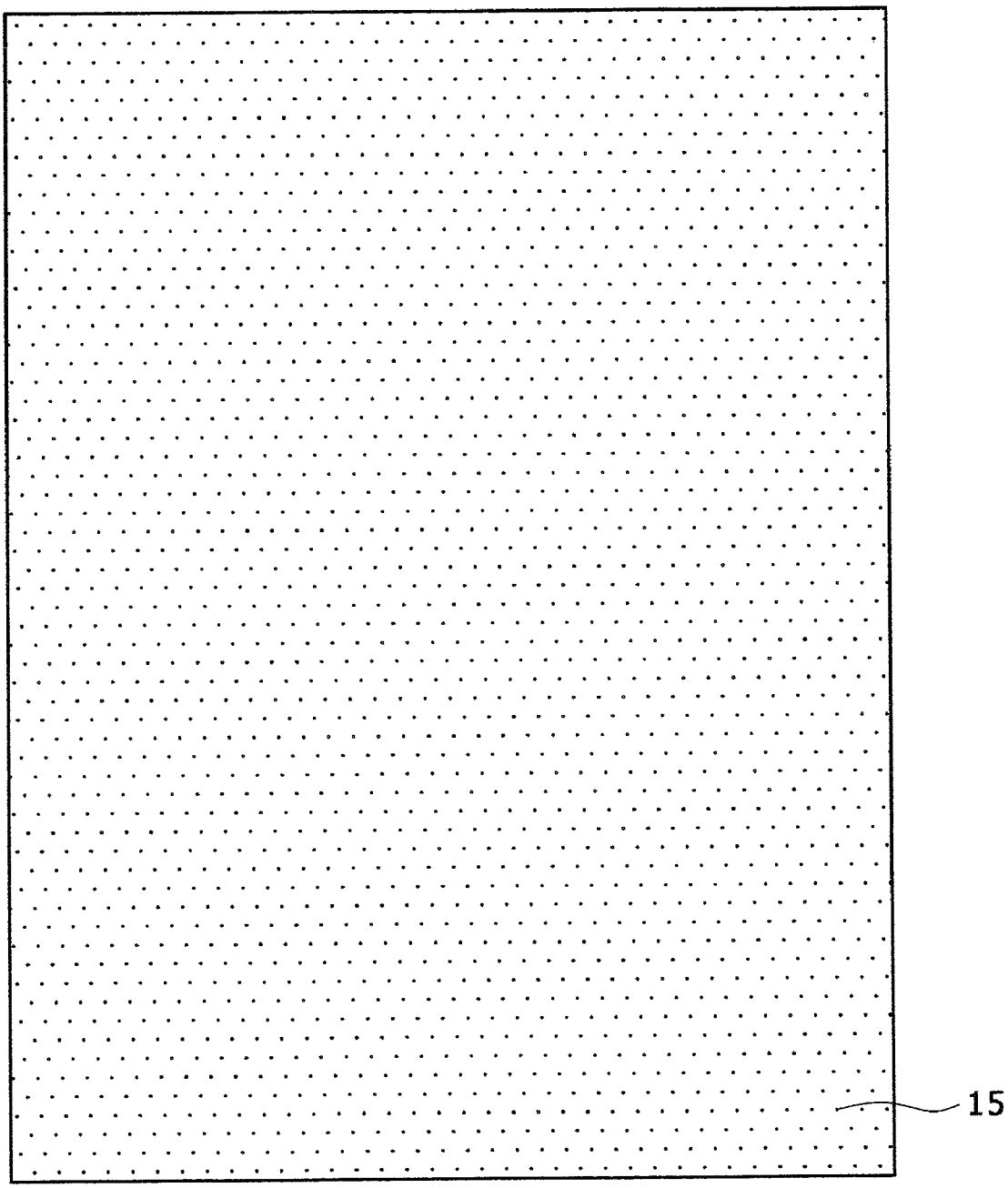
FIG. 4K is a top view illustrating a manufacturing process sequence of a silicon laser according to a second embodiment of the present invention.

The silicon dioxide 15 is deposited on the entire surface of the substrate with a thickness of 1 µm by using a CVD apparatus as shown in FIGS. 3K and 4K. As described above, the space between the islands of the nitride silicon in the DBR mirror 31 is buried with the silicon dioxide 15.

Figure 3L:
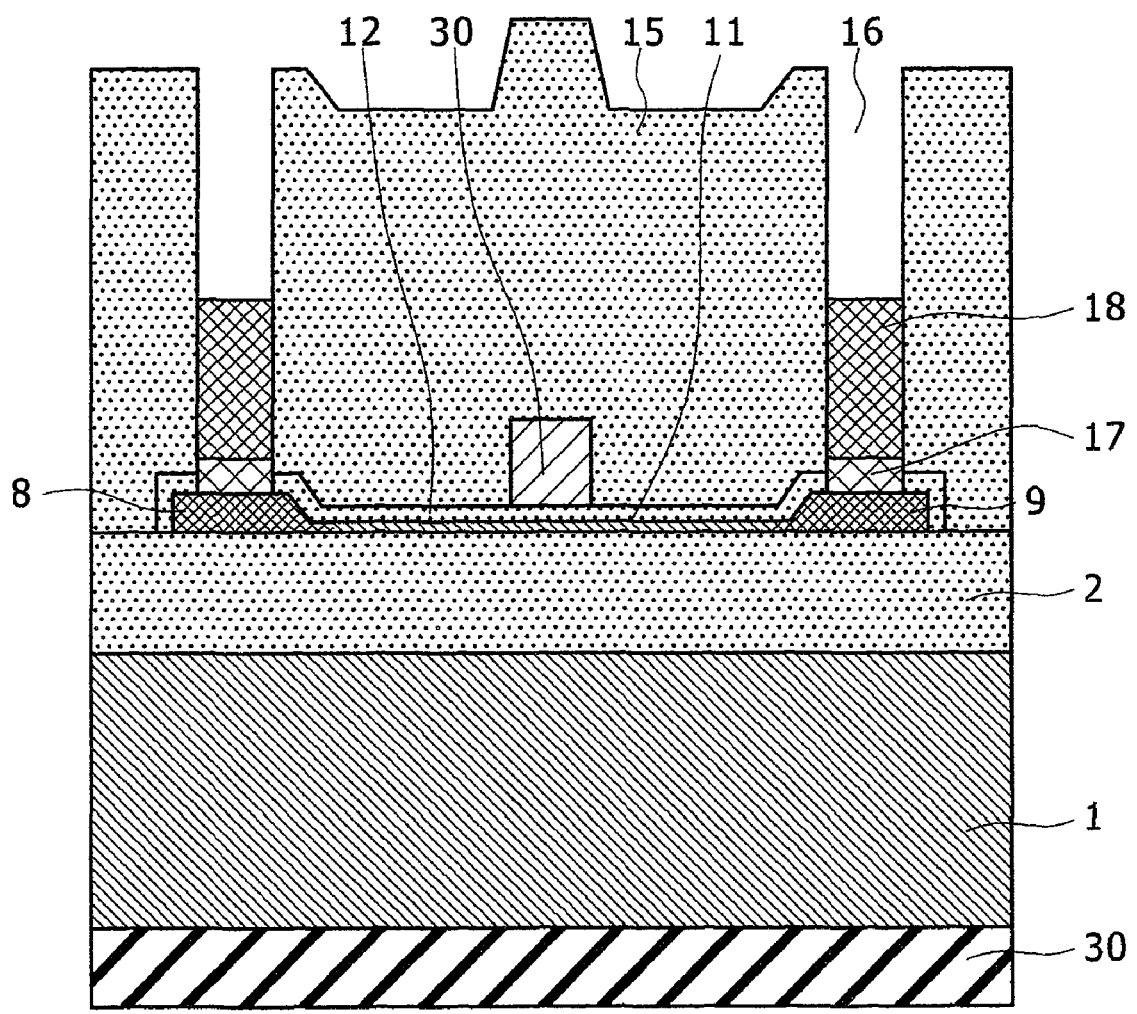
FIG. 3L is a cross-sectional view illustrating a manufacturing process sequence of a silicon laser according to a second embodiment of the present invention.
Figure 3M:
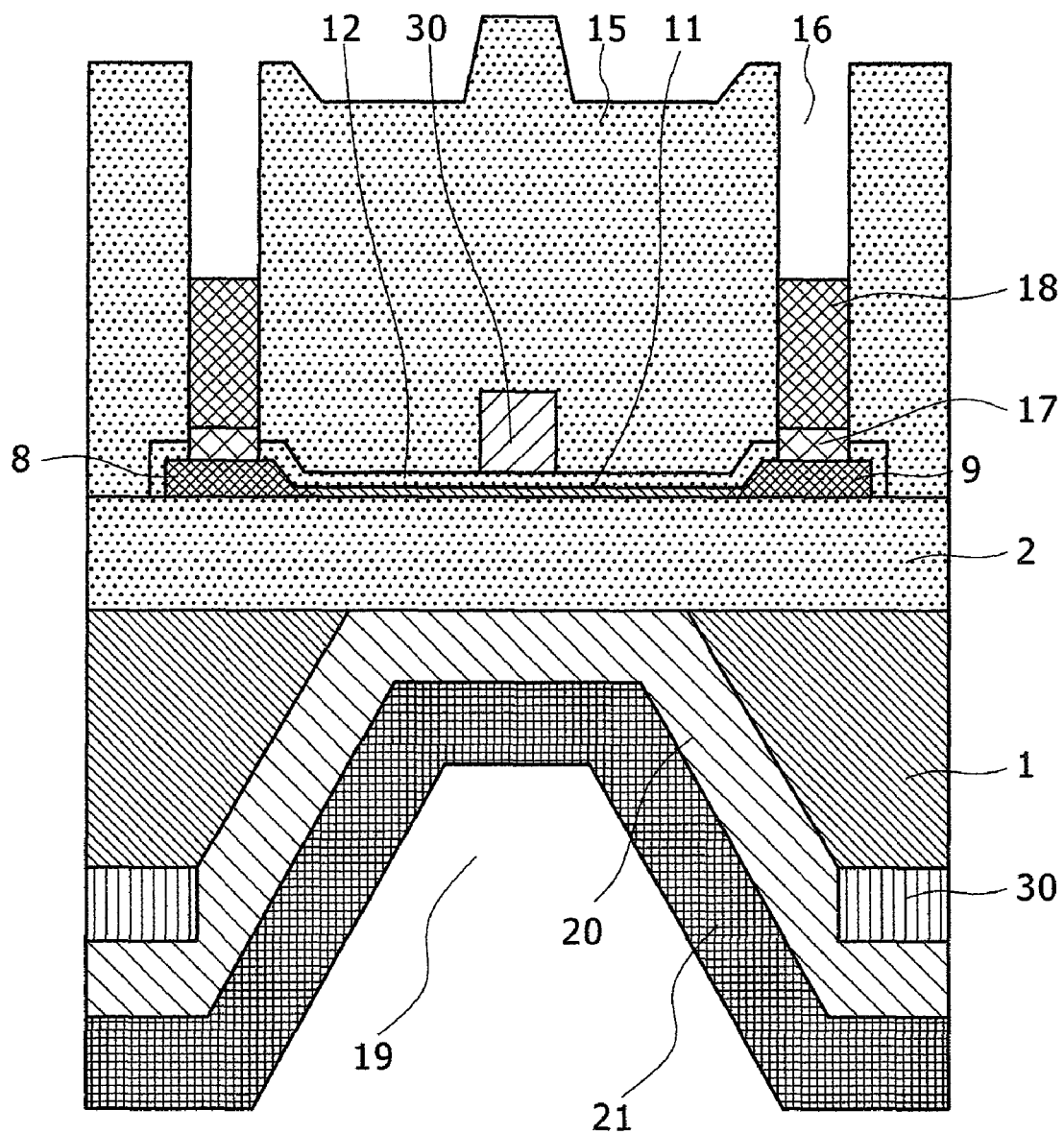
FIG. 3M is a completed cross-sectional view of a silicon laser according to a second embodiment of the present invention.
Figure 4L:
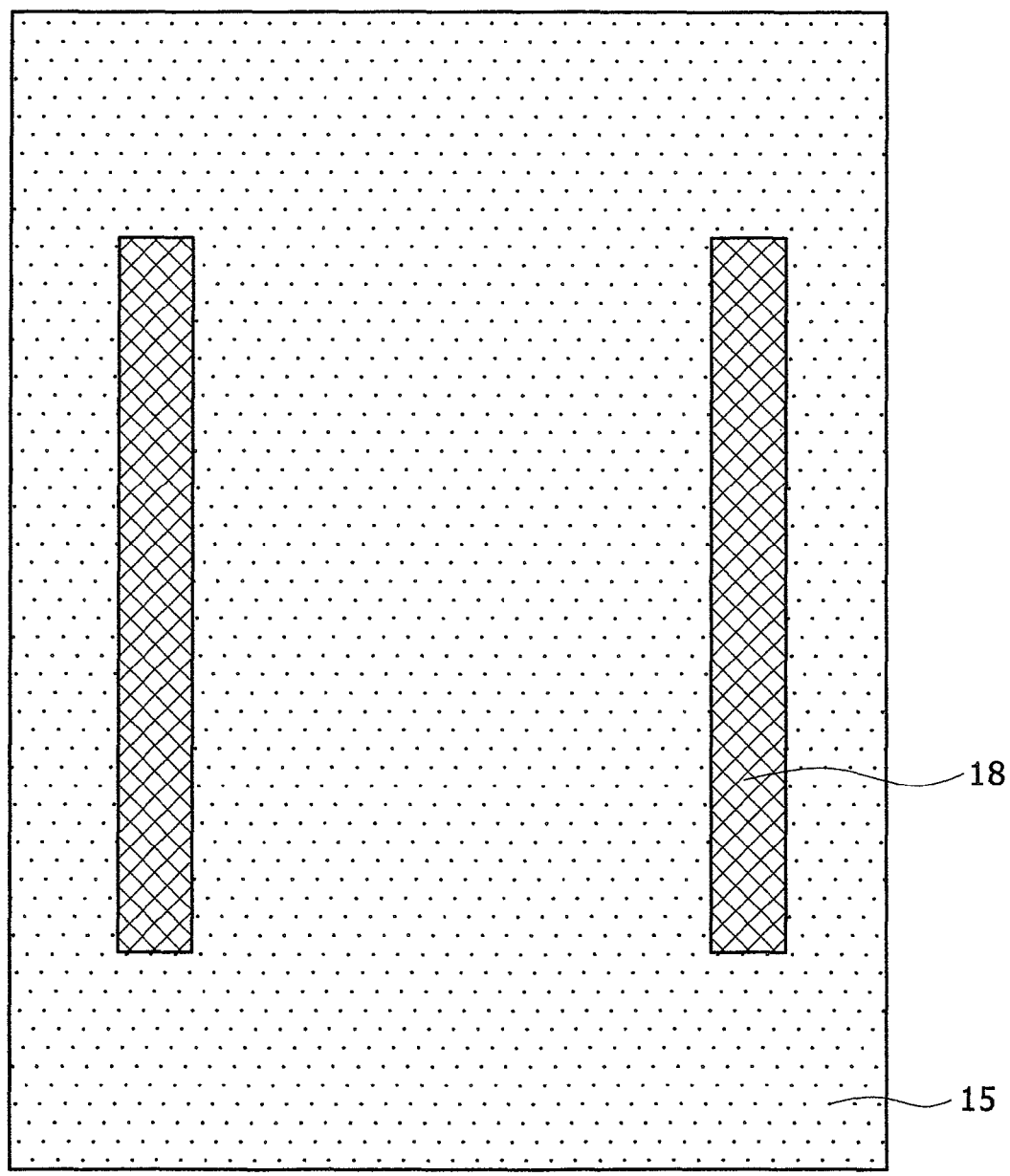
FIG. 4L is a top view illustrating a manufacturing process sequence of a silicon laser according to a second embodiment of the present invention.
Figure 4M:
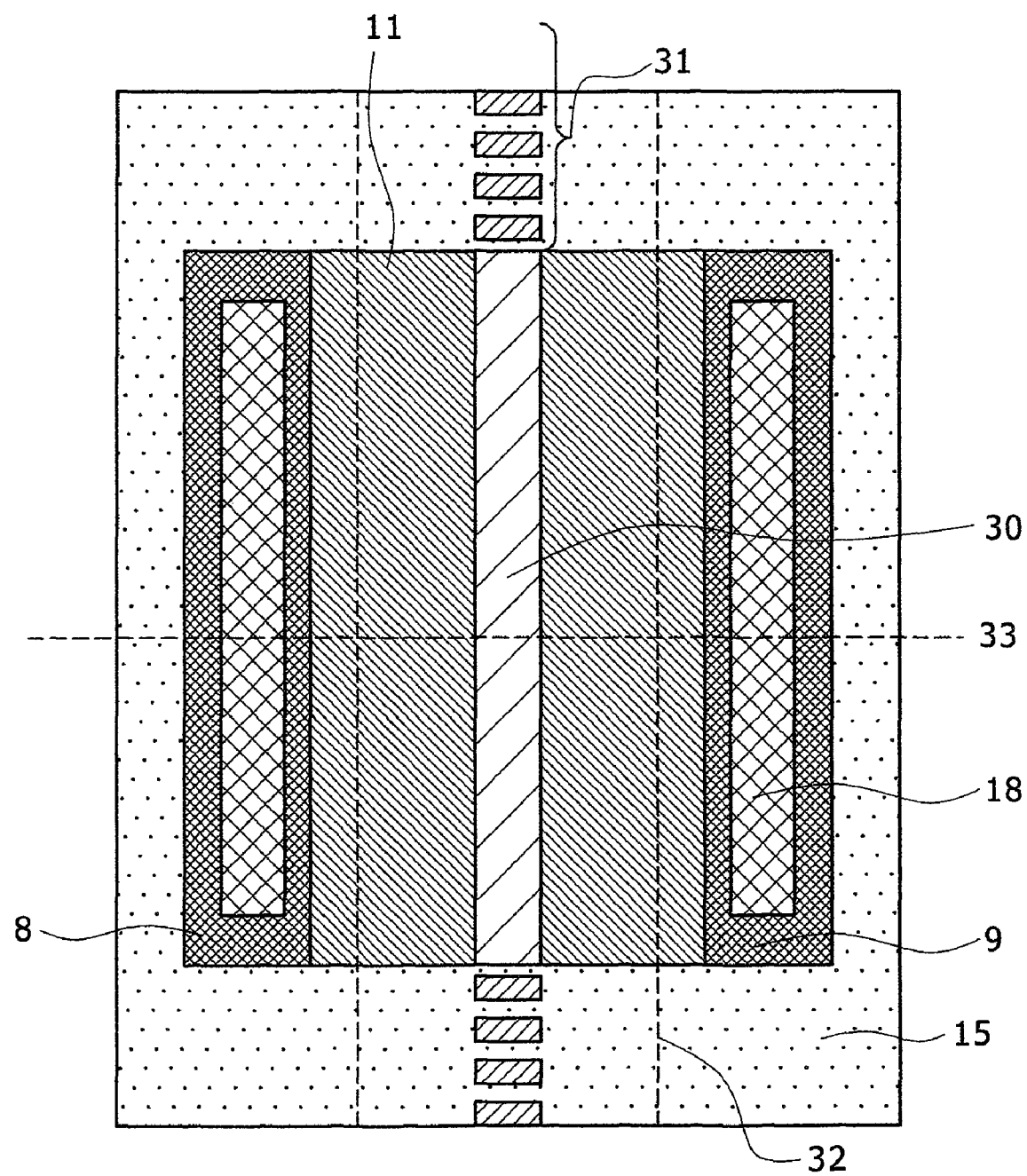
FIG. 4M is a completed top view of a silicon laser according to a second embodiment of the present invention.

After the resist remains only in the predetermined region by the resist patterning using the photolithography, an opening portion 16 is formed in a part of the silicon dioxide 15 by wet etching using the fluorinated acid. After TiN and Al are deposited on an entire surface, the resist remains only in the predetermined region by the resist patterning using the photolithography. Thereafter, Al is wet-etched by using an etching solution containing a phosphoric acid, acetate acid, and a nitric acid, and Tin is wet-etched by using an etching solution containing ammonia and hydrogen peroxide. As a result, a Tin electrode 17 and an Al electrode 18 are patterned and are processed as shown in FIGS. 3L and 4L. Then, the hydrogen annealing is performed at a temperature of 400° C. and defects generated during the process are hydrogen-terminated.

Next, after a protective film (not shown) made of an organic material is applied onto the surface of the support silicon substrate 1, the resist remains only in the predetermined region by the resist patterning using the photolithography with respect of the rear surface of the silicon substrate 1 and the nitride silicon 14 is patterned by the anisotropic etching using the dry etching. At this time, in order to locally remove the silicon substrate 1 existing just beneath the nitride silicon 14, alignment with the pattern of the surface of the silicon substrate 1 is performed and the photolithography is processed on the rear surface of the silicon substrate 1. After an opening portion 19 is formed in a desired part of the silicon substrate 1 by anisotropic etching using an alkaline etching solution, the above-mentioned organic protective film (not shown) is removed by organically cleansing the surface of the silicon substrate 1 using acetone and methanol. A silicon laser device is completed by depositing a dielectric 20 and a cooling electrode 21 on an entire surface of the rear surface as shown in FIGS. 3M and 4M. In FIG. 4M, a p-type Si electrode 8, an n-type Si electrode 9, the ultrathin silicon 11, the waveguide 30, and the DBR mirror 31 are originally disposed below the silicon dioxide 15, and do not exist on the surface, but are displayed so as to comprehend the completed drawing.

The fabricated silicon laser device oscillates at approximately 850 nm which is the designed wavelength and is a single mode according to spectrum analysis. This purpose is to selectively enhance a wavelength determined from a periodic structure of the DBR mirror. In order to form the DBR mirror by a multilayer film in a vertical direction as shown in FIG. 9M of the fifth embodiment, the pair of the nitride silicon and the silicon dioxide needs to be deposited in approximately dozens to hundreds of pairs, but since a silicon processing technology is originally a planer technology, it is preferable to fabricate the mirror in a planar shape. Actually, as disclosed in the embodiment, it is possible to fabricate a high efficient DBR mirror by simple processes such as the patterning the nitride silicon and then depositing the silicon dioxide.

Third Embodiment

In this embodiment, a DFB type silicon laser and a manufacturing method thereof are disclosed.

Figure 5H:
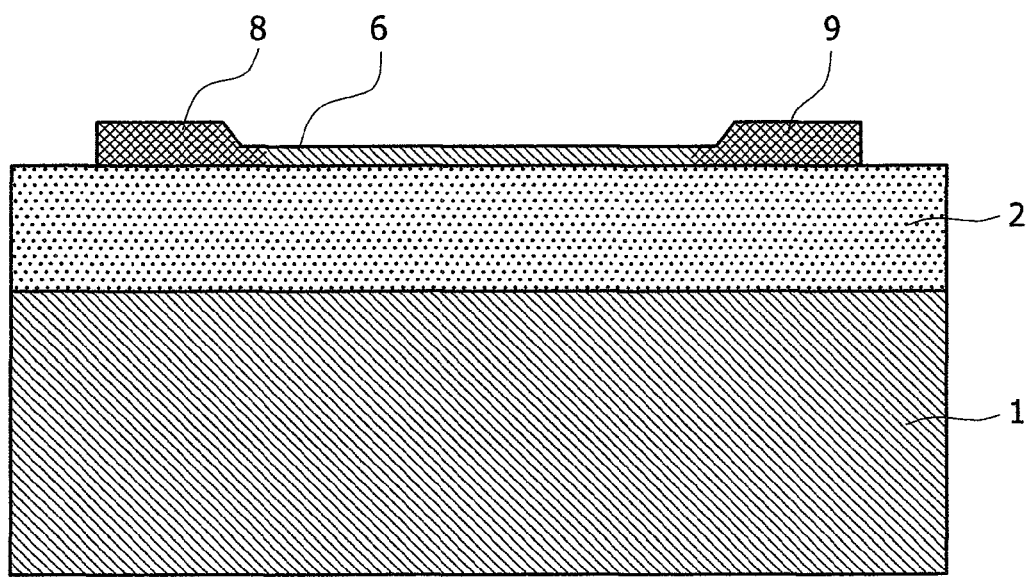
FIG. 5H is a cross-sectional view illustrating a manufacturing process sequence of a silicon laser according to a third embodiment of the present invention.
Figure 5I:
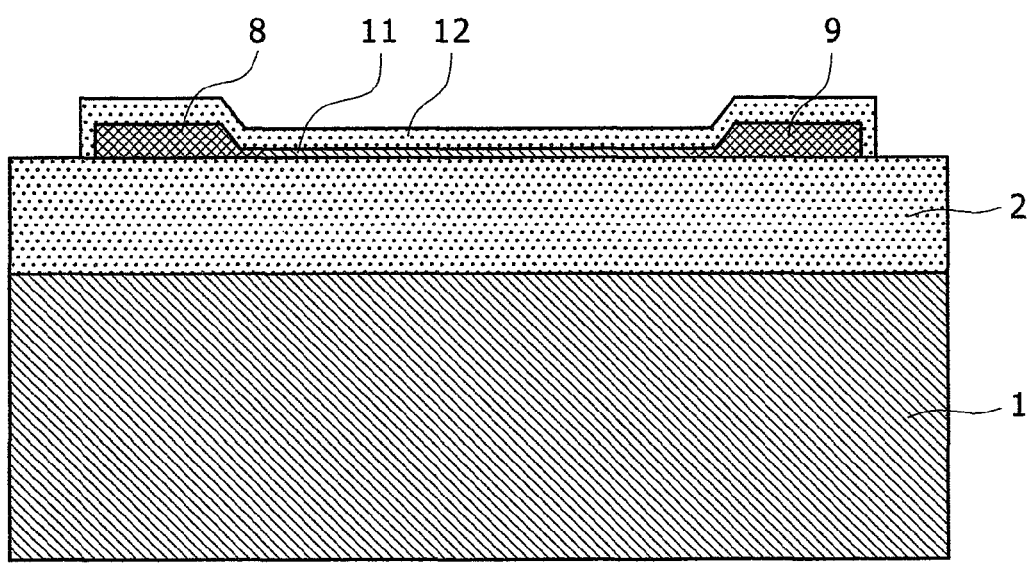
FIG. 5I is a cross-sectional view illustrating a manufacturing process sequence of a silicon laser according to a third embodiment of the present invention.
Figure 5J:
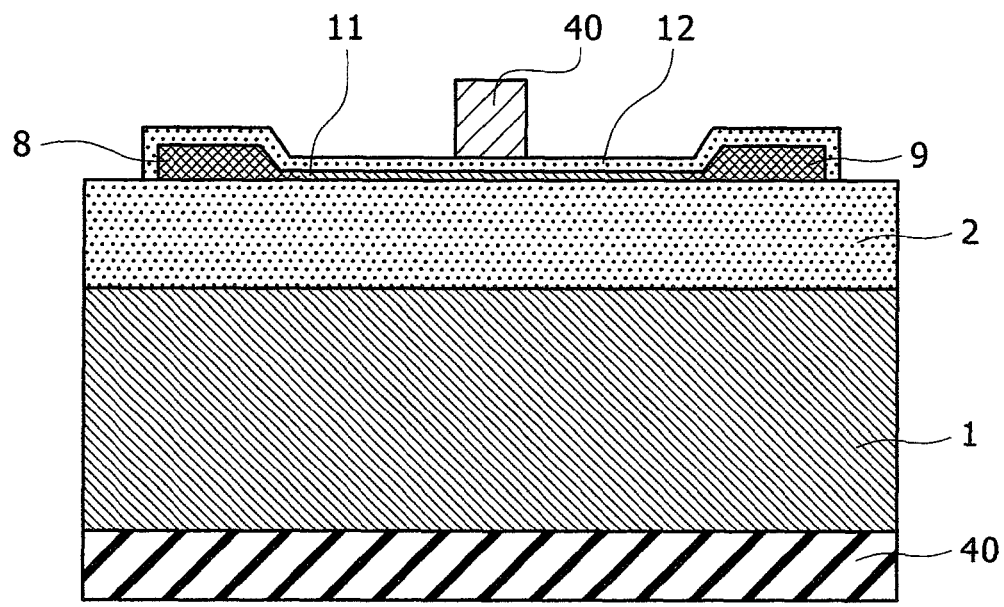
FIG. 5J is a cross-sectional view illustrating a manufacturing process sequence of a silicon laser according to a third embodiment of the present invention.
Figure 5K:
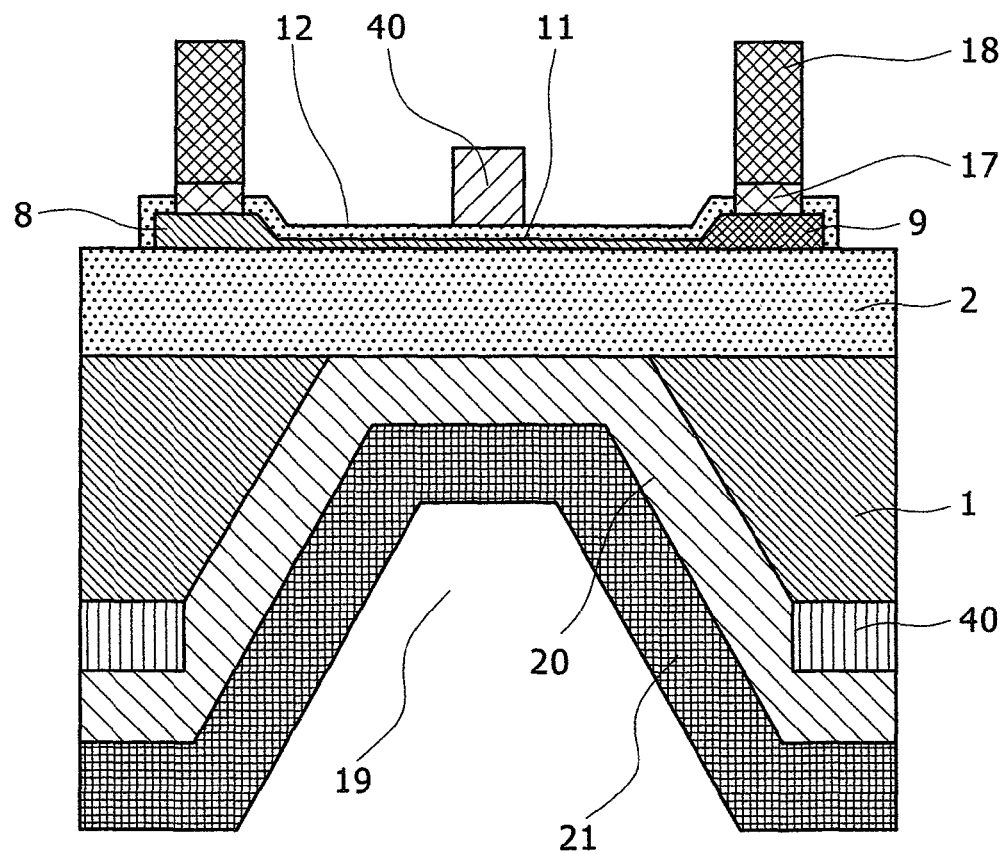
FIG. 5K is a completed cross-sectional view of a silicon laser according to a third embodiment of the present invention.

FIGS. 1A to 1G and FIGS. 5H to 5K show a cross-sectional structure for each manufacturing process sequence. FIGS. 2A to 2G(2) and FIGS. 6H to 6K are schematic views of a manufacturing process from an upper part of a substrate. Herein, FIGS. 1A to 1G and FIGS. 5H to 5K are horizontal cross-sectional views of FIGS. 2A to 2G(2) and FIGS. 6H to 6K. For example, FIG. 5K shows a structure taken along a cross sectional 42 in FIG. 6H. In the embodiment, a completed drawing of a device is shown in FIGS. 3M and 4M.

First, after thin silicon 6 is formed by fabricating the device according to the manufacturing process sequence shown in FIGS. 1A and 1G and FIGS. 2A and 2G(2) by the same manufacturing process as the first embodiment, a p-type Si electrode 8 and an n-type Si electrode 9 are formed by injecting impurities and performing activation heat treatment thereon as shown in FIGS. 1G and 2G(2).

Figure 6H:
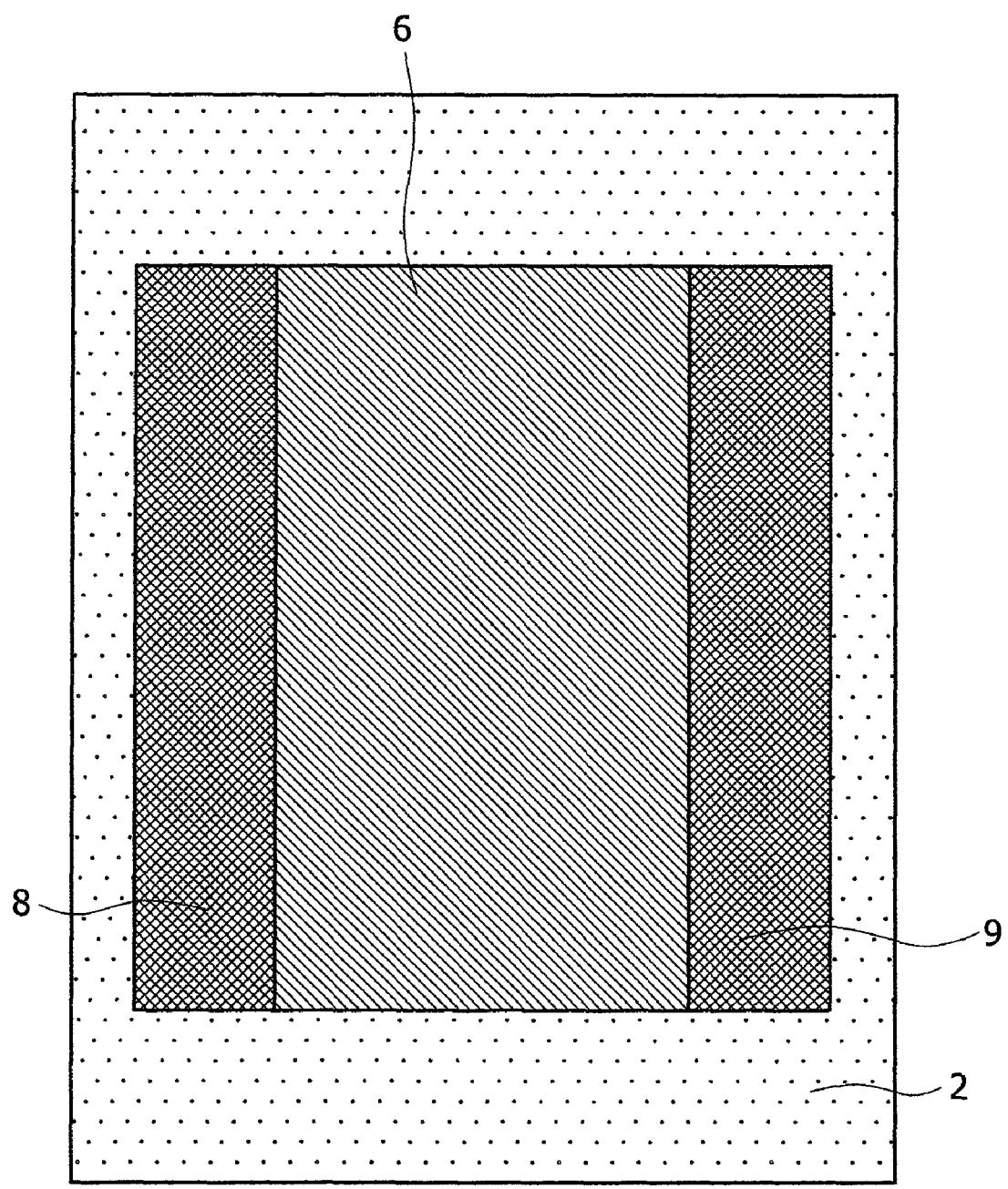
FIG. 6H is a top view illustrating a manufacturing process sequence of a silicon laser according to a third embodiment of the present invention.

Next, a thermally oxidized film 7 and a silicon dioxide 4 on a surface is removed by a cleansing process and wet etching using a fluorinated acid as shown in FIGS. 5H and 6H.

Figure 6I:
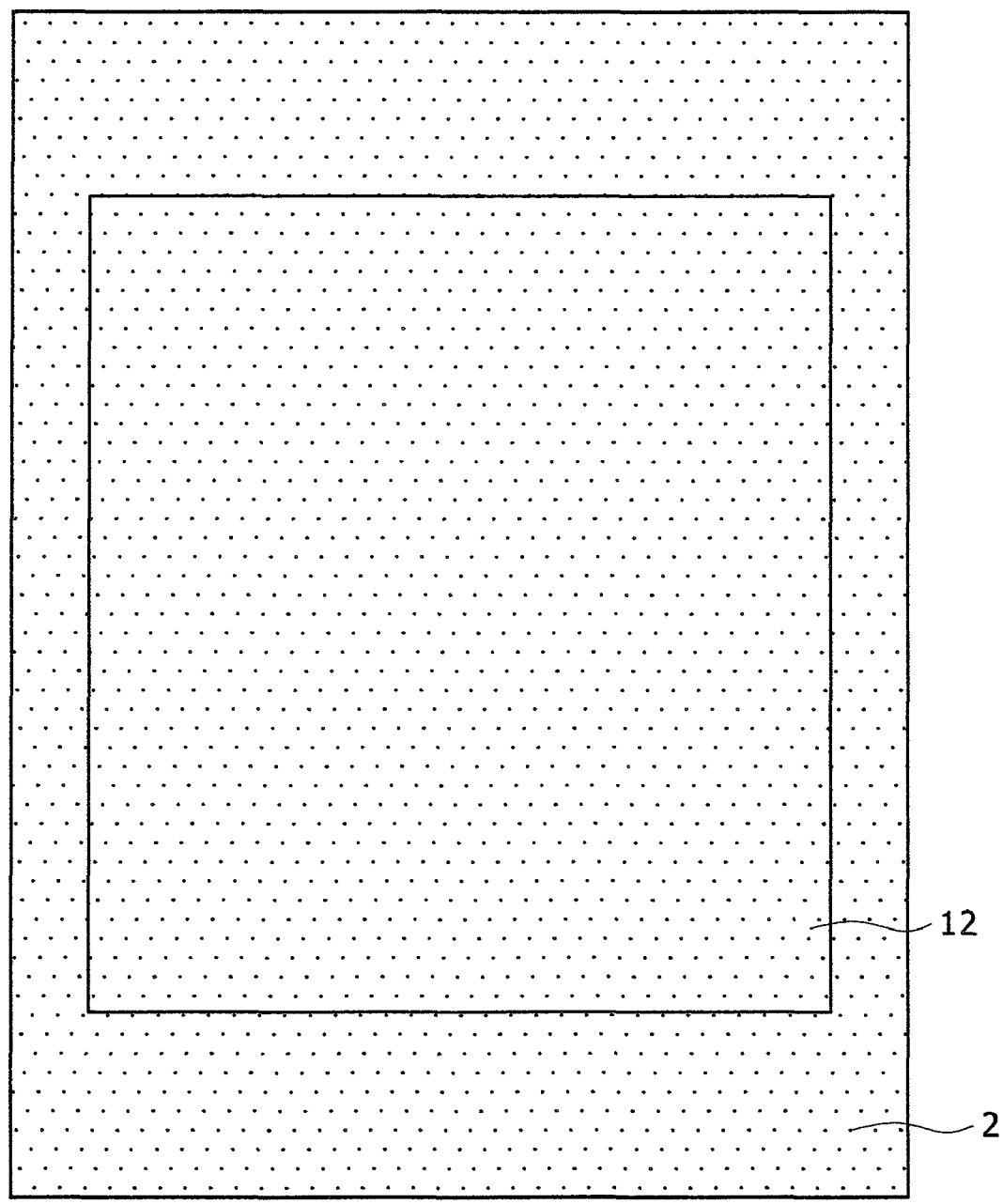
FIG. 6I is a top view illustrating a manufacturing process sequence of a silicon laser according to a third embodiment of the present invention.

Subsequently, an ultrathin silicon 11 acquired by further thinning the thin silicon 6 is formed by performing the oxidation process and then a thermally oxidized film 12 is formed on the surface as shown in FIGS. 5I and 6I. An oxidation time and an oxidation temperature are adjusted so that a film thickness of the ultrathin silicon 11 is 2.0 nm. The film thickness of the thermally oxidized film 12 is 16.0 nm.

Figure 6J:
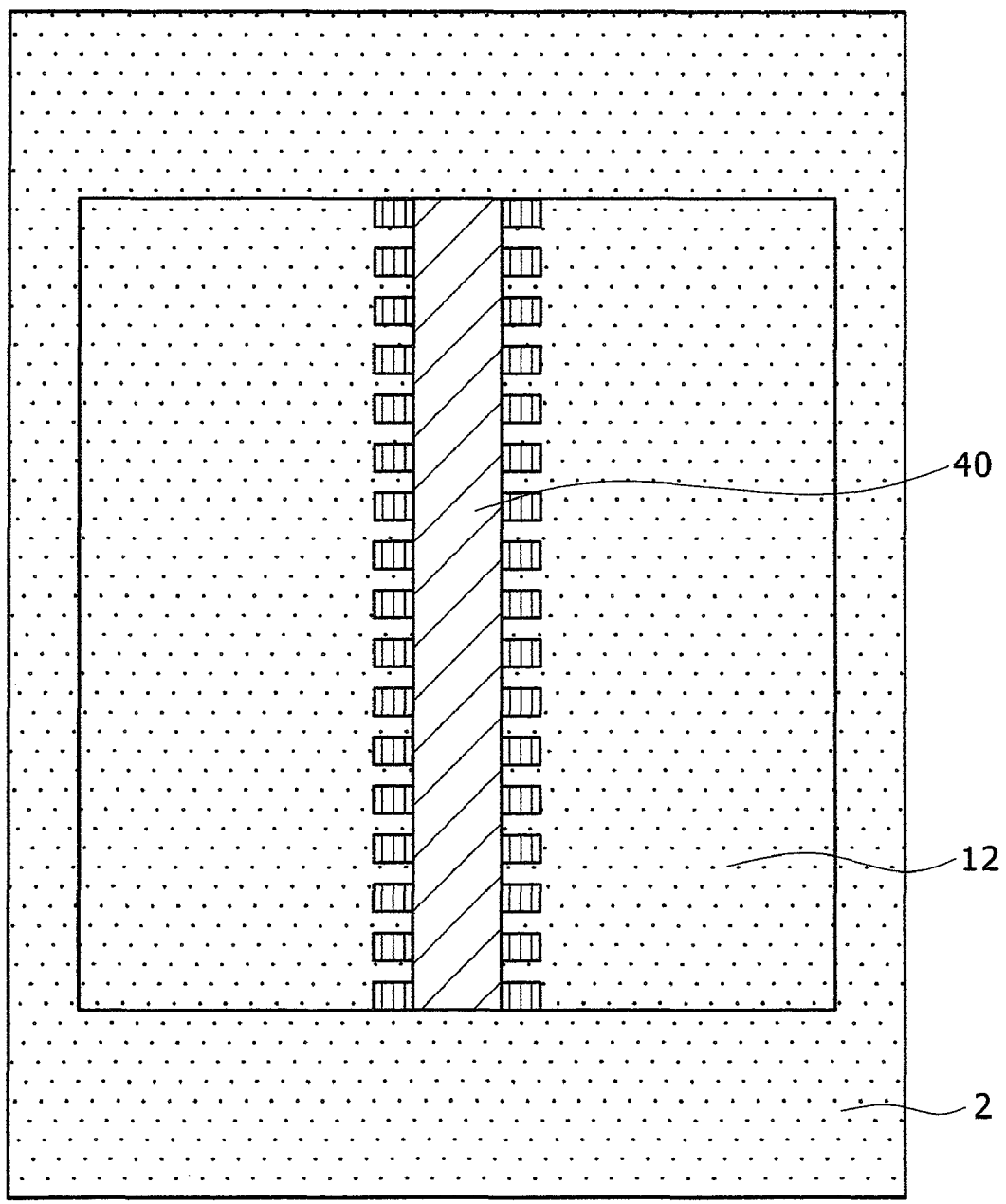
FIG. 6J is a top view illustrating a manufacturing process sequence of a silicon laser according to a third embodiment of the present invention.

After nitride silicon is deposited on an entire surface, a resist is remained only in a predetermined region by resist patterning using photolithography and nitride silicon 40 is patterned by using anisotropic dry etching as shown in FIGS. 5J and 6J. The nitride silicon 40 is constituted by an optical resonator serving as both a waveguide and a mirror. Herein, the length of the nitride silicon 40 which is a resonant length is 500 µm. The nitride silicon 40 has a spine structure in which a thick part and a thin part are alternately repeated, but the thick part of the nitride silicon 40 is 2 µm and the thin part of the nitride silicon 40 is 1 µm. The lengths of the thick and thin parts of the nitride silicon 40 in a travelling direction of light confined in the waveguide are designed to be ¼ of a wavelength in the waveguide. More specifically, since an emission wavelength is assumed to be 850 nm and an effective refractive index in the waveguide of the nitride silicon 40 is estimated to be approximately 1.76, both the lengths of the thick and thin parts of the nitride silicon 40 are 121 nm.

After the resist remains only in the predetermined region by the resist patterning using the photolithography, an opening portion is formed in a part of a thermally oxidized film 12 by wet etching using the fluorinated acid. After TiN and Al are deposited on an entire surface, the resist remains only in the predetermined region by the resist patterning using the photolithography. After then, Al is wet-etched by using an etching solution containing a phosphoric acid, acetate acid, and a nitric acid, and Tin is wet-etched by using an etching solution containing ammonia and hydrogen peroxide.

Figure 6K:
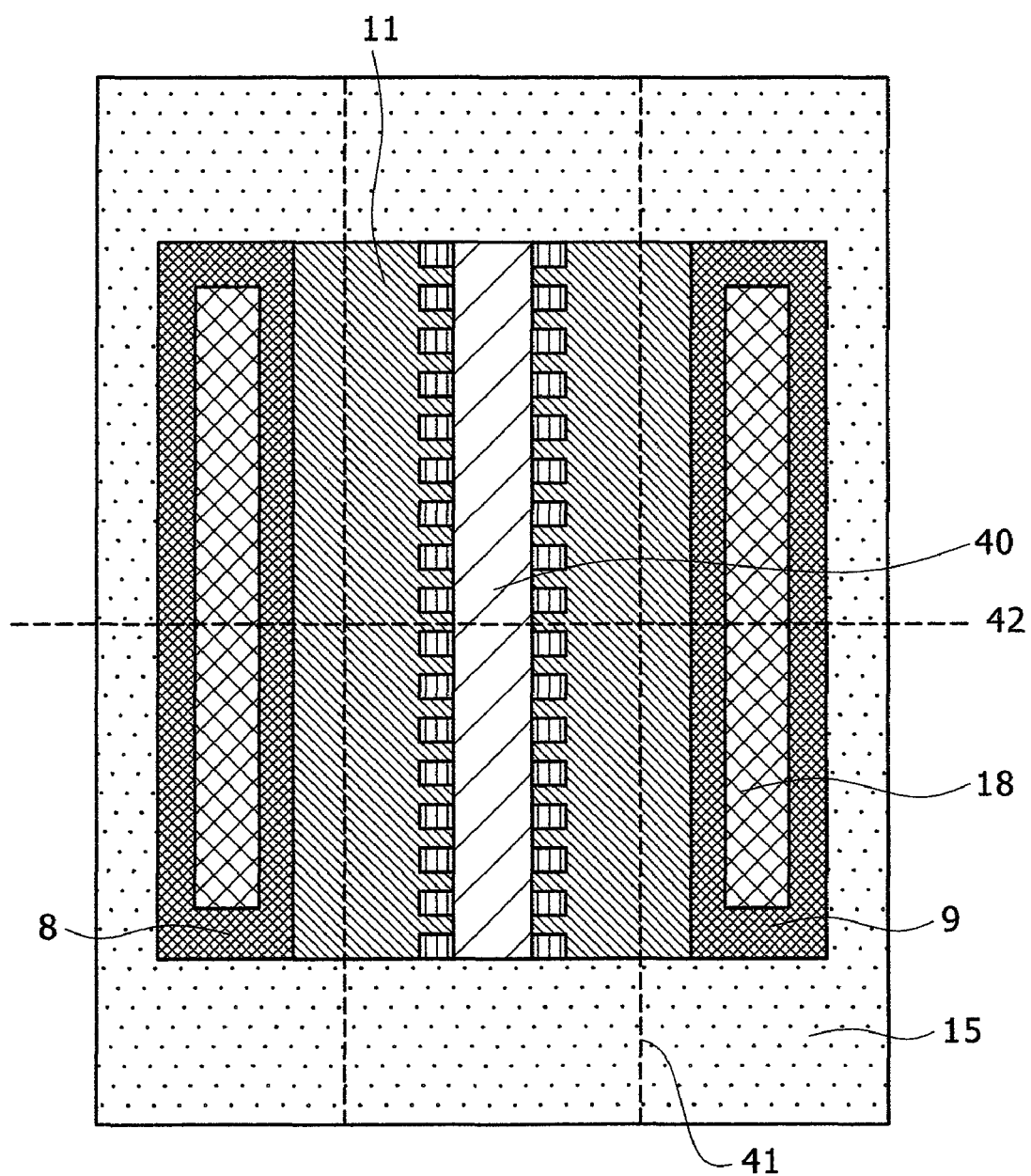
FIG. 6K is a completed top view of a silicon laser according to a third embodiment of the present invention.

As a result, a Tin electrode 17 and an Al electrode 18 are patterned. Then, the hydrogen annealing is performed at a temperature of 400° C. and defects generated during the process are hydrogen-terminated. Next, a protective film (not shown) made of an organic material is applied onto the surface of the support silicon substrate 1, such that the resist remains only in the predetermined region by the resist patterning using the photolithography with respect of the rear surface of the silicon substrate 1 and the nitride silicon 14 is patterned by the anisotropic etching using the dry etching. At this time, in order to locally remove the silicon substrate 1 existing just beneath the nitride silicon 14, alignment with the pattern of the surface of the silicon substrate 1 is performed and a photolithography process is performed on the rear surface of the silicon substrate 1. After an opening portion 19 is formed in a predetermined part of the silicon substrate 1 by anisotropic etching using an alkaline etching solution, the above-mentioned organic protective film (not shown) is removed by organically cleansing the surface of the silicon substrate 1 using acetone and methanol. A silicon laser device is completed by depositing a dielectric 20 and a cooling electrode 21 on the entire surface of the rear surface as shown in FIGS. 5K and 6K. In FIG. 6K, a p-type Si electrode 8, an n-type Si electrode 9, and the ultrathin silicon 11 are originally disposed below the thermally oxidized film 12, and do not exist on the surface, but are shown so as to comprehend the completed drawing. FIG. 6K shows a rear opening portion 41 as viewed from the upper part of the substrate.

The fabricated silicon laser device oscillates the laser beam at approximately 850 nm which is the designed wavelength and is a single mode according to spectrum analysis. This purpose is to selectively enhance a wavelength determined from a periodic structure such as the spine structure in which the thick part and the thin part of the nitride silicon 40 are alternately repeated, in the silicon laser device.

As described above, it is possible to effectively vary the refractive index in the waveguide by alternately connecting the nitride silicons 40 having different thicknesses. In particular, in a case when a side surface of the nitride silicon 40 is exposed to air, it is possible to secure a large refractive index of approximately 1.0 between nitride silicon having a refractive index of approximately 2.0 and air having a refractive index of approximately 1.0. Therefore, it is possible to provide large modulation of the light in the waveguide. As a result, it is possible to give the same effect as a case when the mirror is periodically disposed in the waveguide and to provide a large distribution return effect. Accordingly, it is possible to implement a mirror effect by the periodic structure of the nitride silicon and the silicon dioxide only with nitride silicon made of a single material as disclosed in the first embodiment. Therefore, in the embodiment, it is not necessary to use the silicon dioxide 15 serving as an interlayer insulating film used in the first embodiment. Contrary to this, in the embodiment, since it is possible to improve the performance by using the difference in the refractive index between the nitride silicon 40 and the air, it is preferable that the interlayer insulating film does not exist in the vicinity of the nitride silicon 40.

Fourth Embodiment

In the embodiment, a DFB type silicon laser capable of controlling a current value and laser oscillation by two gate electrodes, and a manufacturing method thereof are disclosed.

Figure 7H:
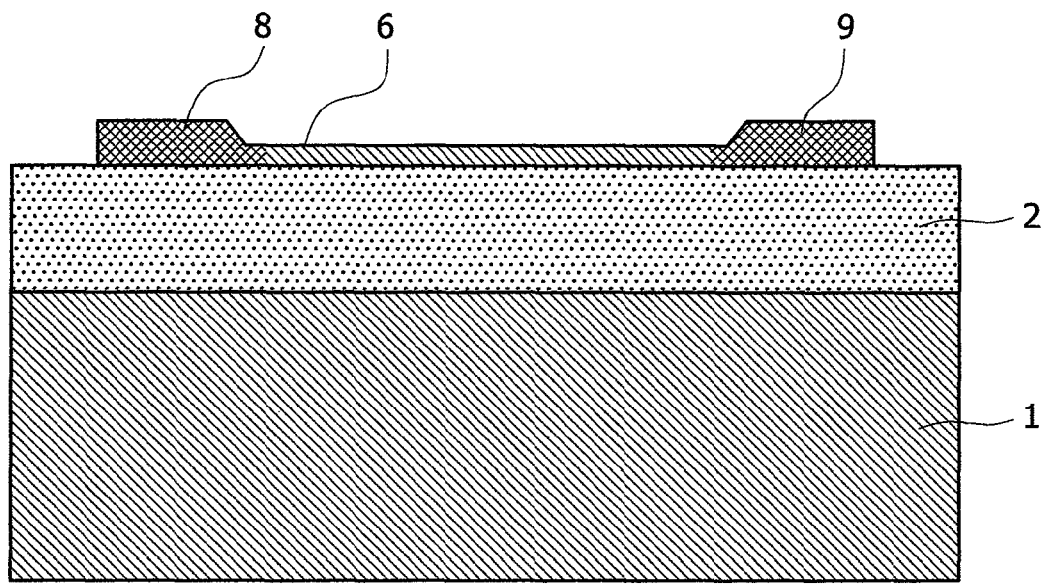
FIG. 7H is a cross-sectional view illustrating a manufacturing process sequence of a silicon laser according to a fourth embodiment of the present invention.
Figure 7I:
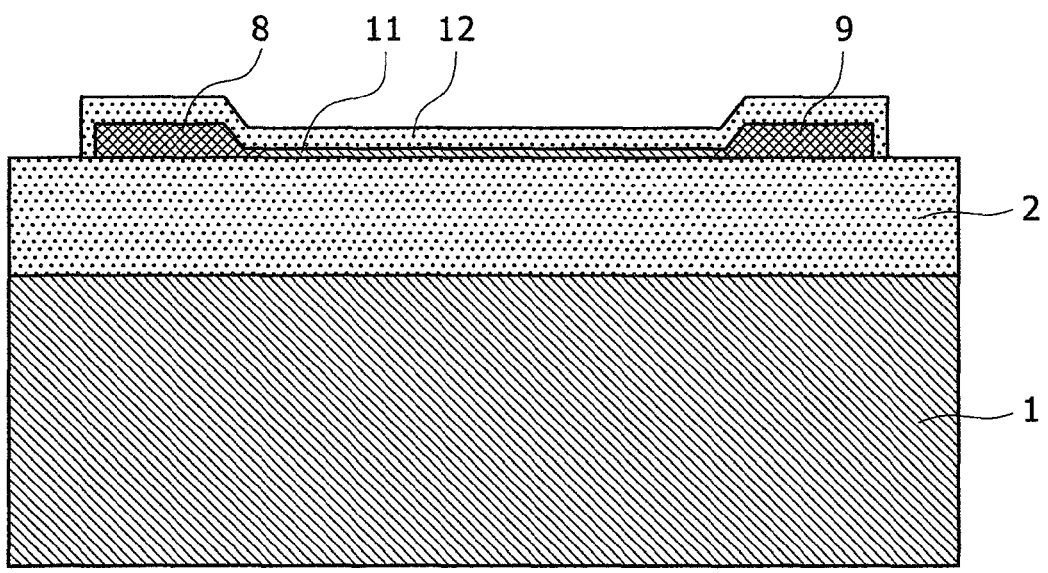
FIG. 7I is a cross-sectional view illustrating a manufacturing process sequence of a silicon laser according to a fourth embodiment of the present invention.
Figure 7J:
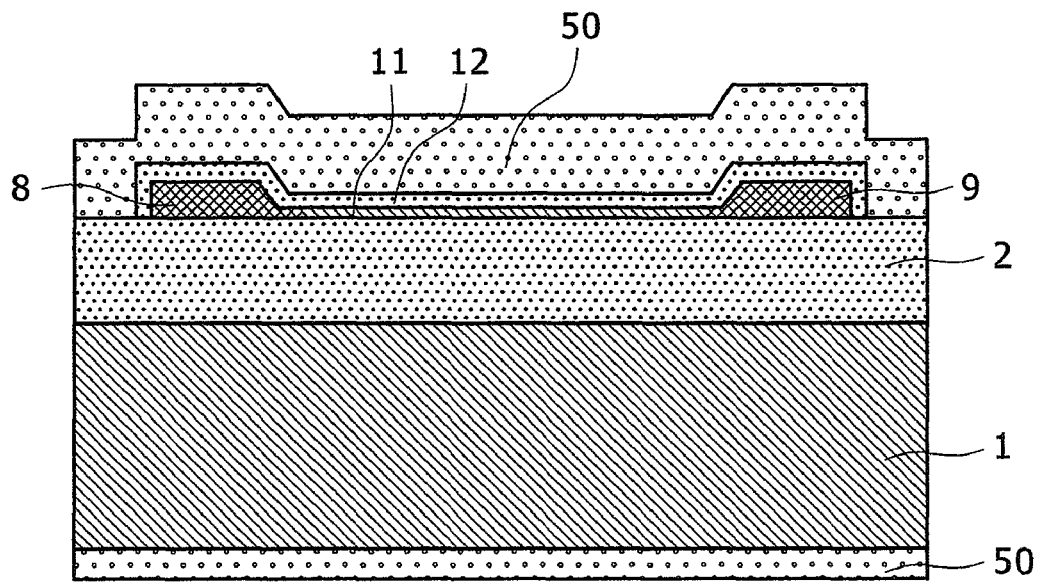
FIG. 7J is a cross-sectional view illustrating a manufacturing process sequence of a silicon laser according to a fourth embodiment of the present invention.
Figure 7K:
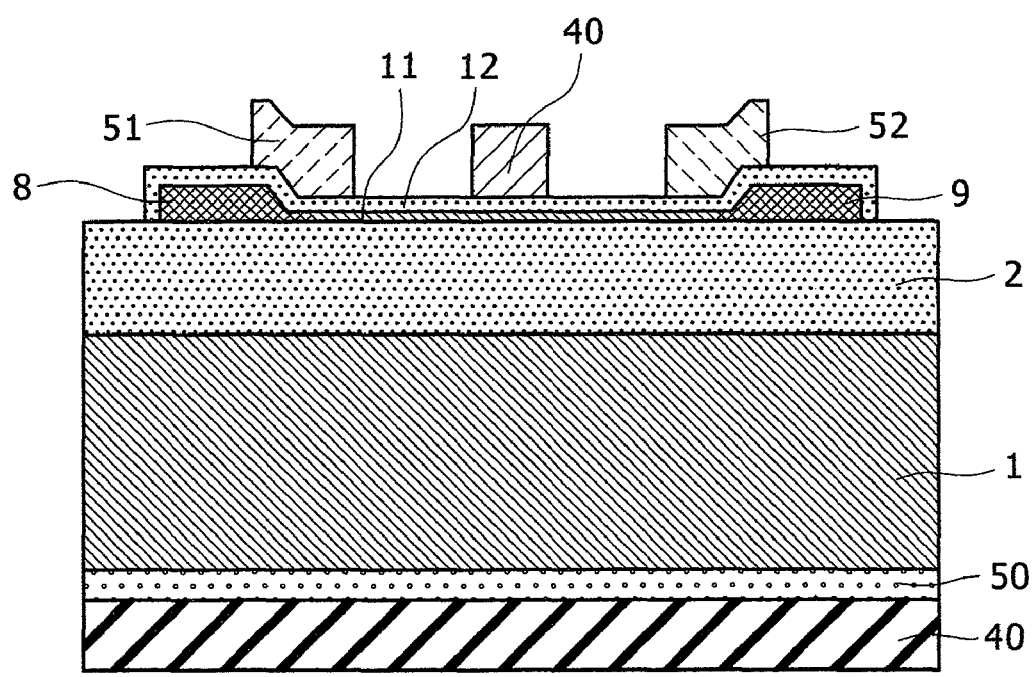
FIG. 7K is a cross-sectional view illustrating a manufacturing process sequence of a silicon laser according to a fourth embodiment of the present invention.
Figure 7L:
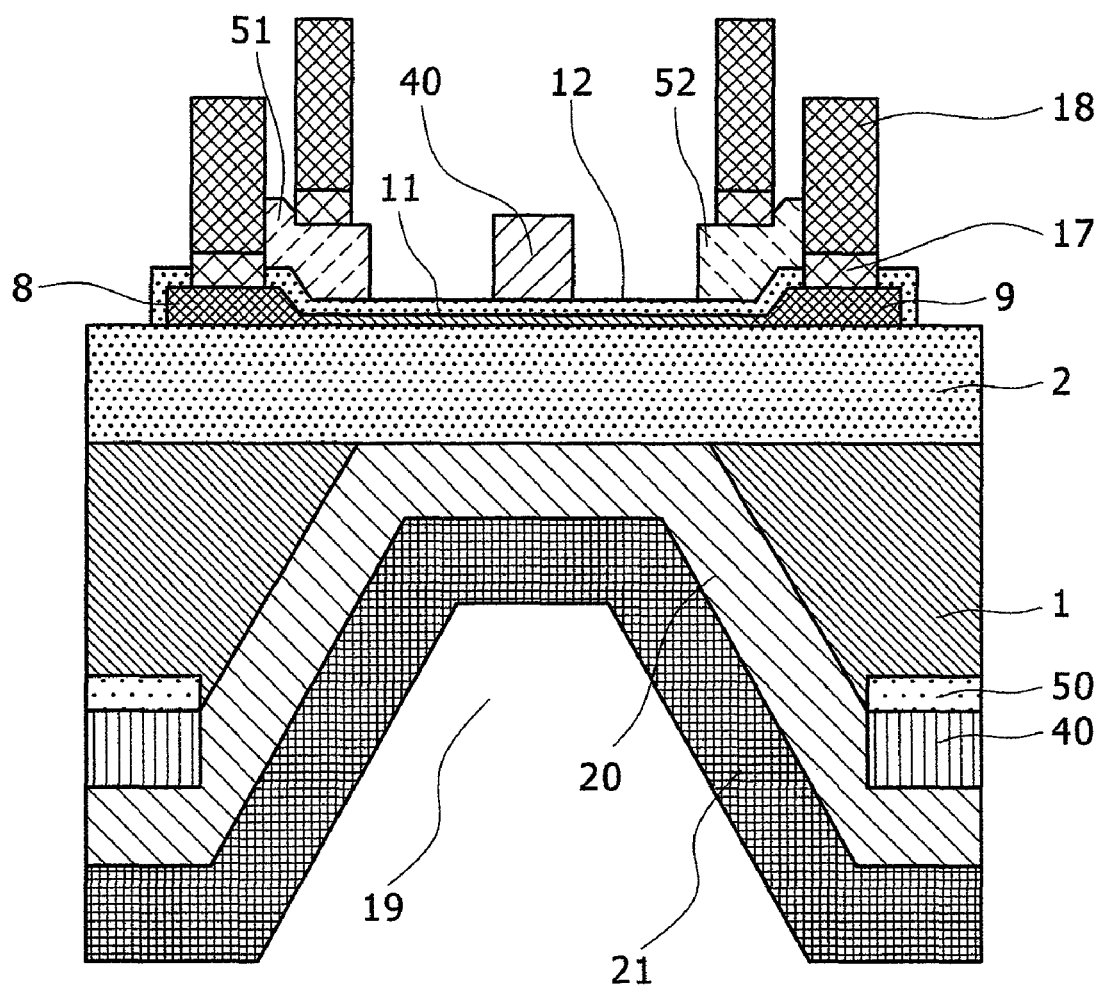
FIG. 7L is a completed cross-sectional view of a silicon laser according to a fourth embodiment of the present invention.

FIGS. 1A to 1G and FIGS. 7H to 7L show a cross-sectional structure for each manufacturing process sequence. FIGS. 2A to 2G(2) and FIGS. 8H to 8L are schematic views of a manufacturing process sequence from an upper part of a substrate. Herein, FIGS. 1A to 1G and FIGS. 7H to 7L are horizontal cross-sectional views of FIGS. 2A to 2G(2) and FIGS. 8H to 8L. For example, FIG. 7L shows a structure taken along a cross section 54 in FIG. 8L. In the embodiment, a completed drawing of a device is shown in FIGS. 7L and 8L.

First, after thin silicon 6 is formed by fabricating the device according to the manufacturing process sequence shown in FIGS. 1A and 1G and FIGS. 2A and 2G(2) by the same manufacturing process as the first embodiment, a p-type Si electrode 8 and an n-type Si electrode 9 are formed by injecting impurities and performing activation heat treatment as shown in FIGS. 1G and 2G(2).

Figure 8H:
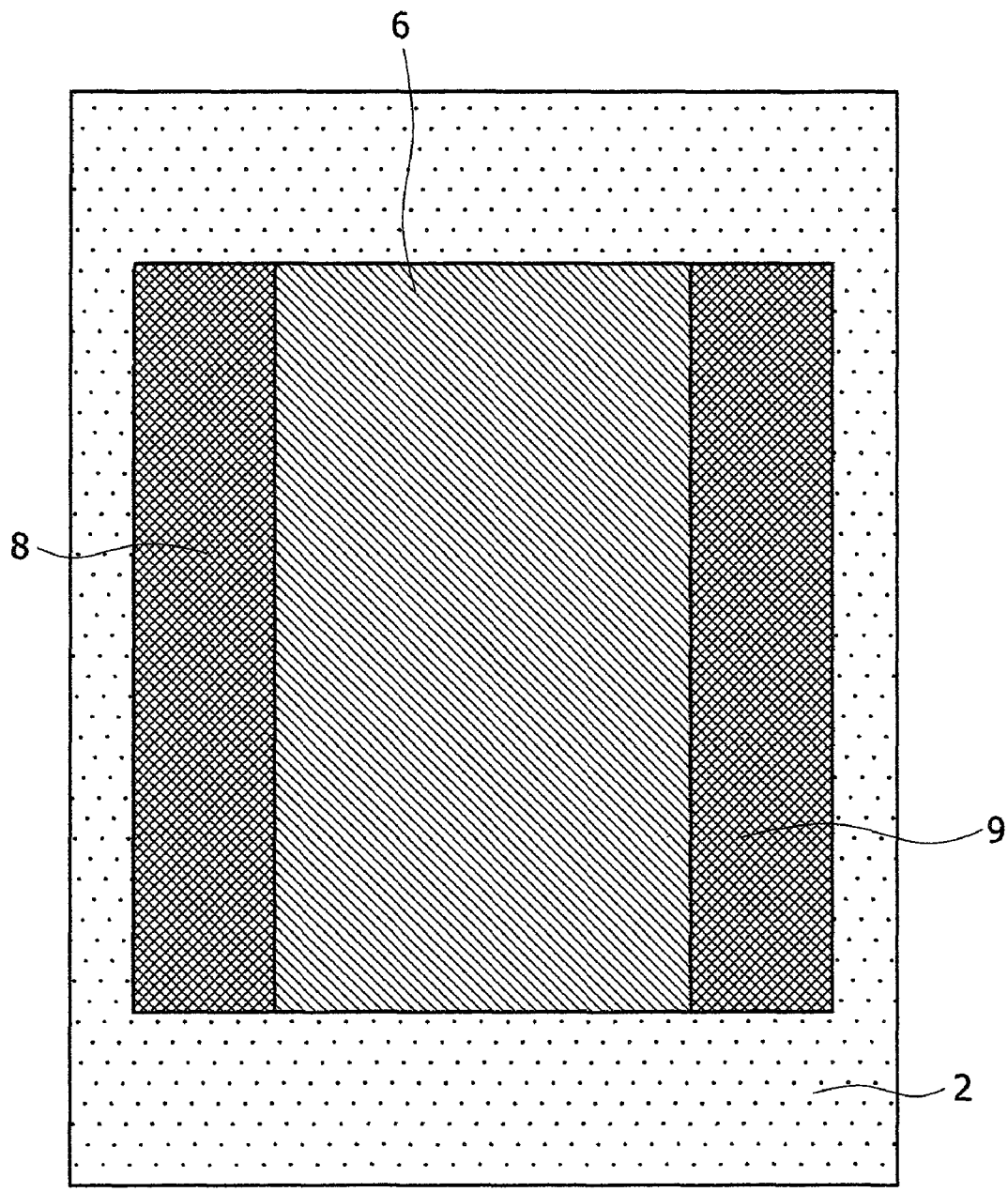
FIG. 8H is a top view illustrating a manufacturing process sequence of a silicon laser according to a fourth embodiment of the present invention.

Next, a thermally oxidized film 7 and a silicon dioxide 4 on a surface is removed by a cleansing process and wet etching using a fluorinated acid as shown in FIGS. 7H and 8H.

Figure 8I:
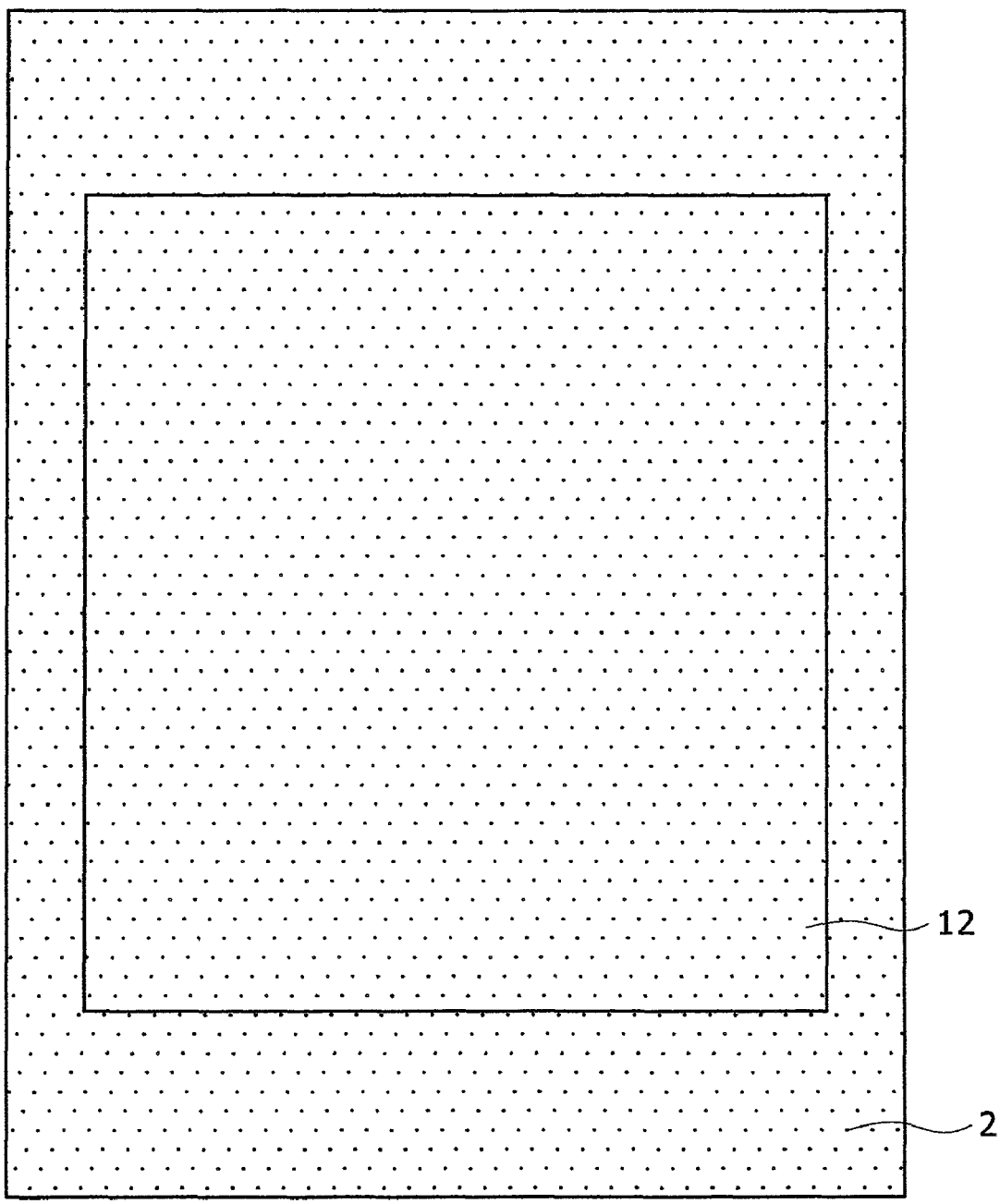
FIG. 8I is a top view illustrating a manufacturing process sequence of a silicon laser according to a fourth embodiment of the present invention.

Subsequently, an ultrathin silicon 11 acquired by further thinning the thin silicon 6 is formed by performing an oxidation process and the thermally oxidized film 12 is formed on the surface as shown in FIGS. 7I and 8I. An oxidation time and an oxidation temperature are adjusted so that a film thickness of the ultrathin silicon 11 is 2.0 nm. The film thickness of the thermally oxidized film 12 is 16.0 nm.

Figure 8J:
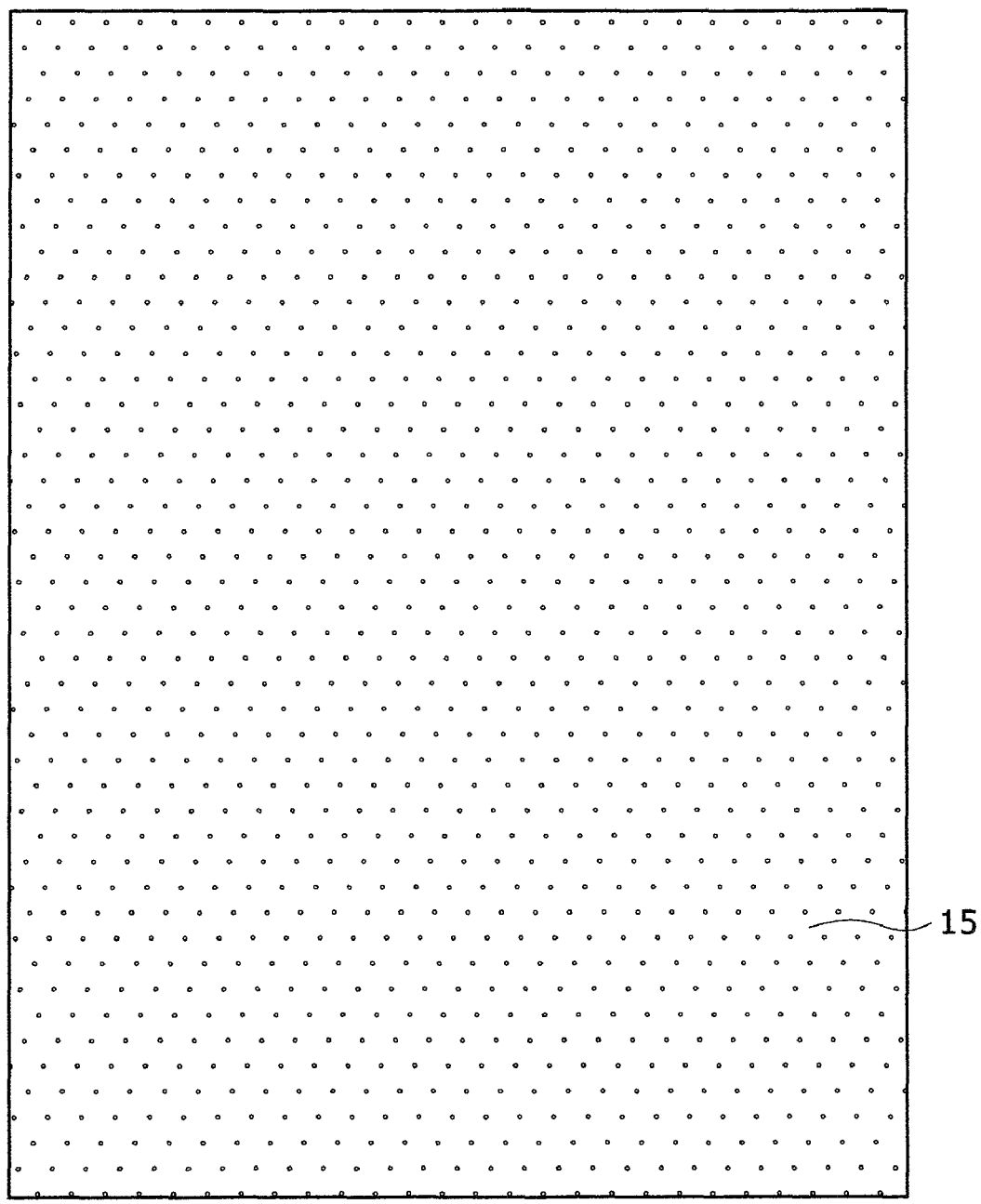
FIG. 8J is a top view illustrating a manufacturing process sequence of a silicon laser according to a fourth embodiment of the present invention.

Polycrystal silicon 50 is deposited on the entire surface of the substrate as shown in FIGS. 7J and 8J.

Next, after a resist is remained in a predetermined region by resist patterning using photolithography, BF2 ions with a dosage of $1 \times 10^{15}/cm^2$ are injected into the polycrystal silicon 50. After the resist is removed and the resist is remained only in the predetermined region by the resist patterning using the photolithography, P ions with a dosage of $1 \times 10^{15}/cm^2$ are injected into the polycrystal silicon 50. Then, the injected ions are activated by performing hydrogen annealing at a nitrogen atmosphere of 900° C. for 20 minutes. After the resist is remained only in the predetermined region by the resist patterning using the photolithography, a p-type polycrystal silicon electrode 51 and an n-type polycrystal silicon electrode 52 are fabricated by patterning the polycrystal silicon 50 using anisotropic dry etching.

Figure 8K:
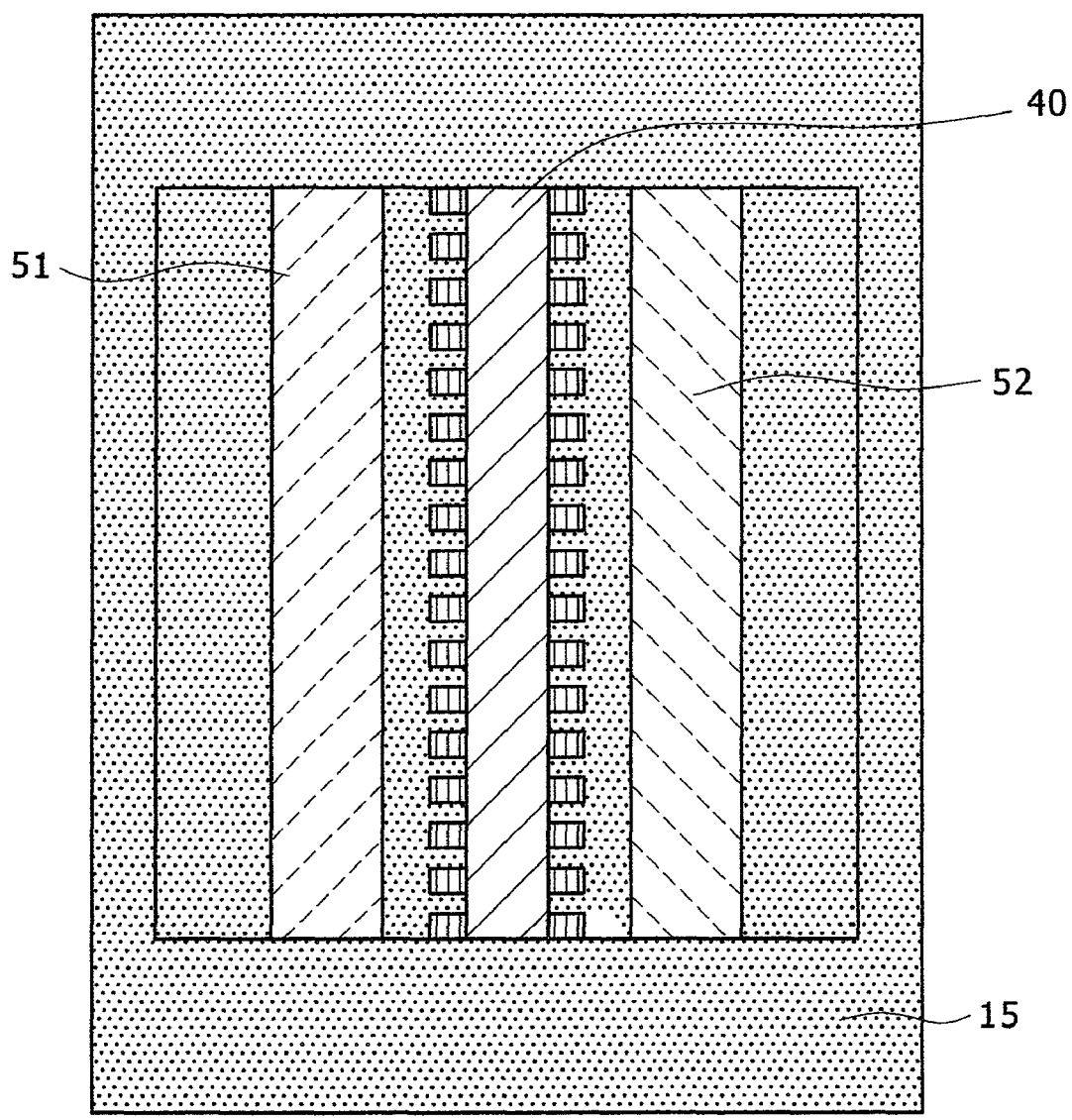
FIG. 8K is a top view illustrating a manufacturing process sequence of a silicon laser according to a fourth embodiment of the present invention.
Figure 8L:
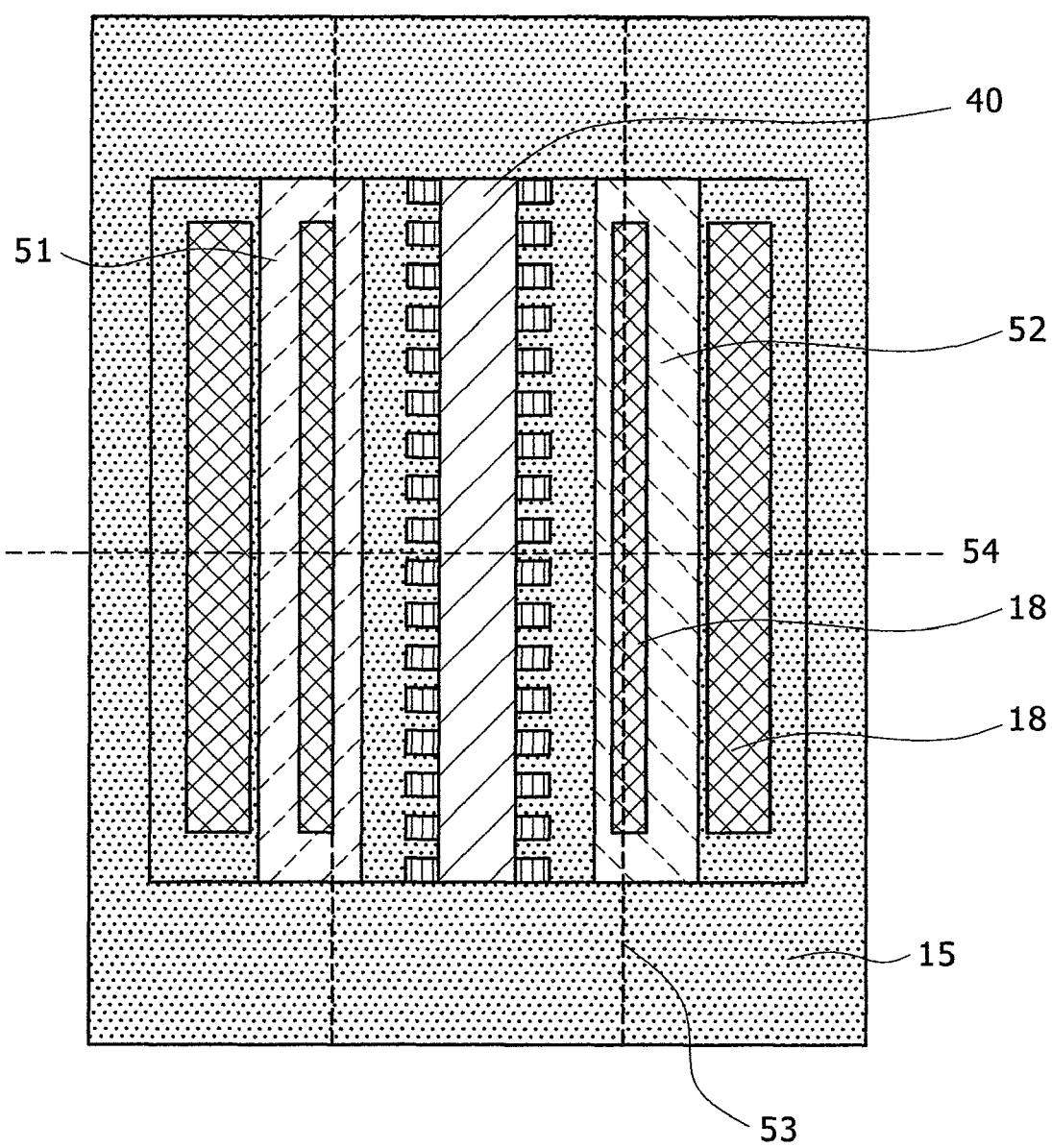
FIG. 8L is a completed cross-sectional top view of a silicon laser according to a fourth embodiment of the present invention.

After nitride silicon is deposited on an entire surface, a resist is remained only in a predetermined region by resist patterning using photolithography and nitride silicon 40 is patterned by using the anisotropic dry etching as shown in FIGS. 7K and 8K. The nitride silicon 40 is constituted by an optical resonator serving as both a waveguide and a mirror. Herein, the length of the nitride silicon 40 which is a resonant length is 500 μm. The nitride silicon 40 has a spine structure in which a thick part and a thin part are alternately repeated, but the thick part of the nitride silicon 40 is 2 μm and the thin part of the nitride silicon 40 is 1 μm. The lengths of the thick and thin parts of the nitride silicon 40 in a travelling direction of light confined in the waveguide are designed to be ¼ of a wavelength in the waveguide. More specifically, since an emission wavelength is assumed to be 850 nm and an effective refractive index in the waveguide of the nitride silicon 40 is estimated to be approximately 1.76, both the lengths of the thick and thin parts of the nitride silicon 40 are 121 nm.

After the resist remains only in the predetermined region by the resist patterning using the photolithography, an opening portion is formed in a part of a thermally oxidized film 12 by wet etching using the fluorinated acid. After TiN and Al are deposited on an entire surface, the resist remains only in the predetermined region by the resist patterning using the photolithography. After then, Al is wet-etched by using an etching solution containing a phosphoric acid, acetate acid, and a nitric acid, and Tin is wet-etched by using an etching solution containing ammonia and hydrogen peroxide.

As a result, a Tin electrode 17 and an Al electrode 18 are patterned. Then, the hydrogen annealing is performed at a temperature of 400° C. and defects generated during the process are hydrogen-terminated. Next, after a protective film (not shown) made of an organic material is applied onto the surface of the support silicon substrate 1, the resist remains only in the predetermined region by the resist patterning using the photolithography with respect to the rear surface of the silicon substrate 1 and the nitride silicon 14 is patterned by the anisotropic etching using the dry etching. At this time, in order to locally remove the silicon substrate 1 existing just beneath the nitride silicon 14, alignment with the pattern of the surface of the silicon substrate 1 is performed and the photolithography process is performed on the rear surface of the silicon substrate 1. After then, after an opening portion 19 is formed in a desired part of the silicon substrate 1 by anisotropic etching using an alkaline etching solution, the above-mentioned organic protective film (not shown) is removed by organically cleansing the surface of the silicon substrate 1 using acetone and methanol. A silicon laser device is completed by depositing a dielectric 20 and a cooling electrode 21 on the entire surface of the rear surface as shown in FIGS. 7L and 8L. Herein, in FIG. 7L, a p-type Si electrode 8, an n-type Si electrode 9, and the ultrathin silicon 11 are originally disposed below the thermally oxidized film 12, and do not exist on the surface, but are shown so as to comprehend the completed drawing. FIG. 8L shows a rear opening portion 53 as viewed from the upper part of the substrate.

The fabricated silicon laser device oscillates at approximately 850 nm which is the designed wavelength and is a single mode according to spectrum analysis. This purpose is to selectively enhance a wavelength determined from a periodic structure such as the spine structure in which the thick part and the thin part of the nitride silicon 40 are alternately repeated, in the silicon laser device. A threshold current value required for oscillating the laser before applying a gate voltage is 50 mA. It is possible to reduce the threshold current value to 10 mA by applying a voltage of +5V to the p-type polycrystal silicon electrode 51 and a voltage of −5V to the n-type polycrystal silicon electrode 52. This reason is that electrons and holes may be efficiently confined in the resonator by applying the gate voltage. When a positive voltage is applied to the p-type polycrystal silicon electrode 51, the thermally oxidized film 12 functions as a gate insulator, whereby it is possible to increase the hole density of the ultrathin silicon 11 just below the p-type polycrystal silicon electrode 51.

Similarly, when a negative voltage is applied to the n-type polycrystal silicon electrode 52, the thermally oxidized film 12 functions as the gate insulator, whereby it is possible to increase the electron density of the ultrathin silicon 11 just below the n-type polycrystal silicon electrode 52. In a state when the positive voltage is applied to the p-type polycrystal silicon electrode 51 and the negative voltage is applied to the n-type polycrystal silicon electrode 52 at one time, a large forward current flows when a forward voltage is applied between the p-type Si electrode 8 and the n-type Si electrode 9 in comparison with a case that the gate is not applied. Moreover, since holes injected from the p-type Si electrode 8 make it difficult for current to flow to a part just below the n-type polycrystal silicon electrode 52, the holes are confined in a resonator just below the nitride silicon 40. Similarly, since electrons injected from the n-type Si electrode 9 make it difficult for the current to flow to a part just below the p-type polycrystal silicon electrode 51, the electrons are confined in the resonator just below the nitride silicon 40.

It is possible to increase recombination efficiency and implement a structure capable of easily emitting light by introducing a carrier confinement mechanism. Since it is possible to directly modulate a laser into a voltage to directly modulate the intensity of a laser beam generated from the silicon laser by temporarily modulating the voltage applied to the gate electrode, the silicon laser according to the embodiment of the present invention is compatible with a CMOS circuit of a voltage driving type.

Fifth Embodiment

In the embodiment, a VCSEL (Vertical Cavity Surface Emitting Laser) type silicon laser and a manufacturing method thereof are disclosed.

FIGS. 1A to 1G and FIGS. 9H to 9M show a cross-sectional structure for each manufacturing process sequence. FIGS. 2A to 2G(2) and FIGS. 10H to 10M are schematic views of a manufacturing process sequence from an upper part of a substrate. Herein, FIGS. 1A to 1G and FIGS. 9H to 9M are horizontal cross-sectional views of FIGS. 2A to 2G(2) and FIGS. 10H to 10M. For example, FIG. 9L shows a structure taken along a cross sectional 52 in FIG. 10L. In the embodiment, a completed drawing of a device is shown in FIGS. 9M and 10M.

First, after thin silicon 6 is formed by fabricating the device according to the manufacturing process sequence shown in FIGS. 1A and 1G and FIGS. 2A and 2G(2) by the same manufacturing process as the first embodiment, a p-type Si electrode 8 and an n-type Si electrode 9 are formed by injecting impurities and performing activation heat treatment as shown in FIGS. 1G and 2G(2).

Figure 9H:
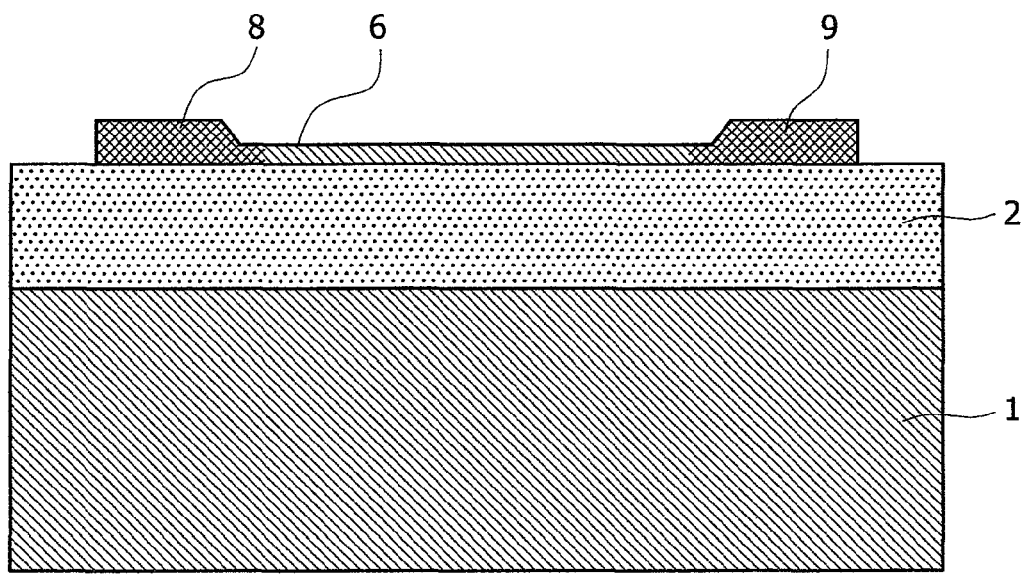
FIG. 9H is a cross-sectional view illustrating a manufacturing process sequence of a silicon laser according to a fifth embodiment of the present invention.
Figure 10H:
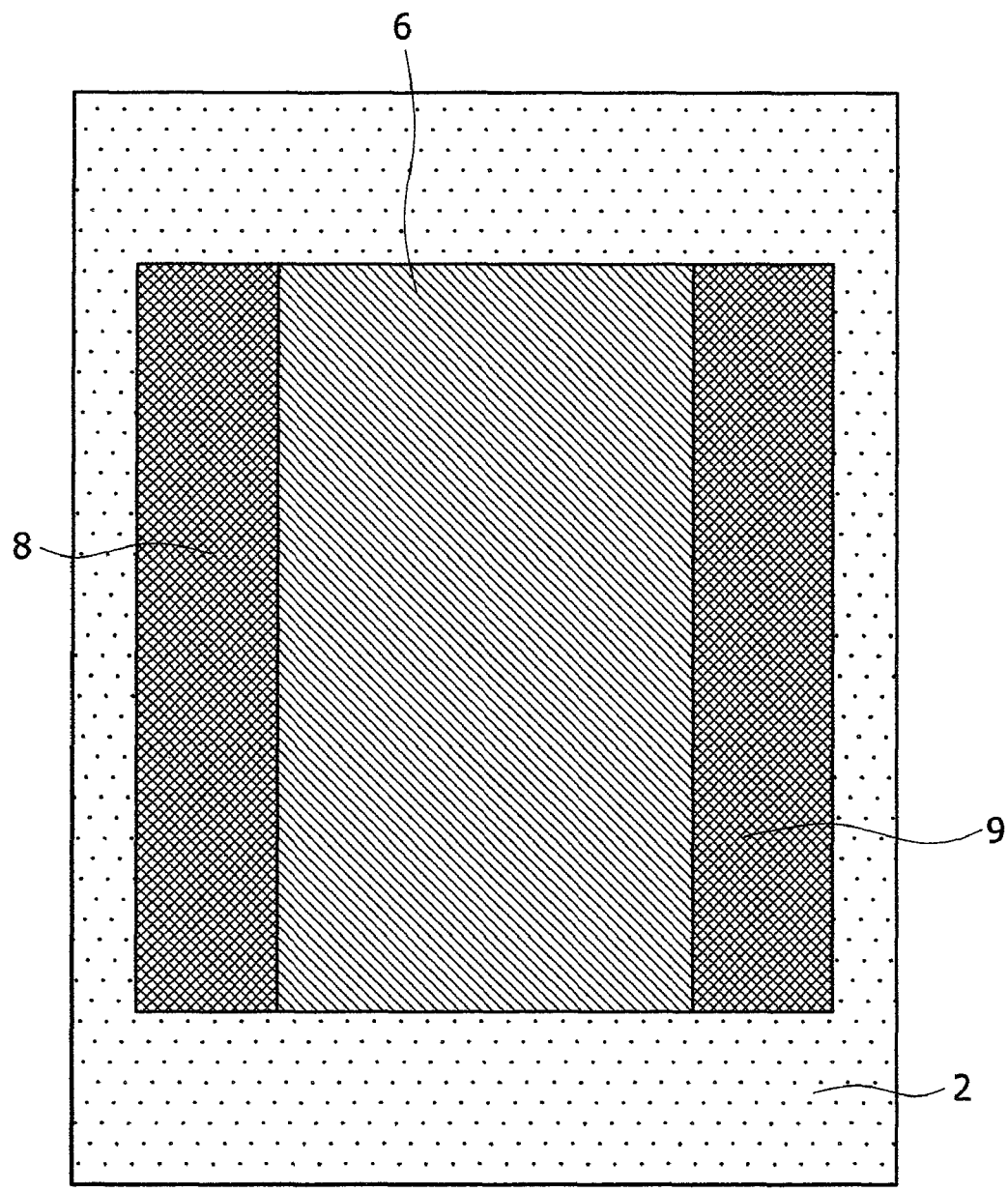
FIG. 10H is a top view illustrating a manufacturing process sequence of a silicon laser according to a fifth embodiment of the present invention.

Next, a thermally oxidized film 7 and a silicon dioxide 4 on a surface is removed by a cleansing process and wet etching using a fluorinated acid as shown in FIGS. 9H and 10H.

Figure 9I:
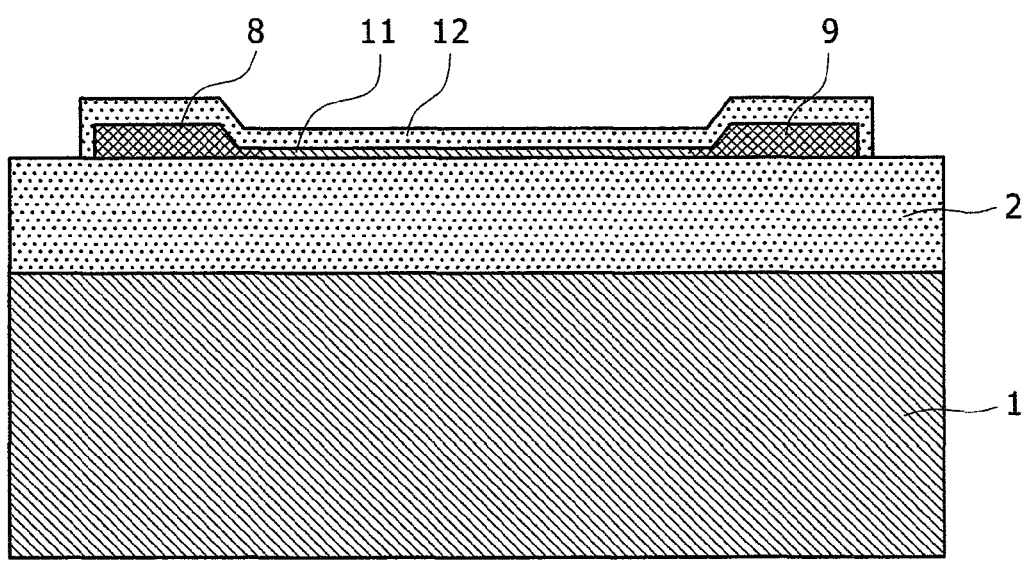
FIG. 9I is a cross-sectional view illustrating a manufacturing process sequence of a silicon laser according to a fifth embodiment of the present invention.
Figure 10I:
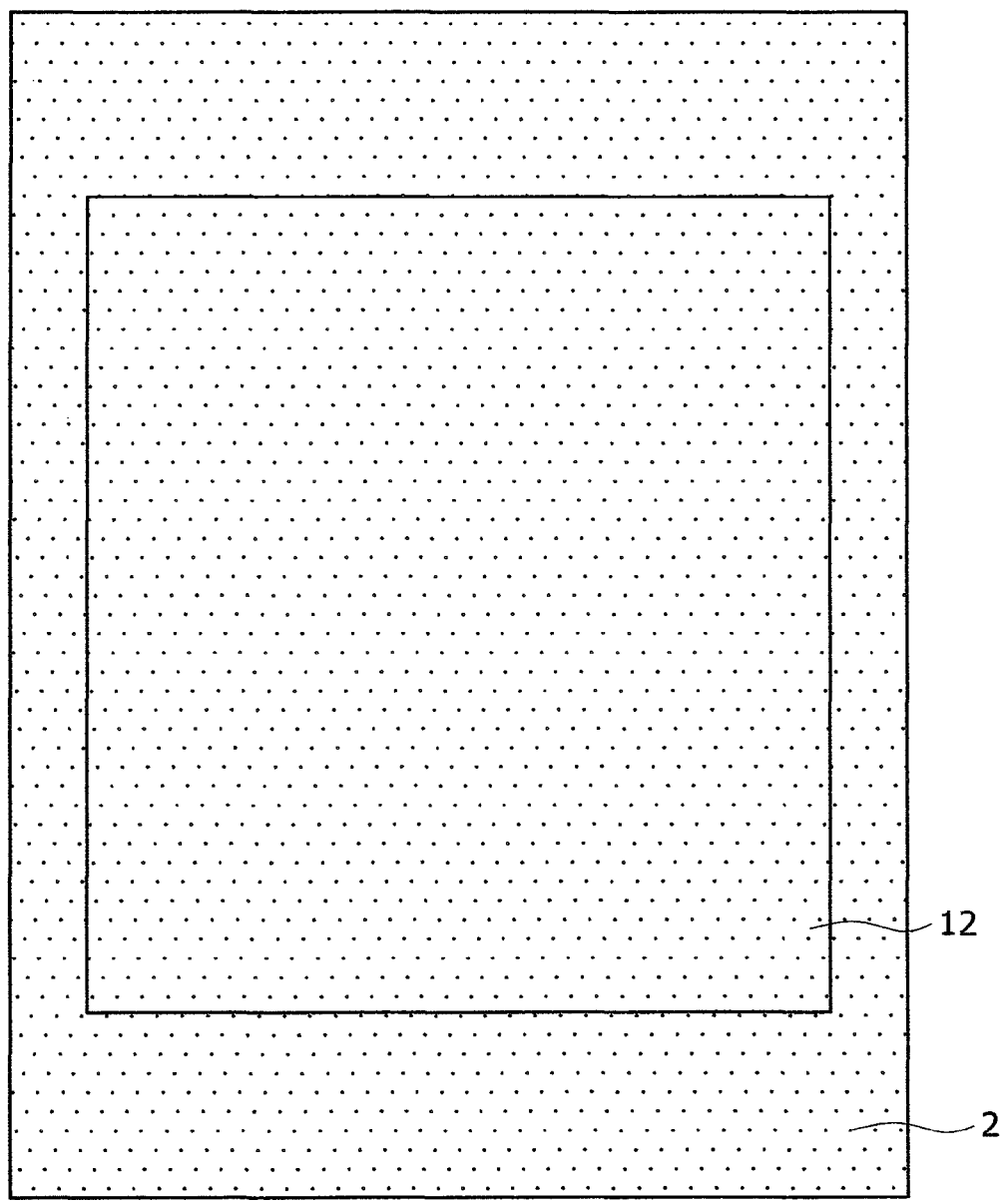
FIG. 10I is a top view illustrating a manufacturing process sequence of a silicon laser according to a fifth embodiment of the present invention.

Subsequently, an ultrathin silicon 11 acquired by further thinning the thin silicon 6 is formed by performing an oxidation process and the thermally oxidized film 12 is formed on the surface as shown in FIGS. 9I and 10I. An oxidation time and an oxidation temperature are adjusted so that a film thickness of the ultrathin silicon 11 is 2.0 nm. The film thickness of the thermally oxidized film 12 is 16.0 nm.

Figure 9J:
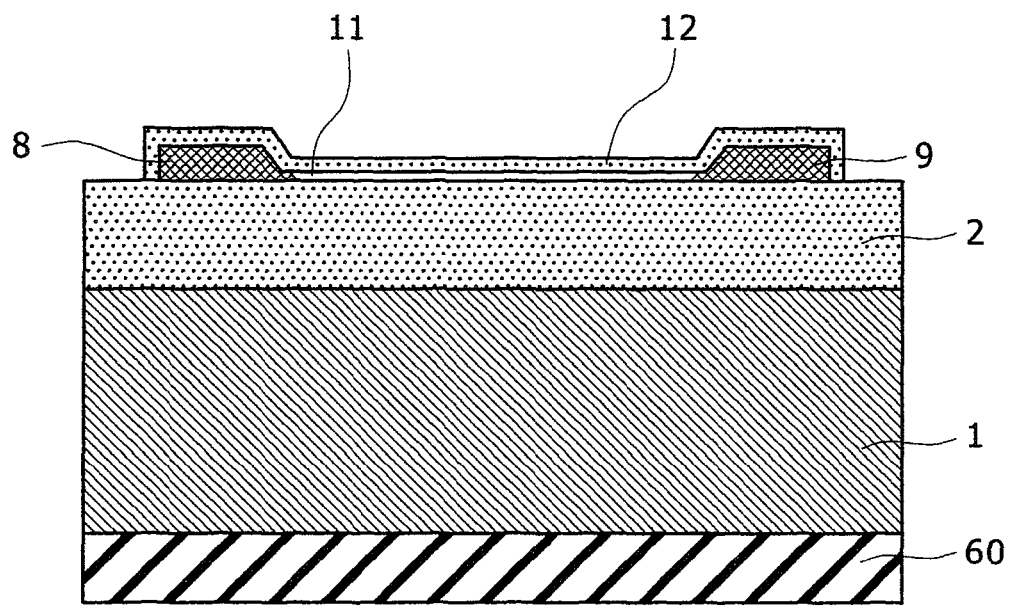
FIG. 9J is a cross-sectional view illustrating a manufacturing process sequence of a silicon laser according to a fifth embodiment of the present invention.
Figure 10J:
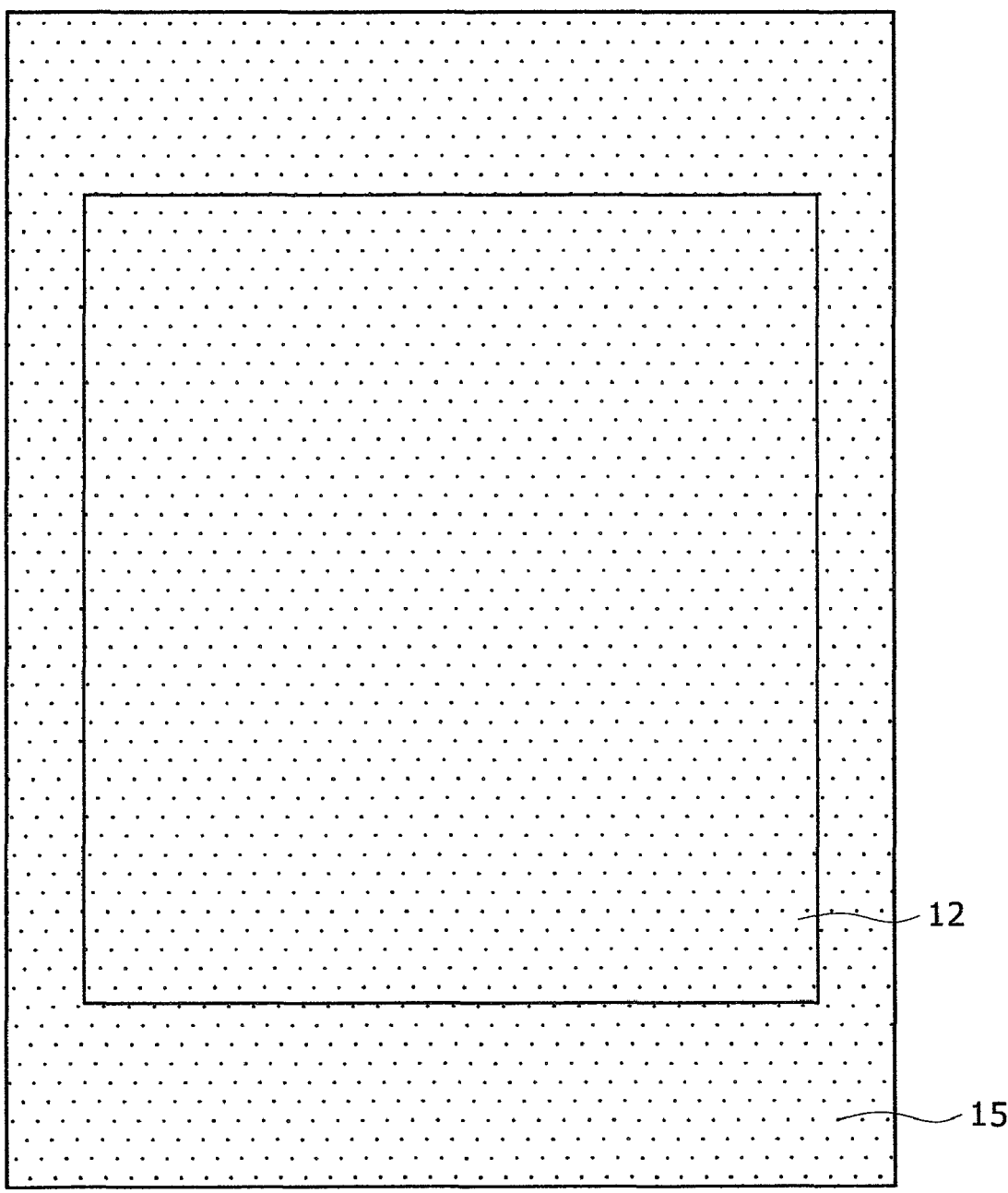
FIG. 10J is a top view illustrating a manufacturing process sequence of a silicon laser according to a fifth embodiment of the present invention.

Nitride silicon 60 is deposited on the entire surface of only a rear surface of a silicon substrate 1 as shown in FIGS. 9J and 10J.

After the resist remains only in the predetermined region by the resist patterning using the photolithography, an opening portion is formed in a part of a thermally oxidized film 12 by wet etching using the fluorinated acid. After TiN and Al are deposited on an entire surface, the resist remains only in the predetermined region by the resist patterning using the photolithography. Then, Al is wet-etched by using an etching solution containing a phosphoric acid, acetate acid, and a nitric acid, and Tin is wet-etched by using an etching solution containing ammonia and hydrogen peroxide.

Figure 9K:
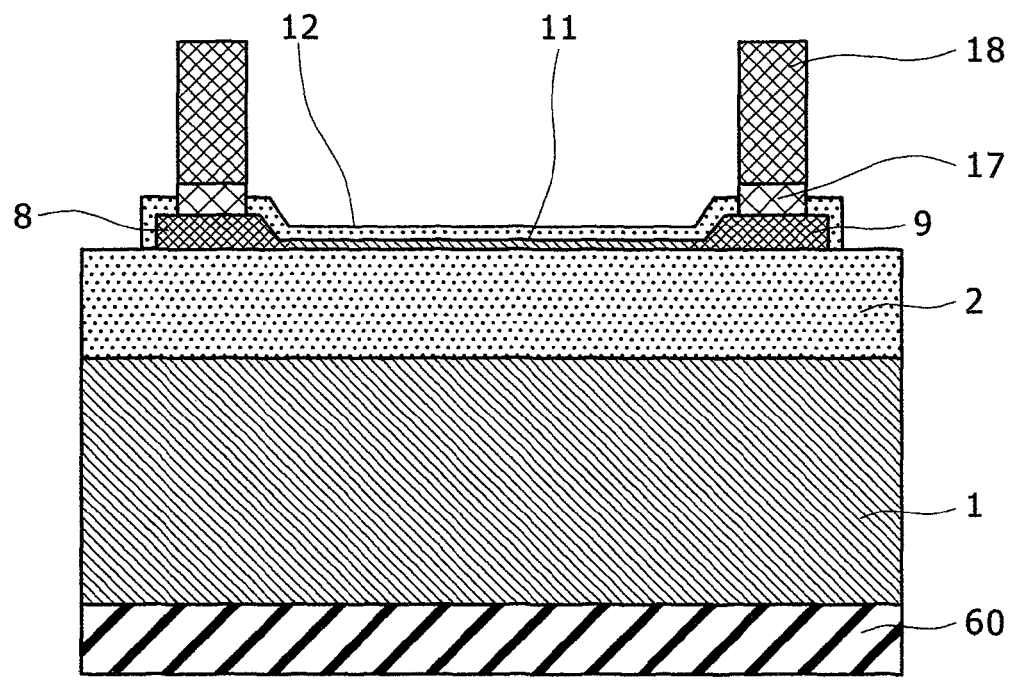
FIG. 9K is a cross-sectional view illustrating a manufacturing process sequence of a silicon laser according to a fifth embodiment of the present invention.
Figure 9L:
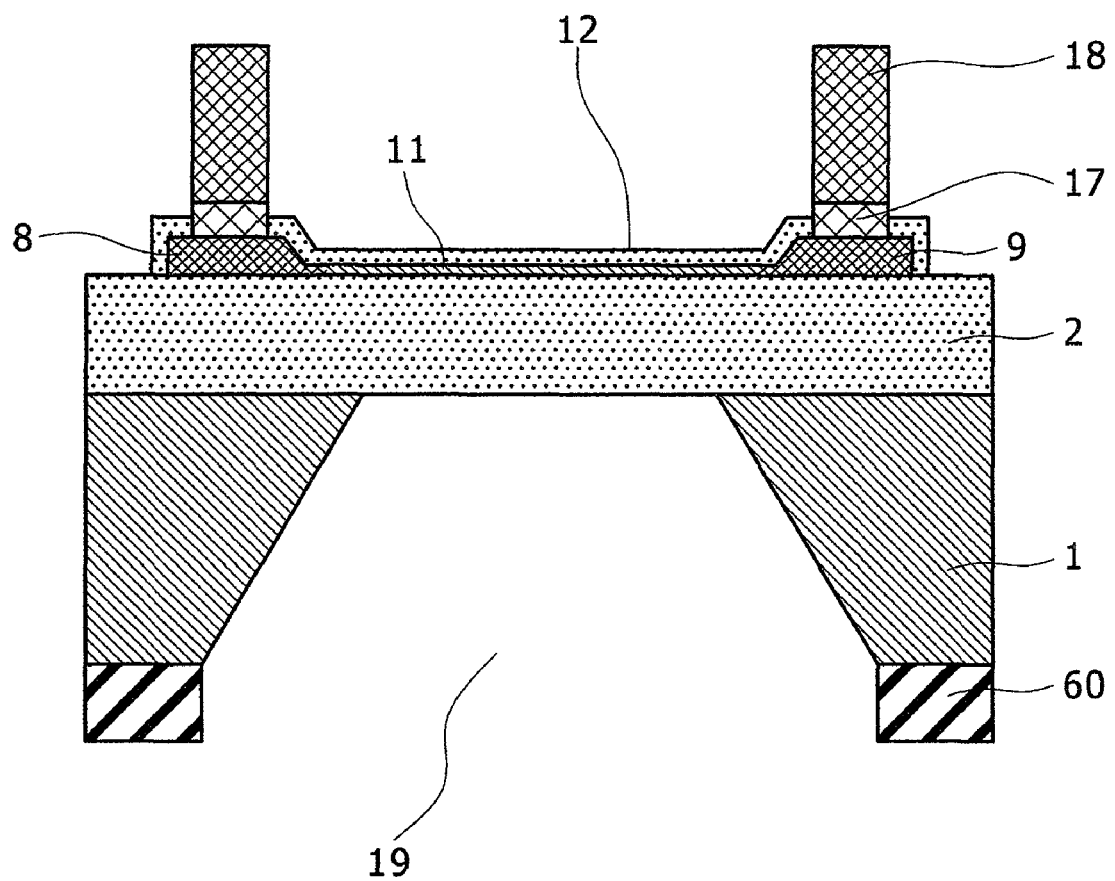
FIG. 9L is a cross-sectional view illustrating a manufacturing process sequence of a silicon laser according to a fifth embodiment of the present invention.
Figure 9M:
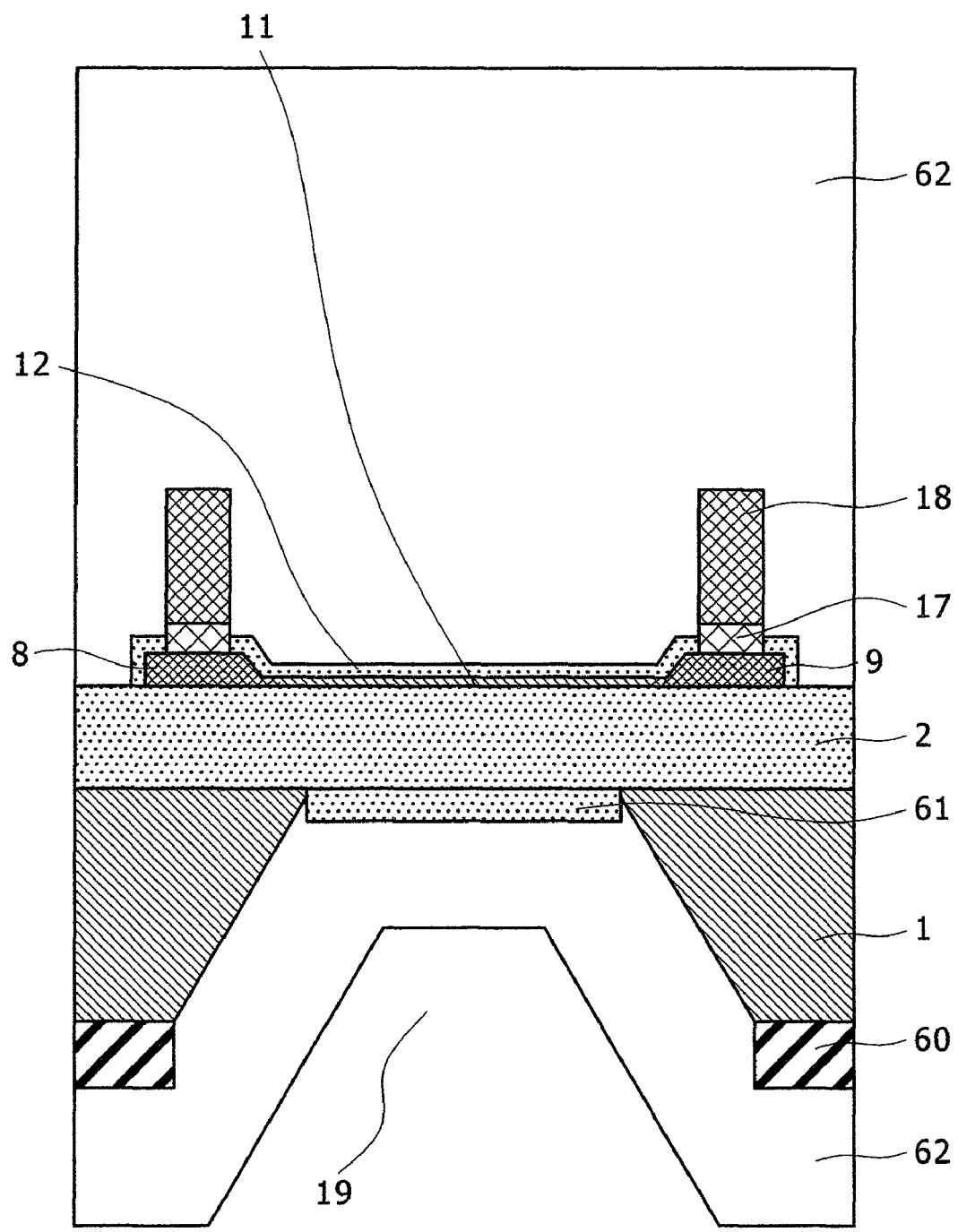
FIG. 9M is a completed cross-sectional view of a silicon laser according to a fifth embodiment of the present invention.
Figure 10K:
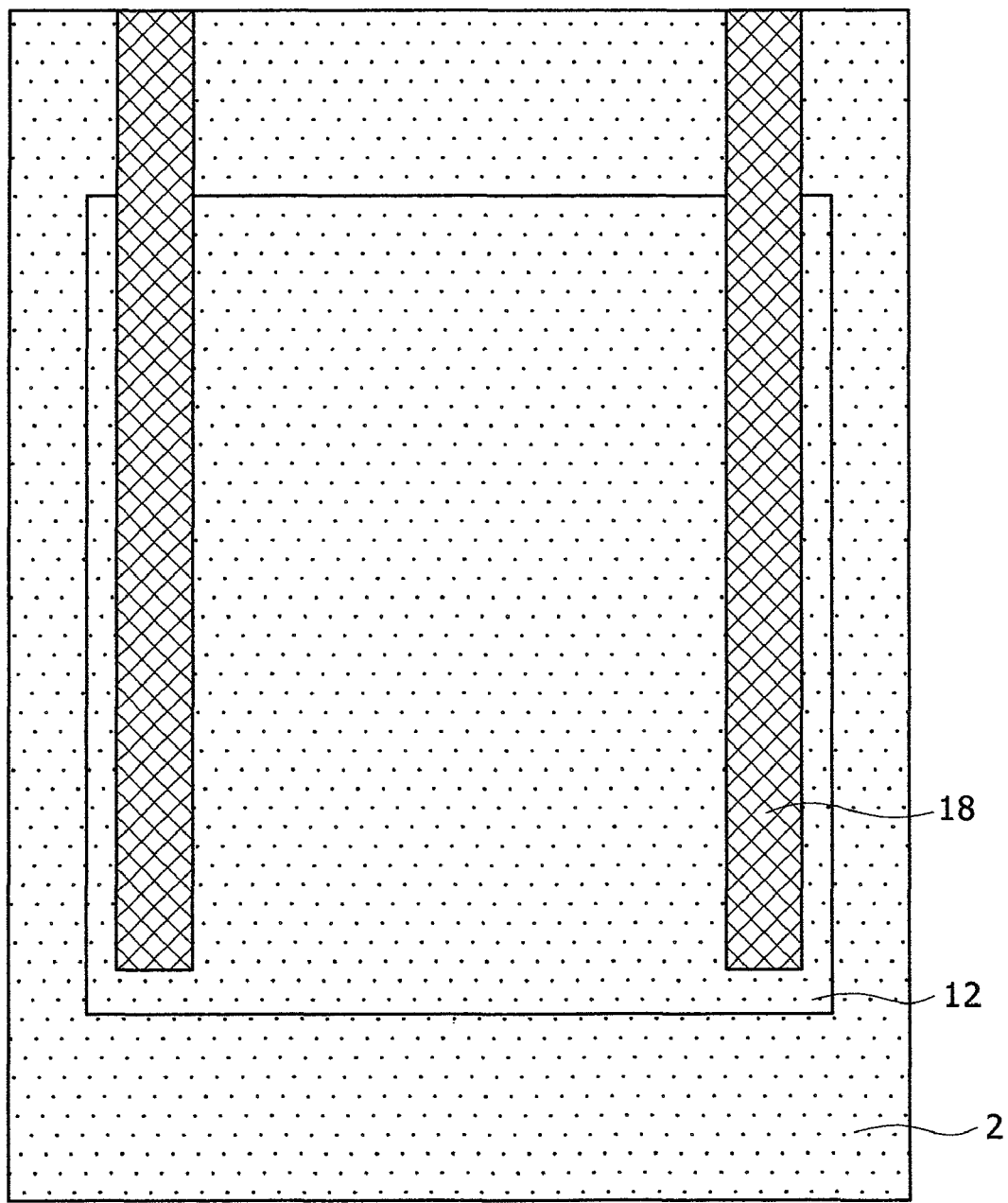
FIG. 10K is a top view illustrating a manufacturing process sequence of a silicon laser according to a fifth embodiment of the present invention.

As a result, a Tin electrode 17 and an Al electrode 18 are patterned. Then, the hydrogen annealing is performed at a temperature of 400° C. and defects generated during the process are hydrogen-terminated as shown in FIGS. 9K and 10K. In the VCSEL type silicon laser according to the embodiment of the present invention, it is preferable to perform wiring on a CMOS device or wiring on an external extraction pad electrode (not shown) in this step in order to form a DBR mirror made of a thick insulator in an upper and lower parts of the VCSEL type silicon laser. Even though forming the wiring later is not physically impossible, forming the wiring later is not preferable since a thick insulating film should be etched.

Figure 10L:
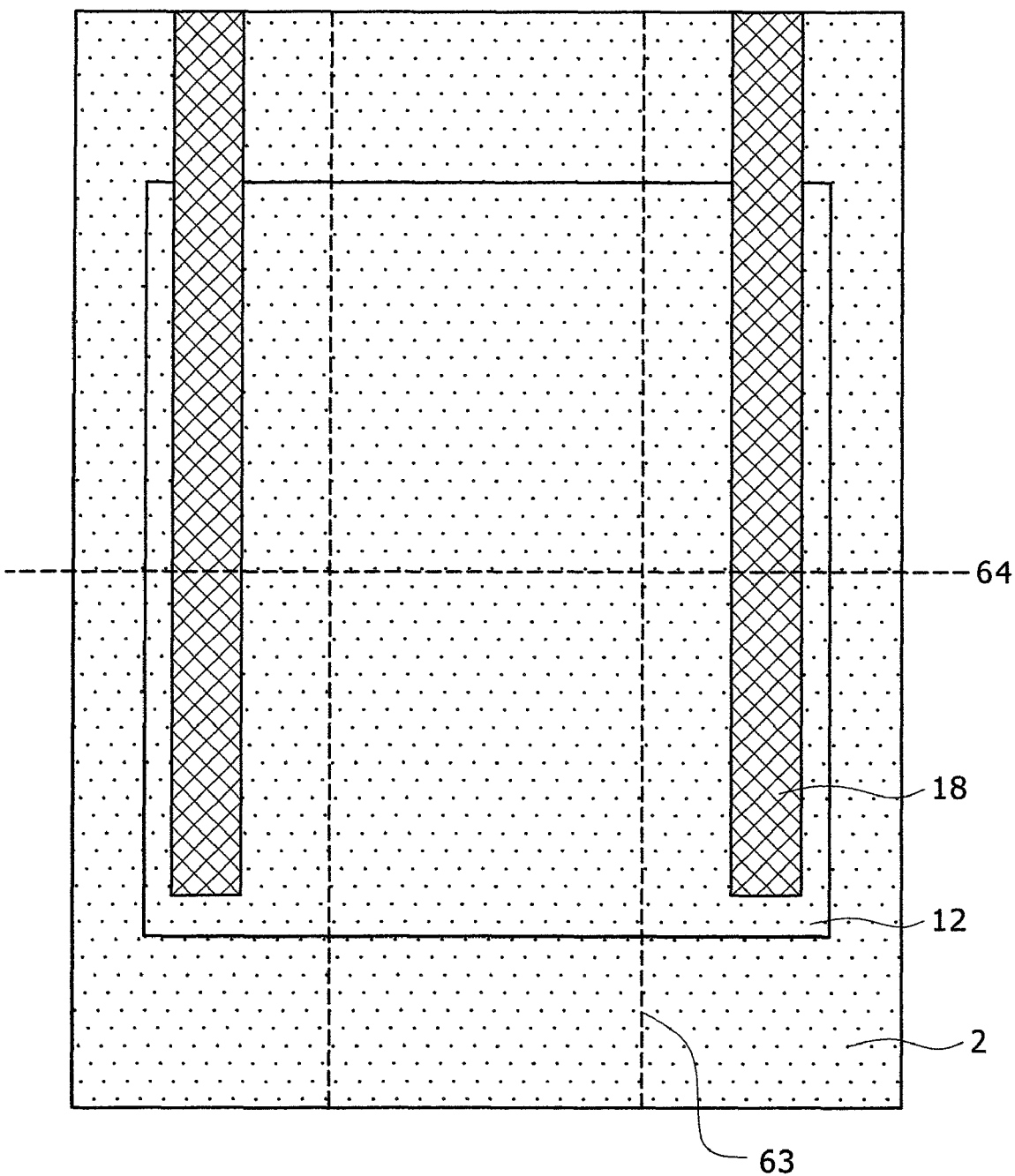
FIG. 10L is a top view illustrating a manufacturing process sequence of a silicon laser according to a fifth embodiment of the present invention.
Figure 10M:
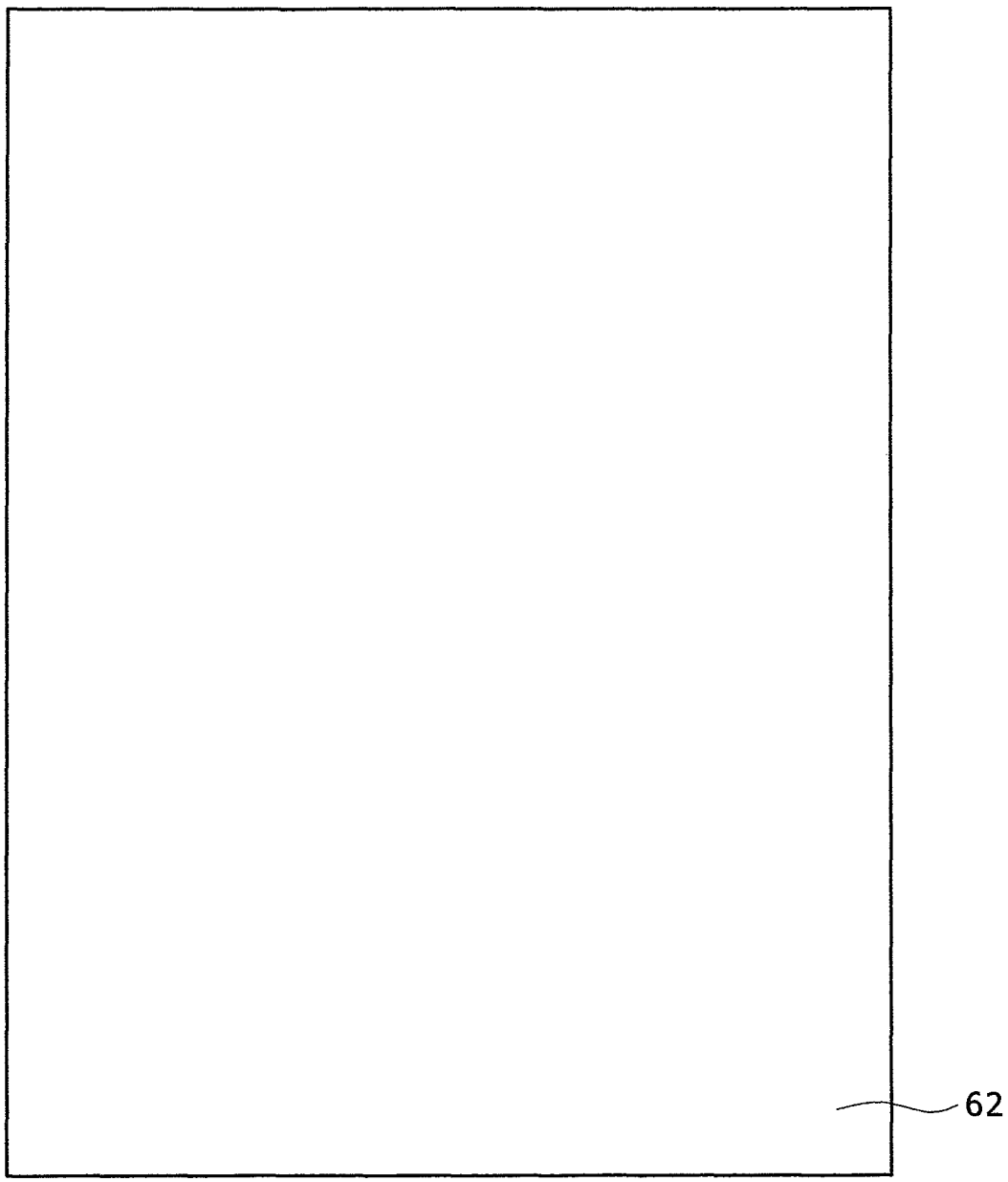
FIG. 10M is a top view illustrating a manufacturing process sequence of a silicon laser according to a fifth embodiment of the present invention.

Next, after a protective film (not shown) made of an organic material is applied onto the surface of the support silicon substrate 1, the resist remains only in the predetermined region by the resist patterning using the photolithography with respect of the rear surface of the silicon substrate 1 and the nitride silicon 14 is patterned by the anisotropic etching using the dry etching. At this time, in order to locally remove the silicon substrate 1 existing just beneath the nitride silicon 14, alignment with the pattern of the surface of the silicon substrate 1 is performed and the photolithography process is performed on the rear surface of the silicon substrate 1. After then, after an opening portion 19 is formed in a desired part of the silicon substrate 1 by anisotropic etching using an alkaline etching solution, the above-mentioned organic protective film (not shown) is removed by organically cleansing the surface of the silicon substrate 1 using acetone and methanol. The silicon substrate 1 is processed in states shown in FIGS. 9L and 10L. FIG. 10L shows a rear opening portion 63.

Next, silicon dioxide 61 is deposited only on a rear surface of the silicon substrate. Since a film thickness acquired by adding a film thickness of the silicon dioxide 61 to a film thickness of a BOX 2 is a resonant length, it is possible to efficiently confine light in a case when the film thickness of the silicon dioxide 61 is set so that the resonant length is equal to the integral multiple of a half of a wavelength of the light in the silicon dioxide 61. For example, when a film thickness of the ultrathin silicon is 2.0 nm, a peak of an emission wavelength is approximately 850 nm, whereby the resonant wavelength may be designed by an equation of $850 \div 1.45 \div 2 \approx 293$ nm. Since a thickness of the BOX 2 of an SOI substrate is 150 nm, the film thickness of the silicon dioxide 61 is set to 143 nm.

Subsequently, a DBR mirror 62 is formed in upper and lower parts of the silicon substrate 1. The DBR mirror 62 is formed by alternately laminating the nitride silicon and the silicon dioxide. The film thickness of the nitride silicon and the film thickness of the silicon dioxide are designed to be ¼ of the wavelength of the light in the corresponding films. For example, when the film thickness of the ultrathin silicon 11 is 2.0 nm, the peak of the emission wavelength is approximately 850 nm, whereby the film thickness of the nitride silicon is $850 \div 2.0 \div 4 \approx 106$ nm and the film thickness of the silicon dioxide is $850 \div 1.45 \div 4 \approx 147$ nm. The number of layers of the nitride silicon and the silicon dioxide is 100 pairs when the combination of a nitride silicon layer and a silicon dioxide layer is considered to be one pair. Then, the layers are processed as shown in FIGS. 9M and 10M.

A laser beam is emitted only from the rear surface of the silicon substrate 1 by depositing end surface reflecting metal (not shown) on only one surface of the silicon substrate 1. Aluminium is used as the metal.

The VCSEL type silicon laser oscillates the laser beam at a designed wavelength of approximately 850 nm and is in a single mode according to spectrum analysis. This purpose is to selectively enhance a wavelength determined from a structure of the DBR mirror 62. Since the laser beam is emitted in a vertical direction to the silicon substrate 1, it is clarified that the VCSEL type silicon laser is effective as an optical wiring used for connecting laminated chips to each other.

What is claimed is:

1. The semiconductor device comprising on a substrate, a first electrode for injecting electrons:
    a second electrode for injecting holes;
    a light emitting unit electrically connected to the first and second electrodes and emitting light by being injected with the electrons and holes by applying voltages to both electrodes;
    a mirror having a function of reflecting the light emitted from the light emitting unit,
    wherein the light emitting unit includes a thin film installed on the substrate and a first insulating film having a first permittivity, which is installed on the thin film,
    the mirror is formed by periodically and alternately disposing a plurality of second insulating films having a second permittivity different from the first permittivity and a plurality of third insulating films having a third permittivity different from the second permittivity on the first insulating film to be opposed to each other by a predetermined gap,
    the film thickness of the thin film is thinner than those of the first and second electrodes, and
    wherein the thin film, and both the first electrode and the second electrode are made of a IV-group semiconductor.

2. The semiconductor device according to claim 1, wherein the film thickness of the thin film is 10 nm or less.

3. The semiconductor device according to claim 1, wherein the IV-group semiconductor has a single-crystal structure and is made of silicon, a surface direction of a surface of the silicon being a surface (100) or a surface direction equivalent to the surface (100).

4. The semiconductor device according to claim 1, wherein the IV-group semiconductor has the single-crystal structure and is made of germanium, a surface direction of a surface of the germanium being a surface 111 or a surface direction equivalent to the surface 111.

5. The semiconductor device according to claim 1, further comprising:
    a connector for connecting the light emitting unit and the first electrode or the second electrode to each other,
    wherein the film thickness of the connector is thicker than that of the light emitting unit and thinner than those of the first and second electrodes, and
    the light emitting unit, the connector, and both the first electrode and the second electrode are made of the IV-group semiconductor.

6. The semiconductor device according to claim 3, wherein the first insulating film is a silicon dioxide film.

7. The semiconductor device according to claim 6, wherein the second insulating film is nitride silicon and the third insulating film is silicon dioxide.

8. The semiconductor device according to claim 1, wherein first impurities having a first conductive type are added to the first electrode,
    second impurities having a second conductive type different from the first conductive type are added to the second electrode,
    the concentration of first impurities added to the light emitting unit is lower than that of the first impurities added to the first electrode, and
    the concentration of second impurities added to the light emitting unit is lower than that of the second impurities added to the second electrode.

9. The semiconductor device comprising on a substrate, a first electrode for injecting electrons;
    a second electrode for injecting holes;
    a light emitting unit electrically connected to the first and second electrodes and emitting light by being injected with the electrons and holes by applying voltages to both electrodes;
    a mirror having a function of reflecting the light emitted from the light emitting unit,
    wherein the light emitting unit includes a thin film installed on the substrate and a first insulating film having a first permittivity, which is installed on the thin film,
    the mirror is formed by periodically and alternately disposing a plurality of second insulating films having a second permittivity different from the first permittivity and a plurality of third insulating films having a third permittivity different from the second permittivity on the first insulating film to be opposed to each other by a predetermined gap, the film thickness of the thin film is thinner than those of the first and second electrodes, and wherein the light emitting unit is installed between the first electrode and the second electrode which are installed to be opposed to each other, the mirror is installed in a first direction on the light emitting unit parallel to the first and second electrodes, and a laser beam emitted from the light emitting unit and amplified by the mirror is outputted in the first direction.

10. The semiconductor device further comprising:
on a substrate, a first electrode for injecting electrons;
a second electrode for injecting holes;
a light emitting unit electrically connected to the first and second electrodes and emitting light by being injected with the electrons and holes by applying voltages to both electrodes;
a mirror having a function of reflecting the light emitted from the light emitting unit,
wherein the light emitting unit includes a thin film installed on the substrate and a first insulating film having a first permittivity, which is installed on the thin film,
the mirror is formed by periodically and alternately disposing a plurality of second insulating films having a second permittivity different from the first permittivity and a plurality of third insulating films having a third permittivity different from the second permittivity on the first insulating film to be opposed to each other by a predetermined gap, the film thickness of the thin film is thinner than those of the first and second electrodes, and an opening portion having a film thickness thinner than the film thickness of the substrate, which is formed on a second main surface of the substrate opposed to a first main surface of the substrate on which the light emitting unit is installed, wherein the opening portion is disposed so that at least a part of the opening portion exists on a virtual line on which a region where the light emitting unit is installed extends to the substrate.

11. The semiconductor device according to claim 10, wherein an electrode having radiation performance is installed through a dielectric installed on the surface of the opening portion.

* * * * *